US007002265B2

(12) United States Patent
Potega

(10) Patent No.: US 7,002,265 B2
(45) Date of Patent: Feb. 21, 2006

(54) POWER SUPPLY METHODS AND CONFIGURATIONS

(76) Inventor: Patrick Henry Potega, 7021 Vicky Ave., West Hills, CA (US) 91307-2314

(*) Notice: Subject to any disclaimer, the term of this patent is extended or adjusted under 35 U.S.C. 154(b) by 0 days.

(21) Appl. No.: 10/262,380

(22) Filed: Sep. 30, 2002

(65) Prior Publication Data

US 2003/0085621 A1 May 8, 2003

Related U.S. Application Data

(62) Division of application No. 09/193,790, filed on Nov. 17, 1998, now Pat. No. 6,459,175.
(60) Provisional application No. 60/065,773, filed on Nov. 17, 1997.

(51) Int. Cl.
*H02J 00/00* (2006.01)

(52) U.S. Cl. .................. 307/149; 702/66; 320/134
(58) Field of Classification Search ............... 307/149, 307/66; 340/636; 320/134, 136; 702/66
See application file for complete search history.

(56) References Cited

U.S. PATENT DOCUMENTS

| | | | | | |
|---|---|---|---|---|---|
| 5,615,344 | A | * | 3/1997 | Corder ....................... 710/100 |
| 5,668,698 | A | * | 9/1997 | Jozwiak et al. ............. 361/752 |
| 5,781,780 | A | * | 7/1998 | Walsh et al. ................ 713/300 |
| 5,796,239 | A | * | 8/1998 | van Phuoc et al. ......... 320/107 |
| 5,845,217 | A | * | 12/1998 | Lindell et al. .............. 455/557 |
| 5,847,546 | A | * | 12/1998 | Sengupta et al. ........... 320/144 |
| 5,889,385 | A | * | 3/1999 | Podrazhansky et al. ..... 320/130 |
| 5,892,431 | A | * | 4/1999 | Osterman .............. 340/310.01 |
| 6,057,670 | A | * | 5/2000 | Sink et al. .................. 320/117 |
| 6,094,033 | A | * | 7/2000 | Ding et al. ................. 320/132 |
| 6,232,675 | B1 | * | 5/2001 | Small .......................... 307/30 |
| 6,271,643 | B1 | * | 8/2001 | Becker et al. .............. 320/112 |
| 6,313,608 | B1 | * | 11/2001 | Varghese et al. ............ 320/132 |

OTHER PUBLICATIONS

Douglas Adams, "Dongly Thing, A Pox on the Panoply of Plugs," MacWorld, Sep. 1996, p. 140, MacWorld Communication, Inc., U.S.A.
Michael Gaton, "Power System to Make Notebook–Friendly Skies," PC Week, Jun. 2, 1997, p. 45, Ziff–Davis, Medford, MA, U.S.A.
Meeting Minutes from the Technical Committee of the WAEA (World Airline Entertainment Assocation), Jul. 25, 1997, Santa Ana, CA.
Andy Pasztor, "Is Recharging Laptop in Flight A Saftey Risk?," The Wall Street Journal, pp. 81, 86, Dow Jones & Company, NY, NY, U.S.A.

* cited by examiner

*Primary Examiner*—Robert L. DeBeradinis

(57) ABSTRACT

A look-up table assists a source of logic of an apparatus in determining the power requirements of an unknown battery-powered device, so that a configurable power supply adjusts its output to provide the correct power to the device. The functions of the look-up table, in conjunction with generic templates and update-able historical information, if available, are substantially based on determining a "power signature" of the device. As a secondary function, the look-up table enables detection of battery charging activity and, when necessary, provides various means of disabling charging operations. More than one look-up table is available, and a look-up table can be located at any interconnected device, apparatus, or power source. Inter-device communications further enhance the functionality of the look-up table, especially for collaborative data-acquisition.

19 Claims, 18 Drawing Sheets

FIG. 12

"Current Signature" Look-up Table

| A | B | C | D | E |
|---|---|---|---|---|
| Hard Drive Motor 350 ma | Hard Drive Seek Head 50–100 ma | Floppy Drive 1 amp | CD-ROM Drive 600 ma | Screen Backlight 1.2 amps |

Monitored Hardware Devices (for example only)

| Devices | | | | | Total Load (ma) |
|---|---|---|---|---|---|
| A | | | | | 350 |
| A | B | | | | 400–500 |
| A | B | C | | | 1350–1400 |
| A | B | C | D | | * |
| A | B | C | D | E | * |
| | B | | | | 50–100 |
| | B | C | | | 1050–1100 |

* These combinations of devices would not likely be operating simultaneously in the real world so their values should not be in the matrix. A simpler matrix is just as valid as a complex one. This is a partial table only.

POWER SUPPLY METHODS AND CONFIGURATIONS

CROSS-REFERENCE TO RELATED APPLICATIONS

This application is a division of "Universal Power Supply," now U.S. Pat. No. 6,459,175, issued Oct. 1, 2002, and claims priority of U.S. patent application Ser. No. 09/193,790, filed 17 Nov., 1998, (also filed as International Patent Application No. PCT/US98/24403, 17 Nov., 1998, and issued as Singapore Patent No. 73192, 11 Jun. 2002), U.S. Provisional Application No. 60/065,773, filed 17 Nov. 1997. This application claims the benefit of "Method and Apparatus for Transferring Electrical Signals Among Electrical Devices," now U.S. Pat. No. 6,634,896, issued 21 Oct. 2003, previously filed as U.S. patent application Ser. No. 09/378,781, dated 23 Aug. 1999, as also filed as International Patent Application No. PCT/US99/19181, dated 23 Aug. 1999(withdrawn 6 Oct. 2004), also filed as Singapore Patent Application No. 200101078-4 and issued as Singapore Patent No. 79321, 31 May 2005, and filed previousley as "Apparatus for a Power and/or Data I/O," U.S. Provisional Patent Application Ser. No. 60/097,748, dated 14 Aug. 1998. Further benefit is claimed of "Apparatus for Enabling Multiple Modes of Operation Among a Plurality of Devices," U.S. patent application No. 09/699,216, filed 27 Oct. 2000 as a CIP of "Apparatus for Monitoring Temperature of a Power Source," now U.S. patent application No. 6,152,697, issued 28 Nov. 2000, filed previously as U.S. patent application No. 09/105,489, dated 26 Jun. 1998 (also filed as International patent application No. PCT/US98/12807, dated 26 Jun. 1998), and previously as U.S. provisional patent application No. 60/051,035, 27 Jun. 1997; and "A Resistive Ink-Based Thermistor," U.S. Provisional patent application No. 60/055,883, dated 15 Aug. 1997. This application also claims the benefit of "Hardware for configuring and Delivering Power," U.S. patent application Ser. No. 09/475,946, filed 31 Dec. 1999, and previsiously as "Hardware to Configure Battery and Power Delivery Software," U.S. provisional patent application No. 60/114,412, date 31 Dec. 1998; and "Software for Configuring and Delivering Power," filed as U.S. patent application No. 09/475,945, dated 31 Dec. 1999, and previously as "Software to Configure Battery and Power Delivery Hardware," U.S. provisional patent application No. 60/114,398, dated 31 Dec. 1998.

FIELD OF THE INVENTION

This invention relates to delivering power to an unknown battery-powered device. More particularly, look-up tables that assist a source of logic of an apparatus in determining the power requirements of an unknown battery-powered device, so that a configurable power supply adjusts its output to provide the correct power to the device. Look-up tables also enable detection of battery charging activity and, when necessary, provides various means of disabling charging operations.

BACKGROUND OF THE INVENTION

Power supplies are traditionally device-specific, in that the output voltage of the power converter, whether it be an AC/DC or DC/DC adapter, must be voltage-matched to the host device it was designed to power.

Devices which use an external (or internal) power converter are often designed to operate both with batteries and/or a power adapter. The adapter may be only a substitute for the internal batteries, for example, tape recorders, personal audio or video equipment, hand-held video game machines, etc. This is often the case when the batteries are non-rechargeable, so that the power supply is providing an alternate means of primary power. This enables the user to elect to operate the powered device some of the time with the power adapter, for example a PDA (Personal Digital Assistant) which normally operates on non-rechargeable pencells when being transported, but which also has an optional power adapter for use when the handheld computer is being used in the office or home.

In this case of a power supply which is acting as a battery surrogate, the power adapter is matched to the voltage of the removable batteries. Since there are so many combinations of cells which can be put together to create a battery pack, as well as slightly different voltages from the various types of battery cell chemistries, the operating voltage of any electronic device can vary significantly within the same type of electronic device, whether made by the same or a different manufacturer.

Consumers have some sense of the power supply incompatibility issues, and many know that you cannot plug a 16 volt power adapter from your laptop into a 7.2-volt cell phone. The manufacturers of such devices reinforce that thinking by intentionally installing a proprietary connector on the power supply, so that their power adapter will only mate with their electronic equipment. This provides some measure of safety, in that it helps prevent an incompatible, voltage-mismatched power supply from damaging electronic equipment.

This dedicated power supply model creates a series of problems. As the manufacturer builds more and more variants of its electronic products, each new voltage-specific power supply generates a new corresponding SKU (the Sales Kit Unit is an inventory number, typically a barcode). For example, *Business Week* (Nov. 4, 1996) reported that Toshiba, the world's leader in laptop computer sales, had released 15 new models of its mobile computers. Over time, the mere process of inventorying and warehousing a large number of power adapters becomes a labor and time-intensive activity. For a consumer electronics manufacturer who may release a dozen or more new products each year, the problem can become significant enough that a separate division, often known as "spares" or "accessories," becomes necessary.

The federal government requires that manufacturers make replacement parts, such as power supplies, available for seven years. In other countries, the mandated time during which accessory items like power supplies must be kept in inventory is as long as 20 years. The logistical problems, as well as the huge cost to be compliant, has a significant effect on manufacturers' profitability.

Consumers, being dependent on the manufacturer to sell them a replacement or second power supply, are subject to product unavailability, power supplies which are back ordered, and the general inconvenience and loss of time to get an order processed and shipped.

All power supplies tend to look strikingly similar to each other. This is especially true in mobile computing, where a handful of power converter manufacturers supply virtually all of the laptop manufacturers. To minimize costs, the same plastic housings are used for power supplies which have significantly different voltages, i.e., they all look alike, but are not interchangeable. This can be very frustrating to a corporate MIS (Management Information Systems) manager, who may be responsible for several thousand laptops throughout the company. It is not atypical that the MIS manager is responsible for purchasing, inventorying and distributing significant numbers of diverse-voltage power supplies. Keeping the proper number of the correct power supply, which corresponds to its matched laptop, requires time and effort. Maintaining a sufficient inventory of each brand and model of power adapter leads to high costs. Lost time, i.e., productivity, becomes an issue if the manufacturer does not have a particular power supply in stock.

While, as noted, manufacturers attempt to ensure that their device-specific power supply will only fit the equipment for which it was intended by using a slightly different connector, there are only so many connector designs available. For example, there are several dozen combinations of outer-barrel-diameter, and center-pin-diameter barrel connectors available. Generically known as a "5 mm" barrel connector, it is used extensively as a powerline interface throughout the consumer electronics and mobile computing industries. Once one manufacturer has used all the non-interchangeable combinations, it must find a new connector design, or start reusing the same connector family.

Some manufacturers, in an attempt to find more combinations, switch the polarity of the pin and barrel. The consumer, to whom all of these devices look amazingly alike, can easily find a power supply which looks like the one being replaced, has the correct voltage, and even has the same mechanical connector. Having verified all of the visual information, the consumer may not know that the pin and barrel were configured as reverse polarity for that equipment.

The impact of all of this consumer confusion, and product-mandated complexity by the manufacturers, is expressed in an article titled "Eureka! Laptops That Share Parts," by Stephen H. Wildstrom. Mr. Wildstrom, in his article in *Business Week* (Jul. 14, 1997, page 14), states that:

"Often, I'd like to use an accessory—a spare battery or an AC adapter left behind from a previous model. But these old parts never fit new notebooks because the design has changed.

"This is more than an annoyance for lots of laptop buyers. For companies that have invested many thousands of dollars in docking stations and spare disks—or even the individual buyer who popped for a spare battery and connection to a car's electrical system—the inability to reuse components involves real money. Corporations, which often buy top-of-the-line notebooks for senior executives and entry-level machines for sales or service people in the field, want to minimize the cost of stocking a common pool of spare parts."

The author then points out why his ideal of totally interchangeable and reusable power-related accessories may be difficult to achieve:

"It can be hard for manufacturers to simplify their customers' lives. The switch from 486 to Pentium processors required major laptop redesigns to deal with increased power and cooling requirements."

Power supplies, because of these complex issues, particularly that of multiple SKUs, are not products which lend themselves to the normal distribution and sales channels. Numerous SKUs lead to large inventory, warehousing and display requirements, so the power adapter is a poor candidate for ever being a locally available product sold in retail stores. Most retailers simply ignore power supplies as a marketable product class.

This is very unfortunate, because the power supply is definitely a "must have" accessory. A laptop computer is quickly rendered unusable if no power supply is available. Laptop computers do not operate with replaceable primary batteries. Unlike tape recorders, video game players, audio CD players, etc., which can use either disposable drycells, or rechargeable batteries (with the appropriate charger), mobile computing equipment is specifically designed to be powered from custom, manufacturer-specific rechargeable battery packs. Cellular phones are marketed in the same way. Cellphone battery packs are readily available in retail stores, and via mail order, but laptop battery packs are only obtainable from the manufacturer, or from a small number of mail order companies. Even third-party replacement battery pack companies, such as 1-800-BATTERIES (a mail order battery provider), do not carry power supplies for laptops.

This situation is even more critical if the consumer is traveling, and needs the laptop for productivity. Because operating a laptop on the road elevates the need for ready access to a compatible power converter, in that the manufacturer-supplied power adapter is more subject to damage or loss while traveling, the traveler will lose valuable time and money if there is even a day or two wait to get a replacement from the original manufacturer.

Power adapters found in retail outlets like Radio Shack, and other electronics stores, have been designed and engineered for products such as home and office phones, toys and entertainment devices, etc., which have been manufactured to operate at specific multiple-battery-cell voltages. Their output voltages are specific, normally 3, 6, 9 and 12 VDC. These are the "normal" voltages which result as multiples of standard 1.25-volt NiCad cells, or multiples of alkaline drycells rated at 1.5 volts per cell. Two alkalines in series equals 3 volts, five NiCad cells (or four alkalines) is 6 volts, six alkalines (now rechargeable, to a limited degree) equates to 9 volts, etc.

Even within this product group, the identical-looking adapter can be 3, 6, 9, 12 VAC. Customer confusion is still an issue, and the rigidly-defined fixed outputs may not match the customer's particular device to be powered. These inexpensive devices are not designed for the voltages and power loads of laptops and other high-amperage computing devices. Because these low-cost power adapters are designed for fixed-based applications, such as phones and video games, they also tend to be quite bulky and heavy, so they have limited appeal for the consumer who wants a power supply which is small and lightweight enough to fit into a briefcase for travel.

While the same electronics stores stock power supplies which are labeled "universal," these adapters are only voltage-selectable. These "universal" adapters conform to the classic 3, 6, 9 and 12-volt outputs, and a four-position switch selects the desired output voltage. While offering flexibility, these devices are far short of any true universally-voltage-compatible power supply.

In the mobile computing industry, one or two companies have tried to resolve the issue of a true "plug 'n play" universal power supply. Nesco Battery Systems, of Van Nuys, Calif. claims a universal" power adapter system. "The SmartAdapter System" requires three modules. The first device is a 115–220 VAC input, +15 VDC @ 2.8 A output module which measures 2.25×1.5×5.5" and has a short DC-out cord with a tethered female receptacle from a car cigarette lighter connector.

To this AC/DC converter module a second device is attached by a mating male car-adapter plug on a coiled cord. This "SmartSupply," as Nesco has named this module, specifies a 10–30 VDC @ 30 W input, and delivers 5–30 VDC output, rated at 25 W max. This car-adapter device is stated by Nesco to be a "programmable DC power supply."

The third device is a short length of cable called the "SmartCord." This cord has an electronic identifier, which may be some sort of chip in one of the connectors which, according to Nesco's package information, " . . . sets the specific output parameters of the SmartSupply [sic] and provides the proper power connector." Thus one "SmartCord" is needed for each laptop, portable printer, or external peripheral, so a different cord is required for every externally-powered device.

"The SmartAdapter System," as marketed by Nesco, is dependent upon a factory-pre-configured, device-specific chip embedded in the "SmartCord's" connector. As such, this "smart" technology is strikingly similar to that shown in U.S. Pat. No. 5,570,002 to Castleman (29 Oct. 1996). Castleman also relies on a read/write chip in the power supply's output cord to identify each specific powered device. Also, U.S. Pat. No. 5,510,691 to Palatov et. al., (23 Apr. 1996) inserts an entire voltage-specific "micro-brick" into the last of the three cord system. Whether one is embedding a single chip in a cord, or an entire power module full of components, the net result is that both Castleman and Palatov require there to be a selection process by the consumer when purchasing these devices. The only "smart" requirement is that the consumer must be smart enough to read a chart and purchase the right combination of three modules.

The consumer must acquire this hidden key in the Nesco "SmartCord" which matches the specific voltage of the laptop or peripheral device. This is done with a substantial product-identifier chart, which lists hundreds of laptops, and their matched "SmartCord" identifier. With any device which requires such look-up tables, being "universal" is determined by how comprehensive and up-to-date the chart is.

One can also readly see why SKU issues are a concern with power supplies, in general, and specifically why any distributor or retailer would have concerns about purchasing and displaying hundreds of Nesco "SmartCords." To stock 200 cables, which would not include every available "SmartCord" variant, would total a market value of $4,000.00 (at the retail price of $20.00 per unit). For a merchant to carry any depth of inventory in just the most popular "SmartCords," it could easily amount to $10,000.00. Add to this a reasonable quantity of "SmartSupplies," (retail price $64.95) as well as a matching quantity of the third required device, the AC/DC power converter (retail price $49.99), and the real impact on a retailer by stocking Nesco's complex, multiple-SKU "universal" power supply becomes obvious.

The combination of the three Nesco devices (and you must have all three for the product to work in a wall outlet) weighs about 18 ounces. By comparison, a typical laptop power adapter weighs approximately 6–8 ounces. Furthermore, the entire assembly, with its cigarette lighter adapters (male and female) and two modules, coiled cord, etc., makes for a bulky and cumbersome power source, not well suited to traveling.

The Nesco technology does have a wide-input-voltage-range car adapter as part of its elaborate construct, which delivers a slight benefit to the consumer, but the need for a device-specific interface cord for each powered device offsets the car adapter advantage. For a mobile computing traveler, or the worker who prefers to use a laptop in the office or home, the same issues of having to locate and purchase some proprietary hardware perpetuates the various problems described above.

The previously cited example of the MIS manager relates to Nesco directly. Three Nesco modules are required, and the MS manager would need to purchase numerous sets, at a retail value of $135.00 each. In our model of a company which supports 1,000 laptops, the total cost of ownership is $13,500.00, to outfit the entire company. One would have to retrofit every laptop in the company, otherwise the desired effect of total compatibility and interchangeability would be defeated. By comparison, the average price of a replacement power supply from the manufacturer is $80.00, although some high-end notebooks have replacement power adapters that sell for $250.00+.

For an MIS manager, acquiring and inventorying device-specific and virtually identical-looking "SmartCords" can be frustrating, since some sort of non-removable color coded labels might have to be applied to each "SmartCord" and its matching laptop. These Nesco "SmartCords" are only 18" long, and can readily be lost or misplaced, especially while packing or unpacking for a business trip.

This "SmartCord" strategy is best captured in a humorous article by Douglas Adams, famed for his *Hitchhiker's Guide to the Galaxy* book series. In the September 1996 issue of *Macworld Magazine*, Adams wrote an article titled "Dongly Thing: A Pox on the Panoply of Plugs." He writes:

Time to declare war, I think, on little dongly things. More of them turned up in the post this morning I'd ordered a new optical disc drive from an American mail-order company, and because I live in that strange and remote place called "Foreign," and also because I travel like a pigeon, I was keen to know, when ordering it, if it had an international power supply.

"Yes, it does," said Scott, the sales assistant.

"You're sure it has an international power supply?"

"Yes," repeated Scott "It has an international power supply."

"Absolutely sure?"

"Yes."

This morning it arrived. The first thing I noticed was that it didn't have an international power supply. Instead it had a little dongly thing. I have rooms full of little dongly things and don't want any more. Half the little dongly things I've got, I don't even know what gizmo they're for. More importantly, half the gizmos I've got, I don't know where their little dongly thing is. Most annoyingly, an awful lot of the little dongly things, including the one that arrived this morning, are little dongly things that run on 120 volts AC-American voltage, which means I can't use them here in Foreign (state code FN), but I have to keep them in case I ever take the gizmo to which they fit (provided I know which gizmo it is they fit to) to the USA.

What, you may ask, the hell am I talking about? The little dongly things I am concerned with (by no means the only species of little dongly things with which the microelectronics world is infested) are the external power adapters which laptops and palmtops and external drives and cassette recorders and telephone answering machines and powered speakers and other incredibly necessary gizmos need to step down the main AC supply from either 120 volts or 240 volts to 6 volts DC. Or 4.5 volts DC. Or 9 volts DC. Or 12 volts DC. At 500 milliamps. Or 300 milliamps. Or 1200 milliamps. They have positive tips and negative sleeves on their plugs, unless they are the type with negative tips and positive sleeves. By the time you multiply all these different variables together, you end up with a fairly major industry which exists, so far as I can tell, to fill my cupboards with little dongly things, none of which I can ever positively identify without playing gizmo pelmanism. The usual method of finding a little dongly thing that actually matches a gizmo I want to use is to go and buy another one, at a price that can physically drive the air from your body.

Now why is this? Well, there's one possible theory, which is that just as Xerox is really in the business of selling-toner cartridge, Sony is really in the little dongly power-supply business.

The aviation community has begun actively to promote easy access to electronic equipment power aboard commercial aircraft by seeking a DC power supply that may be permanently installed in passenger aircraft. Delta Airlines fitted an experimental onboard power system in one aircraft in June 1996. This installation featured a 14.7 VDC car adapter receptacle in the passenger seat arm rests (first class and business class only). The system, called "EmPower," was engineered and installed by Primex Aerospace Company (previously Olin Aerospace) of Redmond, Wash. Delta Airlines has committed, according to its press release of 30 Apr. 1997, to outfitting 70% of its fleet of 767ERs and MD-11s with EmPower ports. American Airlines has also begun to install this same equipment on its AirBus Fleet®). While Delta's aircraft present the passenger with a proprietary "car-like" cigarette lighter receptacle (it's slightly smaller in diameter), American Airlines is installing a "standard"-sized automotive cigarette lighter receptacle. Thus, connector confusion and incompatible plugs already are perpetuating more SKUs and user confusion.

The "EmPower" system is essentially an in-flight version of an automotive cigarette lighter, with this power port in the passenger seat armrest. Primex provides only a power port, and licenses several manufacturers, such as Xtend Micro Products, Inc., in Irvine, Calif., and Universal Sources, Inc., in Congers, N.Y., and Lind Electronics, in Minneapolis, Minn., to provide DC/DC adapters, which deliver the appropriate device-specific voltage to the passenger's laptop computer.

A sidebar titled "Handy Battery Peripherals," in the July 1997 issue of *Laptop Buyer's Guide and Handbook*, describes Xtend's "PowerExtender" in-flight adapters:

"More than 200 different versions will be made available since no standards exist for laptop power systems. For example, a Toshiba notebook requires a different voltage than an IBM ThinkPad. In addition, the power port shapes are different. And various laptop models from the same manufacturer often use different voltages and ports to further compound any attempts to establish adapter compatibility.

"Each Xtend adapter will allow the user to switch between the two sizes of power receptacles currently being considered. Because of the sheer number of adapter types that would have to be stored to satisfy the needs of passengers carrying laptops, airlines probably will not furnish the devices for use or rental. While operating their computers onboard, users will also be charging their laptop batteries. Although only Delta, American, United, and Canadian Airlines are permitting onboard computer use, other carriers are currently reviewing their options, with announcements expected later this year."

Delta Airlines has already felt the impact of this passenger confusion, when it paid for a replacement laptop when a passenger used the wrong adapter.

The question of what retailer or computer mail order catalogue company, if any, is prepared to stock some 200 versions of Xtend's "PowerExtender," at an MSRP of $99.00, remains to be seen.

The author of the sidebar may not have been fully aware of the irony of the Toshiba vs. IBM ThinkPad example that was used to indicate laptop power incompatibilities. The Toshiba notebooks are AC powered, while the ThinkPad requires a DC input. Thus, another spin on this ever-more-complex issue of "universal" power sources is that some airline passengers will need to find power inverters, so that they can benefit from the EmPower 15-volt DC power ports.

The EmPower technology is explained in an article titled "Power System to Make Notebook-Friendly Skies," in the Jun. 2, 1997 issue of *PC Week*. The article states that 15 VDC will be delivered to a limited number of seats, with power supplied from the aircraft's generator. While Michael Gaton, the author, praises the EmPower system, he does indicate that the first deployment will only be in first class and business class, specifically on international and long-range flights. The downside to passengers is that " . . . those who want to use the outlets will need to buy a special power adapter for their notebooks."

Further, the author states:

"A formal standard for the connector type that will work in these outlets has not been ratified by the airline industry standards board, but of the nine airlines that have announced plans to deploy such a system, only American Airlines has proposed using a unique jack. The first airline to announce plans for in-seat power, American suggested using an automobile-type cigarette lighter jack because of its prevalence.

"The proposed connector standard, ARINC-628, will likely be ratified later this year and uses a smaller connector than the one American Airlines has proposed. This connector would fit in the EmPower outlets."

As of November 1997, the AEEC (Airlines Electronic Engineering Committee) has yet to determine the "standard" power port configuration, and it is also reviewing the proper voltage.

Douglas Adams might look askance on this news, since it will definitely mean more and more dongles, adapter plugs, connector incompatibilities, etc. The U.S. automotive industry has recently agreed to accept the new European standard for in-vehicle power adapter ports, and this receptacle is also slightly different from that used by EmPower. Thus, the "standard" cigarette lighter power port looks to be heading the way of many connectors, with proprietary variants on various airlines.

Douglas Adams, in the *Macworld* article previously referenced, was hoping that some day there would be "one DC power adapter" . . . perhaps something akin to the universal power supply herein described. He especially saw the need for this on passenger aircraft:

"I have to own up and say that, much as I love my [Apple] PowerBook, which now does about 97.8 percent of what I used to use the lumbering old desktop dinosaurs for, I've given up trying to use it on planes. Yes, yes, I know that there are all sorts of power-user strategies you can use to extend your battery life-dimming modes, RAM disks, processor resting, and so on-but the point is that I really can't be bothered. I'm perfectly capable of just reading the in-flight magazine if I want to be irritates However, if there were a DC power supply in my armrest, I would actually be able to do some work, or at least fiddle with stuff."

Little did Mr. Adams know that his wish was already coming true, nor did he reckon that the fulfillment of that wish would only spawn anything but a universal, one-power-device solution.

While Delta Airlines, according to a report in *Business Traveler News* (May 5, 1997), was prepared to make the 10 most commonly used power adapters available to passengers for free, the airline has since decided to not provide any power devices, and instead require the passengers to purchase their own units from vendors like Xtend Micro Products.

The shortcomings of this type of system have already been pointed out. The passenger must bring aboard a specific power module-and-cord assembly for each electronic device he/she wishes to use during the flight. It is not unusual for passengers to bring aboard a personal audio system, with earphones, so that they can enjoy their own musical selections. They can also bring a laptop to the aircraft, in order to do work or, for relaxation, use personal video viewers (Sony's DVD player, for example), tape recorders (with headphones), or the Mitsubishi "SatPhone," which is a portable satellite phone system in the size and weight of a typical laptop. Depending on the type of laptop, they may also need to use one or more external computer devices, for example, an externally powered CD-ROM drive, a tape back-up device, or a second hard drive, or other storage device. Purchasing and transporting all the necessary power modules can be expensive, bulky, heavy and inconvenient.

Because the external devices mentioned, and others of that type, are sold only with an AC/DC power adapter, and currently only DC power is contemplated for aircraft, the passenger needs to locate and purchase a second power-delivery system specific to traveling. While it may be arguable that this second set of power devices can be used for both an airplane and car, rarely would people need to do active laptop work in their car (some exceptions would be people in service and repair companies, sales reps with local territories, etc.). Outside these particular classes of users, no one uses a computing device routinely in a car, so the double benefits which may seem to be apparent here are not well met in the real world of mobile computing, especially if you consider the obverse, where the group of users benefiting from car-enabled laptop power may not fly on an airplane very much, if at all.

Airline passengers still have to carry two power supplies aboard the aircraft. The standard manufacturer's AC/DC converter is typically used by passengers at the airport, if they belong to any of the airlines' VIP "clubs." In 1995, the San Jose, Calif. airport conducted test trials with cubicles in the terminal waiting areas where laptop users could work prior to boarding their flights. Mitchell International Airport, in Milwaukee, Wis. has had six such cubicles for a number of years, with laptop amenities, fax machines and phones. These virtual offices are currently getting 50 or so passenger-uses per month. The airport is also expanding the business traveler services to include rental conference rooms, with presentation screens and optional food services, as reported by *Business Traveler News*. Passengers who need to be productive with their mobile computing equipment will be saddled with carrying some sort of EmPower-specific power adapter, in addition to their AC/DC power supply.

Commercial aircraft-standard voltages available in the cabin are either 115 VAC, or 28 VDC. All devices in the environment are designed to work on one of these two input voltages. The EmPower system, perhaps in reaching for the "it works on airplanes and in cars" dual functionality for the company's third-party power adapters, has designed an inherently electrically-inefficient system. EmPower delivers a nominal reference output voltage of 14.7 VDC to each seat. However, there are a number of electronic devices with operating voltages above 14.7 volts. For example, Apple Computer's PowerBooks are designed as a 24-volt system, so there is a substantial boost from 14.7 volts required. Many PC-based notebook computers also operate at voltages above 14.7, and 20-volt equipment is common in the models which offer high-performance video and presentation capabilities.

Boosting voltage leads to power conversion inefficiencies, which results in heat. Because aircraft cabins are sealed air circulation systems, the heat from multiple power sources is undesirable. On high-density-seating aircraft, where there may be as many as three hundred passengers, having a number of heat sources from power converters has a measurable impact. In converting 14.7 VDC to 24 VDC, for example, a temperature rise of 10–15° F. above ambient can be expected from a reasonably efficient power supply. To this must be added the heat-transfer from the EmPower under-seat AC/DC power converters. Anecdotal information indicates that the EmPower ISPS (In-Seat Power Supply) is inefficient, with perhaps 20+% of the power transfer dissipated as heat. This means a potential 20–25° F. rise in temperature. Thus, the potential cumulative rise in ambient cabin temperature is 30–50° F. for every seat using the EmPower system. This issue of heat has caused Boeing to form a Cooling Working Group within the AEEC, to define and recommend solutions to cooling issues on its aircraft caused by computer equipment.

Industry statistics indicate that some 30–40% of airline passengers use laptops, and another 20–30% carry laptops, but don't routinely use them on the aircraft, as indicated from the 1996 Business Traveler Lifestyle Survey sponsored by *Official Airline Guides*, of Oak Brook, Ill.

Thus, on an EmPower-equipped wide-body aircraft which has seating for 400 passengers, 120 power modules will be running for hours at a time in an enclosed capsule (some 15 hours, for international flights), which will definitely affect the air conditioning system on the plane. Moreover, these 120 personal, passenger-supplied power adapters, and the equivalent 120 EmPower AC/DC converters to drive them, add to the already burdensome thermal loading created by the existing network of in-cabin power converters for in-flight movies, telephony and galley use. In-flight phones, telephony-based faxes and e-mail, Internet access, TV monitors, personal movie viewers (Sony Video Walkmans will be onboard all of Delta Airlines' L1011-500s, and most of their B-767ERs, according to an airline press release of Apr. 30, 1997), and seat-based TVs, personal Nintendo game players (as supplied by Singapore Airlines), movie projectors, cabin lighting, as well as microwaves, coffee brewers, and even a laptop computer for the cabin crew, etc., all contribute to the total rise in cabin temperature.

Some of these sub-systems, for example in-flight entertainment, require numerous power adapters to deliver passenger-convenience technologies like personal video-on-demand. A typical 72-seat first-class and business-class personal video system requires some 78 AC/DC power modules throughout the cabin area. These power modules are in addition to the EmPower laptop-specific power modules, those for the phone system, etc.

Thus, EmPower's current model of an embedded in-flight power conversion system has deficiencies in energy conservation because of the loss in performance by boosting from a lower input voltage imposing a noticeable thermal load on the aircraft's air control system. These thermal issues also relate to the source of the power, which is an engine-driven generator on the aircraft. With power efficiencies as low as 50%, as noted, the generator must do twice the work to provide the proper power load to the entire cabin. This inefficiency also directly impacts the amount of expensive 100-octane aviation fuel which must be burned, i.e., the airlines have to burn carbon-based fuels to provide laptop power. With the EmPower system, each seat has up to 100 Watts of power load available, so the total load schedule for laptop use on an MD-11-class aircraft can be calculated in kilowatts.

Several host-device manufacturers have attempted to resolve problems of bulky, easily misplaced external power adapters by relocating them into the actual laptop. In the laptop computer industry, Toshiba, Sharp and Compaq have embedded the entire AC/DC adapter into some of their laptop computers. This affords minor improvements over the external-supply model, in that the consumer only needs some type of power cord, typically a "tape recorder"-type electrical cord, to get power from the wall outlet into the device. These cords are not universally available, although a well-stocked electronics store, such as Radio Shack, will likely have the required cord.

This "solution" makes laptops thus configured AC-powered devices. While in-office or in-home usage brings convenience to consumers who own these products, these manufacturers' laptops suffer when they need to be transported . . . and mobility is a key feature of laptop computers, of course. On the road, the car cigarette lighter delivers 12 VDC. A power inverter is required to convert the DC power to AC, and inverters are actually larger and heavier than the original AC/DC adapter, so the trade-off in customer convenience doesn't favor the internal power supply concept.

On commercial aircraft, an inverter is even less desirable. Unlike AC/DC power adapters, which are designed to be EMI clean and relatively noise free, no commercially-available inverter complies with DO-160 specs or other aviation-specific emission or radiation requirements. Furthermore, an inverter is potentially dangerous aboard an aircraft, in that the "live" end of an inverter not connected to its host device, but still plugged into the power input port, has hot 110 VAC exposed to an environment where a spilled drink can create a serious short, and possible fire.

Other problems inherent in this approach are that the weight of the internal power supply is always transported, even for short-duration local trips where the internal battery would provide adequate power. Because the heat generated by the power converter is significant, some manufacturers instruct users to leave the laptop's clamshell case top open during use and for battery recharging. Heat from the internal power adapter also shortens the mean time between failure of nearby components within the laptop (especially if the user ignores the warning, and leaves the laptop closed every time the batteries are recharged). As with any integration/packaging solution, the failure of even a minor component in a bundled, self-contained product requires that the entire device be sent in for service. Furthermore, the consumer cannot order a spare power supply, and achieve the resultant fault-tolerant solution that redundant systems would allow.

Since the power supply is both the most vulnerable component in a failure-analysis model (primarily because of heat and the quality of components used in an accessory item that normally is priced to the OEM customer at less than $10.00), plus the fact that the power converter is the most essential item to the operation of the host device, an embedded power supply is not the best expression of properly implemented power technology.

For example, one laptop manufacturer has reported that its technical support team receives sixty phone calls per week related to replacement or repair of that company's external power supplies. Assuming that even a well-designed power adapter could be cost-effectively built to have only 50% of that sixty-per-week failure rate of the external units, there would still be over 1,500 failures per year with the internal-power-supply-equipped equipment.

The power supply also serves as the power source for a battery charger in devices that use rechargeable batteries. Without a power supply, the device will work on battery power for a finite time, after which it is rendered totally useless. If the device is a mobile computer, the loss of access to data can have significant deleterious effects.

In conclusion, perhaps Douglas Adams best sums up all of the above in his *Macworld* article, previously cited:

"It's hard to imagine that some of the mightiest brains on the planet, fueled [sic] by some of the finest pizza that money can buy, haven't at some point thought, "Wouldn't it be easier if we all just standardized [sic] on one type of DC power supply?" Now, I'm not an electrical engineer, so I may be asking for the impossible. Maybe it is a sine qua non of the way in which a given optical drive or CD Walkman works that it has to draw 600 milliamps rather than 500, or have its negative terminal on the tip rather than the sleeve, and that it will either whine or fry itself if presented with anything faintly different. But I strongly suspect that if you stuck a hardware engineer in a locked room for a couple of days and taunted him with the smell of pepperoni, he could probably think of a way of making whatever gizmo (maybe even the new gizmo Pro, which I've heard such good things about) it is he's designing work to a standard DC low-power supply."

SUMMARY OF THE INVENTION

This document describes a look-up table as an element of an intelligent power supply that automatically reconfigures its output voltage, within a broad range, to be compatible with a battery-powered device's input-power requirements. Look-up tables, according to the present invention as described below, enable the power supply to perform without user intervention and without any pre-programmed prior information about each specific device. By accessing circuits and sub-systems of the target device, program instructions at a logic source create a model of a device-specific "power signature." Because look-up tables can be created to provide historical power-delivery information, as well as update-able generic templates that define device classes, the power supply not only conforms to the existing specifications of electrical or electronic equipment already in use, but it is fully forward-compatible to any future product.

As a related function, look-up tables can enable detection of battery charging activity and, when necessary, provides various means of disabling charging operations. More than one look-up table is available, and a look-up table can be located at any inter-connected device, apparatus, or power source. Inter-device communications further enhance the functionality of the look-up table, especially for collaborative data-acquisition.

BRIEF DESCRIPTION OF THE DRAWINGS

FIG. 12 is a look-up table that could be used by a power supply according to the present invention to determine the power requirements of a particular supplied device.

Figure 1:
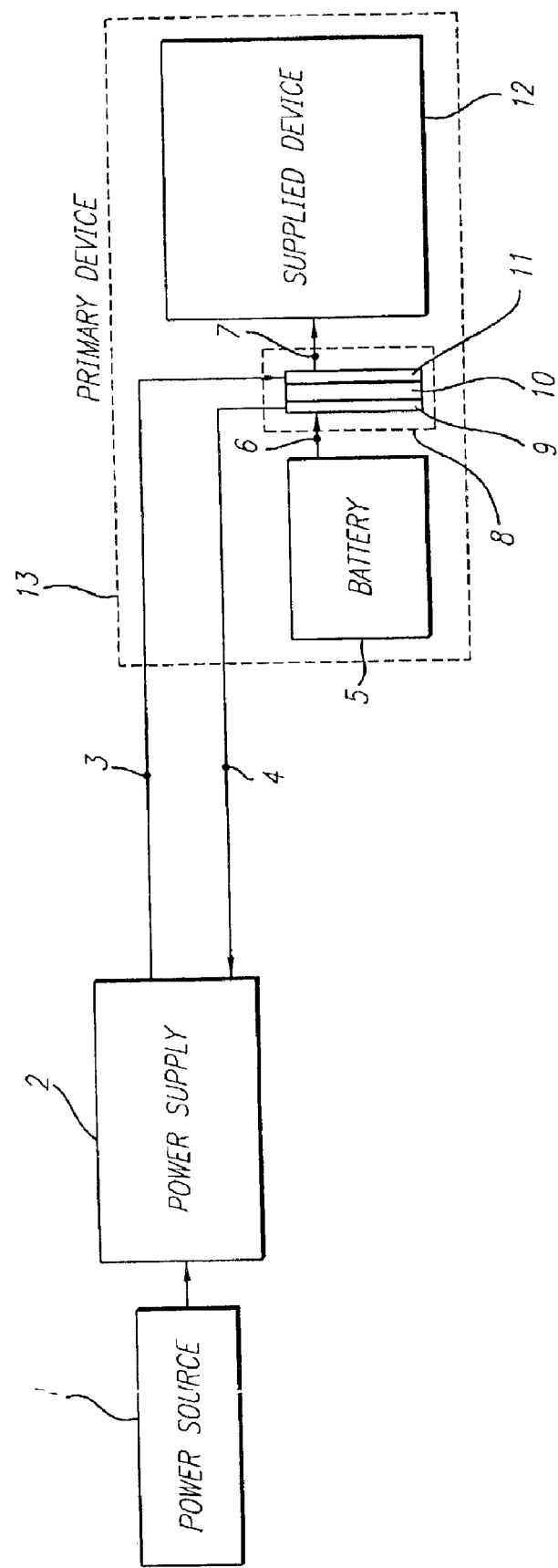
FIG. 1 is a generic block diagram depicting a battery-operated supplied device being used in conjunction with an embodiment of the power supply of the present invention.

DETAILED DESCRIPTION OF THE INVENTION i. FIG. 1

FIG. 1 is a block diagram illustrating the manner in which a basic configuration of a power supply 2 according to the present invention may be interposed between a power source 1 and a primary device 13 (e.g., a laptop computer). As shown in FIG. 1, power supply 2 draws power from power source 1 (e.g., 120 VAC @ 60 Hz, 115 VAC @ 400 Hz, 28 VDC, or any AC or DC) and converts it to the appropriate power level for primary device 13 (e.g., 20.5 VDC if supplied device 12 were a laptop computer). This proper voltage is supplied on powerline 3. Primary device 13 is shown to comprise supplied device 12 (e.g., a portable audio CD-player) and battery 5 that is voltage-compatible with supplied device 12. While some embodiments of this invention make use of data capabilities in either or both battery 5 and/or supplied device 12, such uni-directional or bi-directional data is not critical to the functionality of power supply 2. Supplied device 12 can be, but is not limited to, any electronic or electrical apparatus which (in the absence of power supply 2 and connector 8) relies, in part or in whole, on power supplied by battery 5. Supplied device 12 can have data and/or power signals available to or from it on line 3. Data signals and power signals may be transmitted on separate lines or together on shared conductors, or separate data links between power supply 2 and supplied device 12 can exist as wired or wireless connections. Power supply 2 is not dependent for its functionality on any data link between it and supplied device 12. For example, powerline modulation may be employed on line 3 where data is transmitted by modulating the amplitude or frequency of a power signal. Such powerline modulation has been performed in home automation systems by such companies as X-10 (Closter, N.J.), Lon Works, Motorola (Schaumburg, Ill.) and Echelon (Palo Alto, Calif.).

Battery 5, which is typically supplied with or purchased separately for supplied device 12, may be a removable battery, as one or more individual cells, or removable as an assembly of cells in its own enclosure. Battery 5 may also, but need not, be a rechargeable cell or group of cells of any conventional battery chemistry having any type of output voltage. The physical form of the cell can be prismatic, polymorphic (flexible), button cell, cylindrical, rectangular, or of any shape whatsoever. It is not a prerequisite of the invention that battery 5 be removable, since power supply 2 operates independently of connector 8. A non-removable battery configuration would not readily lend itself to inserting connector 8 into the circuit between the battery and the supplied device. Battery 5 need not even be present for power supply 2 to function nor, if present, does battery 5 have to be at any particular state of charge or discharge for power supply 2 to properly power supplied device 12. This modality, wherein battery 5 is either absent (e.g., removed to be conditioned in a separate battery cycle), or totally discharged, and where there is not ready access to the battery terminals where connector 8 needs to be inserted, will not prevent power supply 2 from adequately performing its role of automatically configuring itself to the appropriate input voltage of supplied device 12. This modality is detailed below.

To simplify the discussion of power supply 2, an input voltage to primary device 13 is assumed to be a specific voltage, here 12 VDC. Power supply 2 is a variable-voltage power supply appropriately configured to deliver a range of output voltages, such as from −24 to +24 VDC, so that there is a particular voltage which is compatible with any of a wide variety of primary devices such as primary device 13 (e.g., here identified as 12 VDC). Primary device 13 also has a rechargeable and removable battery in this example, so that battery 5 also outputs 12 VDC. Any number of output voltages are available from power supply 2, so that supplied device 12 can be, for example, a cellular phone, rated at 7.2

VDC, a flashlight with 3 rechargeable NiCad "D"-size cells (3.75 VDC), a portable tape recorder with four non-rechargeable, removable primary AA cells (also 3.0 VDC), a notebook computer (many notebook computers are designed for input voltages ranging from 10–24 VDC), as just a few examples of the multiplicity of devices and their varying voltage requirements which power supply 2 can properly power. These various power signal output reconfigurations of power supply 2 are done automatically, without any manipulation of switches, manually adjustable potentiometers, or user intervention whatsoever.

Connector 8 is a universal connector that may be interposed into the electrical path between supplied device 12 and battery 5 in such a manner that, among other functions, data and/or a power signal defining the power requirements of supplied device 12 or the power characteristics of battery 5 (or both) may be transmitted to power supply 2. While the installation of connector 8 simplifies the performance of power supply 2, it is not mandatory. Examples of when connector 8 will prove beneficial are when battery 5 or supplied device 12 are power-data enabled (so that a data communications link to power supply 2 can be created between either or both battery 5 or supplied device 12 and power supply 2); or when battery 5 is non-data-enabled, but is rechargeable and removable, as is the case with most pre-1996 notebook computers. While connector 8 may be beneficial in these cases, and others, power supply 2 is not in any way limited in its performance if connector 8 is not available, as might be the case with embedded batteries not readily accessible without opening up the supplied device.

In FIG. 1, connector 8 is comprised of insulator layer 10 that electrically isolates contact 9 from contact 11. Contact 9 conducts power signals from battery 5 along conductor 6, then transfers the signal along conductor 4 to power supply 2, while isolated contact 11 conducts input power signals from power supply 2 along conductor 3, then along conductor 7 to supplied device 12. These are the minimal parameters of connector 8, otherwise it is not limited by the number or location of conductors 9 or 11. Some implementations may require more than one connector 8 in the circuit. A second connector might be necessary, for example, when a single row of cylindrical batteries was mounted in series in a supplied device. No matter how many connectors may be deployed within a specific supplied device, they all must have conductor/insulator combinations which isolate the supplied device from its battery, as well as provide separate circuits from the power supply to the battery and the supplied device.

The dimensions or shape of connector 8 is defined by the location of the battery terminals, so there will be considerable variations in the design of the connector(s). While the use of multiple cylindrical cells defines a simple and straightforward connector, some multi-celled battery packs have more than two terminals, or have their terminals arranged so that the connector(s) would be complex, or inconvenient to attach to the battery pack or supplied device. There are modalities of connector 8 which are thin (1.5 mils) and highly flexible, so that the connector can contour a considerably broad range of battery contact sizes, shapes and locations. Furthermore, connector 8 can be integrated into the battery pack housing in several ways, for example, as discrete secondary and/or tertiary connectors in the battery case. However, the power supply of the present invention offers a mode of operation which is independent of any connector.

Note: Power Supply 2, when configured to deliver more than one power signal, as illustrated in FIGS. 6, 7, 8, and 9 can simultaneously charge battery 5 and power supplied device 12.

By isolating supplied device 12 in FIG. 1 from battery 5 by inserting connector 8, power supply 2 reads information from battery 5 as to the appropriate voltage needs of supplied device 12, without any direct dependency on supplied device 12 for such information. Connector 8 also enables power supply 2 to behave as a voltage-based battery charger, as might be required, for example, in charging Lithium Ion batteries and to independently charge battery 5, when it is not powering supplied device 12.

Figure 10:
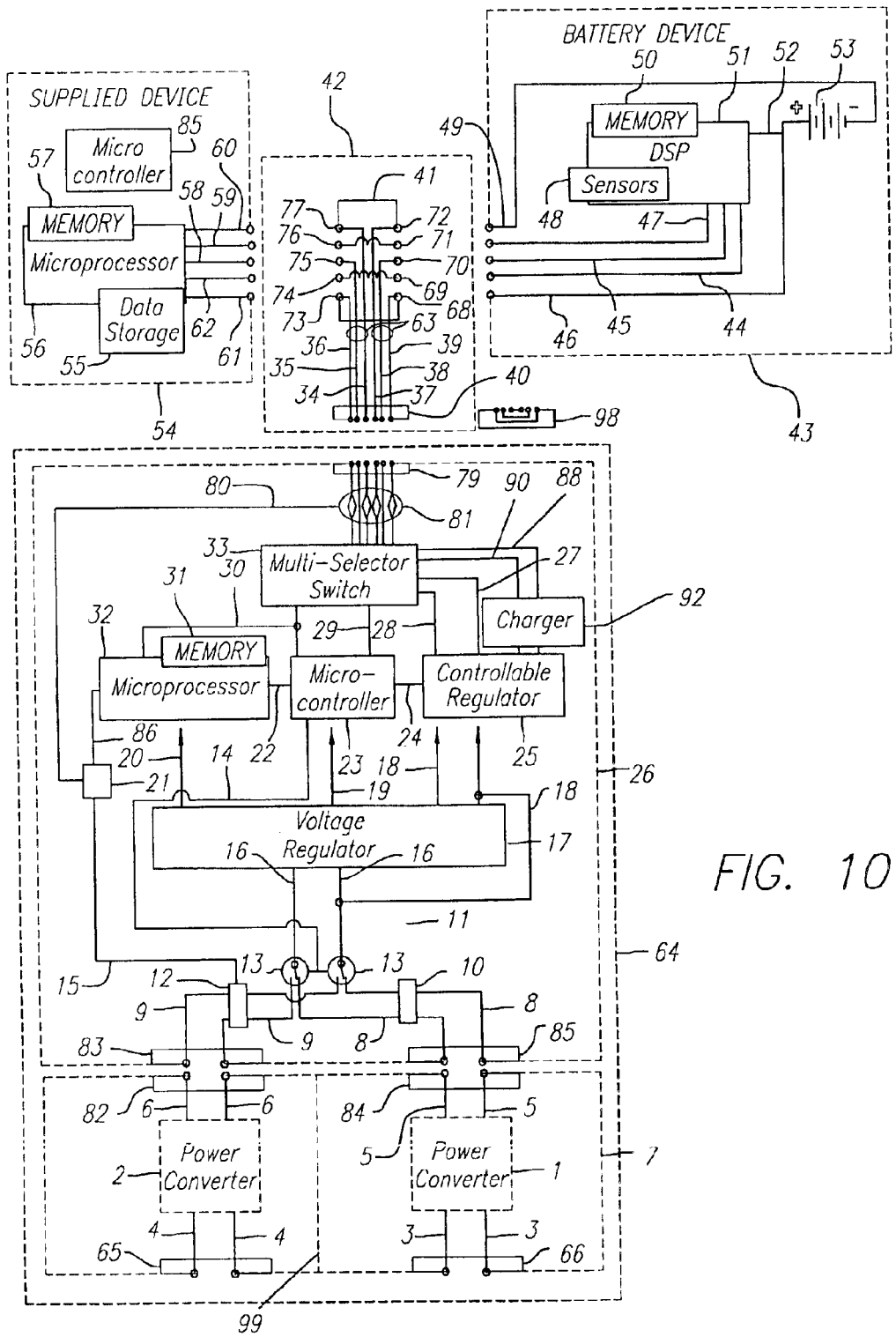
FIG. 10 is a detailed block diagram of an embodiment of a power supply according to the present invention used in conjunction with a battery-operated supplied device and its corresponding battery.

For power supply 2 in FIG. 1 to function when attached directly to a supplied device 12 by powerline 3, and without battery 5 and connector 8 being present, power supply 2 has a source of logic so that it is controllable, either internally, or from a remote source. FIG. 10 shows an iteration of a power supply 2, here numbered 64, which is configured with microprocessor 32, memory 31, microcontroller 23 and an optional A/D converter, or the equivalents. This, or a comparable equivalent of onboard intelligence in power supply 64 is used to monitor the relationship between output voltage of power supply 64 and the resultant current-load created by supplied device 54 as the power signal is applied.

A. Auto-Power Mode—No Battery (or Dead Battery Present)

As noted, power supply 2 is not in any way dependent for its operation on the presence of either battery 5 (which may be discharged or otherwise non-functional), or connector 8. In the absence of connector 5, power supply 2 relies on the cause/effect relationship of Ohm's Law to power supplied device 12. Since any change in the response to applied power in supplied device 12 is reflected as a change in current load to power supply 2, e.g., as a laptop computer begins its power-up boot process, power supply 2 can, via an internal logic circuit, monitor its output current to detect supplied device's 12 change(s) of state. Being power factor corrected (PFC), power supply 2 will adjust itself to an increase in current automatically, but the very need to have PFC in the circuit identifies the fact that deviations in current created by a change in resistance at an external device is detectable. Power factor corrections are, therefore, seen as the result of an identifiable cause, and that cause is an increasing demand for power. That power demand means that the device is becoming power-enabled to do work, which is what the purpose of the power supply is. The power supply can stop increasing voltage when its power load stabilizes, i.e., that is when the output voltage is proper, or at least sufficiently so that any supplied device is within an acceptable power range.

Thus, as supplied device 12, in the example of it being a laptop computer, commences its boot sequence, a power demand is created on power supply 2. Power supply 2 responds by increasing its output voltage to compensate for the increased load. A simple algorithm in power supply's 2 internal logic directs the power supply to apply a small amount of additional voltage. This algorithm is based on voltage increases which decrease proportionately over any series of repeated increases in the load, so more voltage, proportionally, is applied upon the first detected power load increase than is applied to further detected increases. Power supply's 2 logic circuit only applies the algorithm after the power supply's internal power factor correction has stabilized the voltage within prescribed parameters. In one perspective, the PFC is over-shooting its intended voltage mark of returning its output voltage to what it was before the surge in demand was experienced.

As soon as stasis between current load and output voltage is observed, the logic circuit commands power supply 2 to increase its voltage, so that a potential change of state in supplied device 12 might result. The anticipated change of state is that a supplied device will become more operational if given sufficient additional voltage (i.e., correcting an underpowered situation wherein some circuits in the supplied device are active, but others are not powered sufficiently), or that the change of state will be that a supplied device will become more stable when the applied voltage moves from the lower edge of the device's voltage envelope toward a more optimal voltage (i.e., that the power supply won't be on the fringe of a potential brown-out precipitated by an unexpected increase in load, such as a peripheral or sub-system coming online, which might be an external CD-ROM player connected to a laptop computer, for example).

Figure 11:
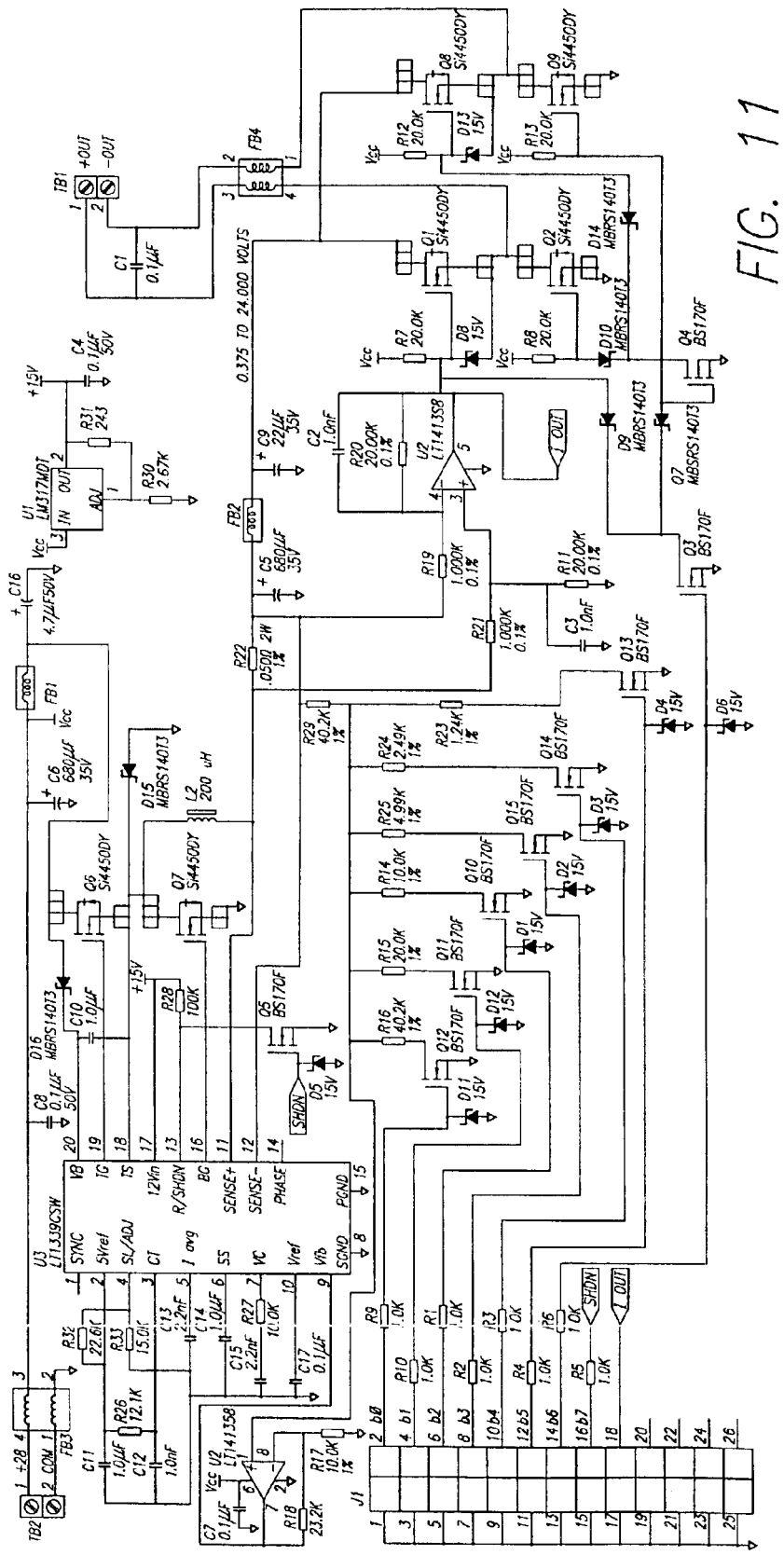
FIG. 11 is a schematic diagram of exemplary power circuitry suitable for use in the embodiments of the power supply shown and described in connection with FIGS. 1–10.

These changes of state are detected by monitoring current changes in power supply 2. A typical circuit for such a power supply is shown in FIG. 11, where the I-out line can be looped into a logic circuit (not shown) to be converted to a valid reading of current load (detected as analog voltage, the value of which is extrapolated as current This circuit, for example, delivers 1 amp of current for every 1-volt change at its output). A simple A/D converter converts the raw voltage information to digital data. The resultant digital data is then processed and compared to previous changes of power states using a pre-defined algorithm.

The algorithm's purpose is to make changes in the power supply's output voltage in reverse proportion to actual voltage increases, i.e., the more the voltage increases (as result of continued increases in load created by the supplied device) the smaller are subsequent voltage responses. The power algorithms are built according to several observable characteristics of battery-powered devices.

1. By definition, supplied devices with rechargeable batteries have regulated circuits between an external power supply and the charging circuit itself. This internal regulator is necessary to boost or buck the voltages to either (or both separately) the supplied device itself and/or the battery charging circuit.

2. This internal regulator will tolerate a reasonable amount of under and over voltage from the power supply, often 10–30%, but biased toward under-voltage. The under-voltage bias is a consequence of the fact that the supplied device was designed to run from batteries, as well as an external power adapter. Batteries, being storage devices, can only decrease in output voltage as their energy reserves dissipate, so the voltage regulator has to favor operating at lower, and not higher, input voltages. For example, a battery-powered mobile computer which has a manufacturer-specified operating voltage of 12 volts, typically will function as its battery pack discharges into the 10-volt range (more than likely, the supplied device will still be viable in the mid-9-volt range). This is necessary to optimize the running time of the device. Also, a discharging battery has a significant and often precipitous downward slope in voltage, and that voltage drop-off can occur quite suddenly. From this, it can be deduced that the minimum operating voltage of any battery-powered device will most likely favor being below (and perhaps substantially downward from) the optimal operating voltage range.

3. If externally applied voltages exceed the range of tolerated voltages (either over or under) that designed into the regulator, the regulator is circuit protected (especially to over-voltage situations). Thus, the consequences of over-shooting a supplied device's input-voltage range presents a very minimal risk to the equipment. The power supply is controlled, as noted, by an algorithm which approaches a supplied device's maximum voltage in ever-decreasing small steps. This process is specific to approaching the supplied device's circuit protection with due caution, by delivering very minor voltage increases to a safety circuit so that its voltage-tolerance threshold is crossed in the most benign way possible.

4. The risk of encountering an over-voltage threshold in a safety protected circuit within a supplied device is quite low. By definition, the optimal operating voltage of a supplied device is always below the trigger threshold of the over-voltage protection circuit. Between that optimal operating voltage and the not-to-exceed maximum voltage, the device will not exhibit any characteristics, as a function of observable increases in load, which will indicate to the power supply (and its logic circuit) a need to apply more and more power. The cause/effect premise upon which this power methodology is based prescribes that the supplied device will want only enough voltage, and no more. The resistance-load of a light bulb cannot increase beyond what it was as manufactured, so a power supply which only adds more voltage when it sees resistance increasing will stop adding more power when that light bulb is as bight as its impedance will allow it to be. Its resistive value will stabilize at its optimal design impedance, so delivering too much power to it, using the algorithm described here, is impossible. As can be seen, the entire system being described here is self-limiting and self-compensating . . . Ohm's Law clearly defines that.

5. If the regulator is over-voltaged, this safety circuit will trigger a definite and dynamic change of state, i.e., the supplied device shuts OFF temporarily. The power supply logic will readily detect such an event. Once the power supply's logic circuit detects this error state, it automatically decreases the output voltage to the last successful voltage, and prevents any further increases in voltage by putting a voltage cap (a definite not-exceed voltage limit) on the power factor correction circuit.

6. Virtually all devices with rechargeable batteries are designed to prioritize battery charging. For example, when voltage from a power adapter is applied to a supplied device at the manufacturer's specified voltage, the charging circuit is always turned on immediately (albeit only for a brief amount of time). Most laptop computers, for example, turn on the charge circuit, whether or not the computer itself is operational when the external adapter is activated. The charging circuit is always an autonomous circuit and does not require any commands or actions to turn on. In short, the charging circuit turns on automatically every time power is available. With the five known variables (actually absolutes) defined above, an algorithm is built which anticipates these givens, and exploits them to make "intelligent" decisions about increasing power output from the power supply.

7. The following logic tree illustrates these factors in a real-world example of the power supply 2 in FIG. 10 powering a supplied device (laptop computer) which has a discharged (but chargeable) battery installed.

A). The output voltage of the controllable power supply increases from its default voltage of 0 volts. The power supply shown as a schematic in FIG. 11 is referenced in this example, and that power supply is designed to increase its output voltage in 0.375-volt increments.

B). An internal logic circuit detects the first change of state in the supplied device, as a load which is sensed at I-out location on the circuit board.

C). This first change of state "event" is the battery charging circuit in the supplied device turning on, as defined in #6 above. This activity is not only the first event, but it is often easily detected, since the charger turning on causes a sudden spike in current (the effect of which is a noticeable voltage correction by the power supply's power factor correction circuit).

D). The logic circuit uses this event as a baseline. The algorithm now operates under the assumption that the power supply's output voltage is at the low end of the supplied device's nominal operating voltage range.

E). Once output voltage has stabilized (because of power factor correction), the logic circuit directs the power supply to increase voltage. To define by how much the voltage should increase, a look-up table which contains a profile of "typical" supplied device types is accessed. This look-up table contains generic output-voltage-related-to-device types. For example, cellular phones typically operate from 3–7.2 volts, while the family of devices identified as laptop computers traditionally operates in the 10–24 volt range.

F). Information from the look-up table is compared to the present output voltage, which is defined as the lowest possible operational voltage of that type of device. If that voltage is above 10 VDC, the look-up table of known device voltages indicates the supplied device to be a member of the "mobile computer" genre. Based on that hypotheses, information in the algorithm defines that the percentage of voltage increase can be proportionately larger than if the output voltage were five volts (which would indicate a smaller, less voltage-increase-tolerant device, perhaps a cellular phone).

G). The power supply's output voltage is increased by 7% (this percentage is only used as an example, and the actual percentage is determined by the device categories in the look-up table). Thus, if the supplied device is a laptop with an optimal operating voltage of 15 volts and the power supply stabilized at 10 volts (minimal device operating voltage), the 0.75-volt increase would yield 10.75 volts as the next voltage to deliver. The logic circuit instructs the power supply to deliver that voltage. Once that output voltage is executed, the power supply waits a moment in order to detect any possible increases in load which may result at the supplied device from the higher voltage.

H). A set of phenomena occurs, once this first (minimal) operating voltage of the device is reached. If the power factor correction of the power supply is unity (1.0), the power supply will automatically increase its output voltage to respond to any further escalating current demands. The power supply's PFC is actually above unity (1.0) because the logic circuit is pre-programmed to "overshoot" the power supply's "stabilizing" voltage. To illustrate, a 500 mA detected increase in load at 10 volts might only cause the power supply to re-stabilize at 10 volts. In the power supply being described here, the power supply overshoots that 10-volt output by a preset percentage-of-output-voltage factor of 3%. Once at 10.3-volts, the logic circuit prevents the voltage from returning to 10 volts. This new voltage is now the new valid baseline reference voltage below which the power supply will not drop.

I). Battery charging, as a definable and detectable event, has generic characteristics readily observed as changes in current-over-time. The three commonly known battery chemistries behave along well-known lines. NiCad (Nickel Cadmium) and NiMH (Nickel Metal Hydride) batteries charge by drawing current, while L-Ion (Lithium Ion) cells are charged by well-controlled voltage increases. The literature on battery charging characteristics indicates that NiCad and NiMH battery chemistries are charged at very high currents immediately:

"Optimum charge performance can be achieved by applying higher currents at the initial charge stage, then tapering it to a lower rate as the charge acceptance decreases," writes Isidor Buchmann in his book *Batteries in a Portable World*.

Buchmann shows the same initial high-current and increased-voltage methodology for L-Ion battery chemistry in a chart showing the various charge stages of any L-Ion battery. Note that the first activity at the commencement of Stage 1 is a rise in voltage. The same rapid rise in voltage is also indicated NiCads. Thus, the predictability of seeing a substantial change in the total system load on an external power supply as a charging circuit turns on and OFF is inherent in the way all cell chemistries are initially powered . . . a high voltage and current activity, which translates to a definitive "current signature" of these events, generically.

In discussing NiMH charging, Buchmann indicates the need for "charging templates:"

" . . . an algorithm must be used that identifies the fill-charge state of the battery when a certain voltage signature occurs."

Generic battery charging templates are available to the power supply's logic circuit, so that the effects of charging (seen as changes in current at the power supply's I-out circuit, which is expressing current as a measurable voltage) can be identified.

Deviations from the expected battery charging activity are interpreted as probable user-specific activities. One of the obvious anomalies is that the user has turned on the supplied device in preparation for doing work. For example, there may be detected changes in the current-load template related to battery charging which show more current flowing than anticipated, and the user may have turned on the computer.

If only charging activity is detected by identifying what is causing the load to the power supply, a logic circuit (either internal to the power supply or remote but connected) instructs the controllable power supply to increase its output voltage by 7 % of the original baseline of 10 volts, i.e., 0.75 volts.

J). At this point, if no further increases in current-load at the power supply's I-out line are detected, an assumption that the supplied device is not turned on is made. After all, the end user may just want to charge the battery. No further attempts are made, after polling the I-out sense line, to perform any further voltage increase attempts. They are not warranted, so the logic circuit sets an internal alarm, based on its internal clock, and polls the supplied device every N-seconds for further battery charging activity.

K). In steps H–J, if the supplied device's internal regulator is only marginally powered, i.e., the output voltage from the controllable power supply is set at a voltage near the drop-out voltage of the supplied device's voltage regulator (as it relates to the battery dropout voltage), then a sequence of events occurs. The drop in the power supply's voltage as the charger kicks in (causing a significant power load) momentarily depresses the output voltage of the power supply, so that the supplied device's voltage regulator drops out, then the power supply's circuit detects this event as a sudden power off. Knowing that under-voltage, rather than over-voltage, is the probable cause of this change of state, the power supply's voltage is increased above the baseline by a full 10%, i.e., from 10 volts to 11 volts.

L). If the supplied device was filly operational at the time the voltage regulator could not sustain itself because its power source (the controllable power supply) was delivering a marginally low voltage, the internal battery will have reached some minimal amount of charge. The battery may now have sufficient charge to act as a capacitor, or UPS (Uninterruptible Power Supply), or to charge a remote capacitor to deliver a short burst of "hold-up" power for the brief instant before the power supply comes back online with a more workable voltage.

Figure 5:
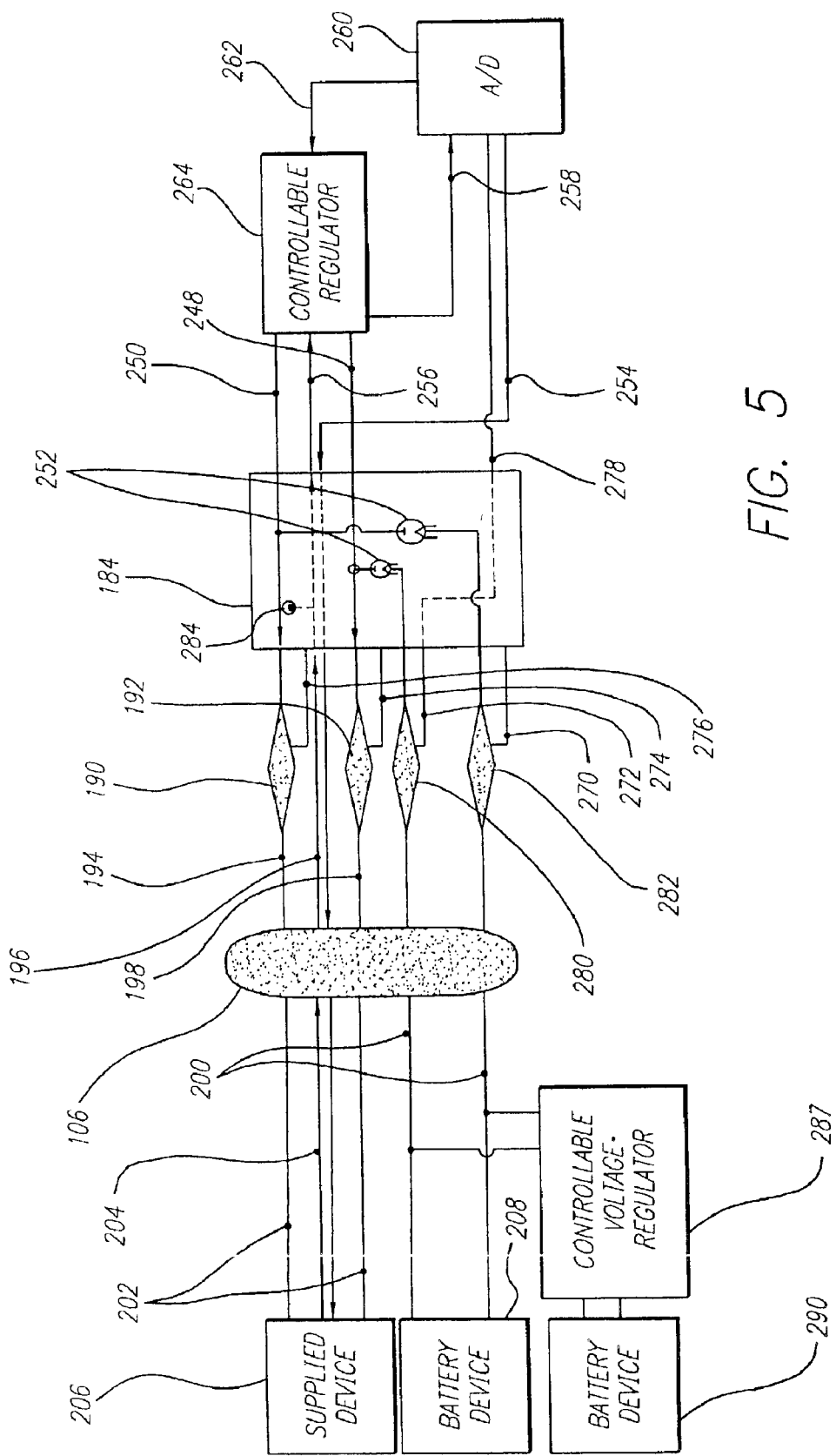
FIG. 5 depicts another embodiment of a power supply according to the present invention shown as a controllable regulator which, when in a circuit with a battery source, relies on that battery source to share the electrical load with the power supply, by alternating the power source with a high-speed switch
Figure 5A:
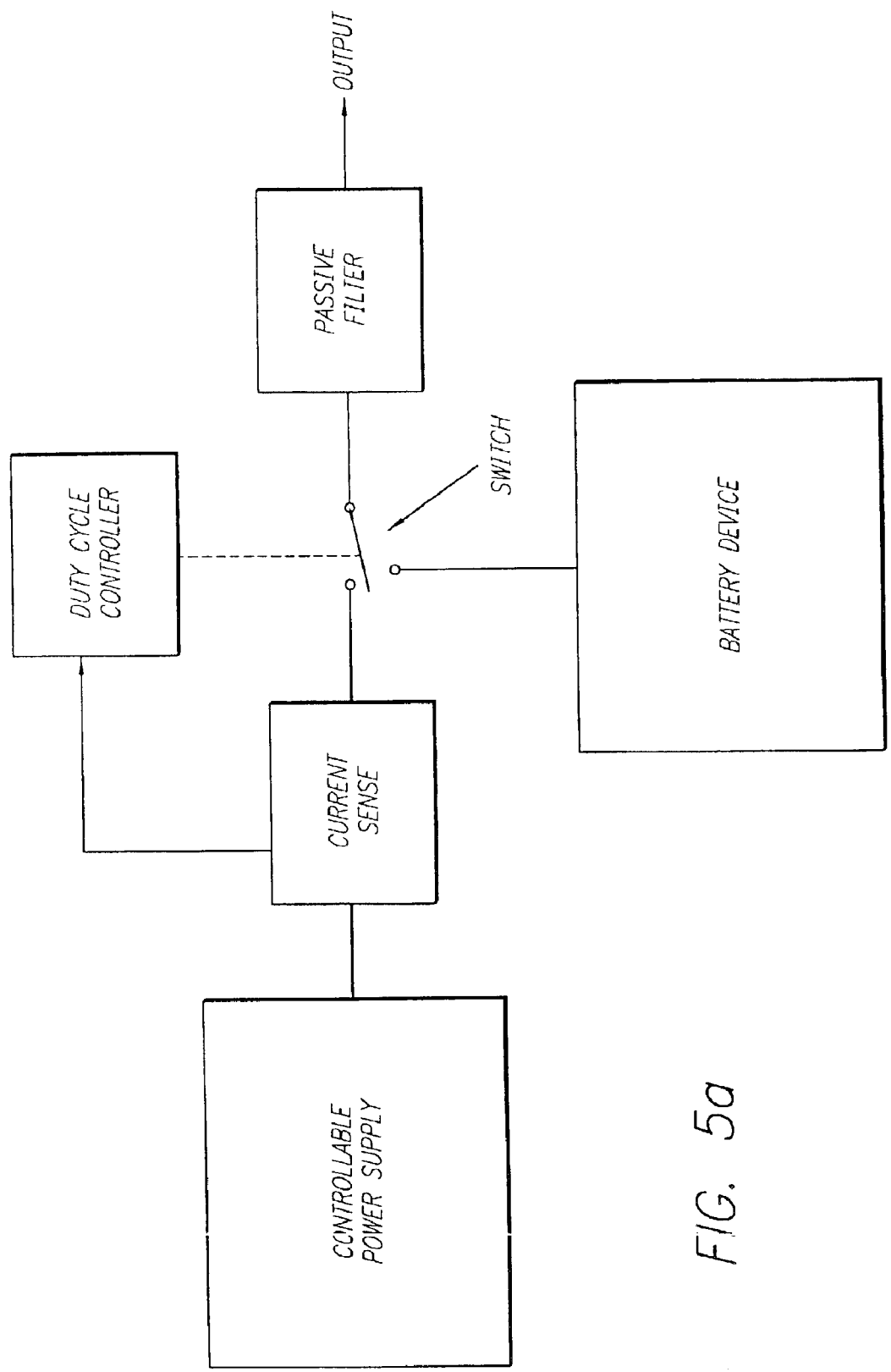
FIG. 5a is a simplified block diagram which shows the relationship of the elements in FIG. 5 in performing load sharing with a power supply and a battery.
Figure 5B:
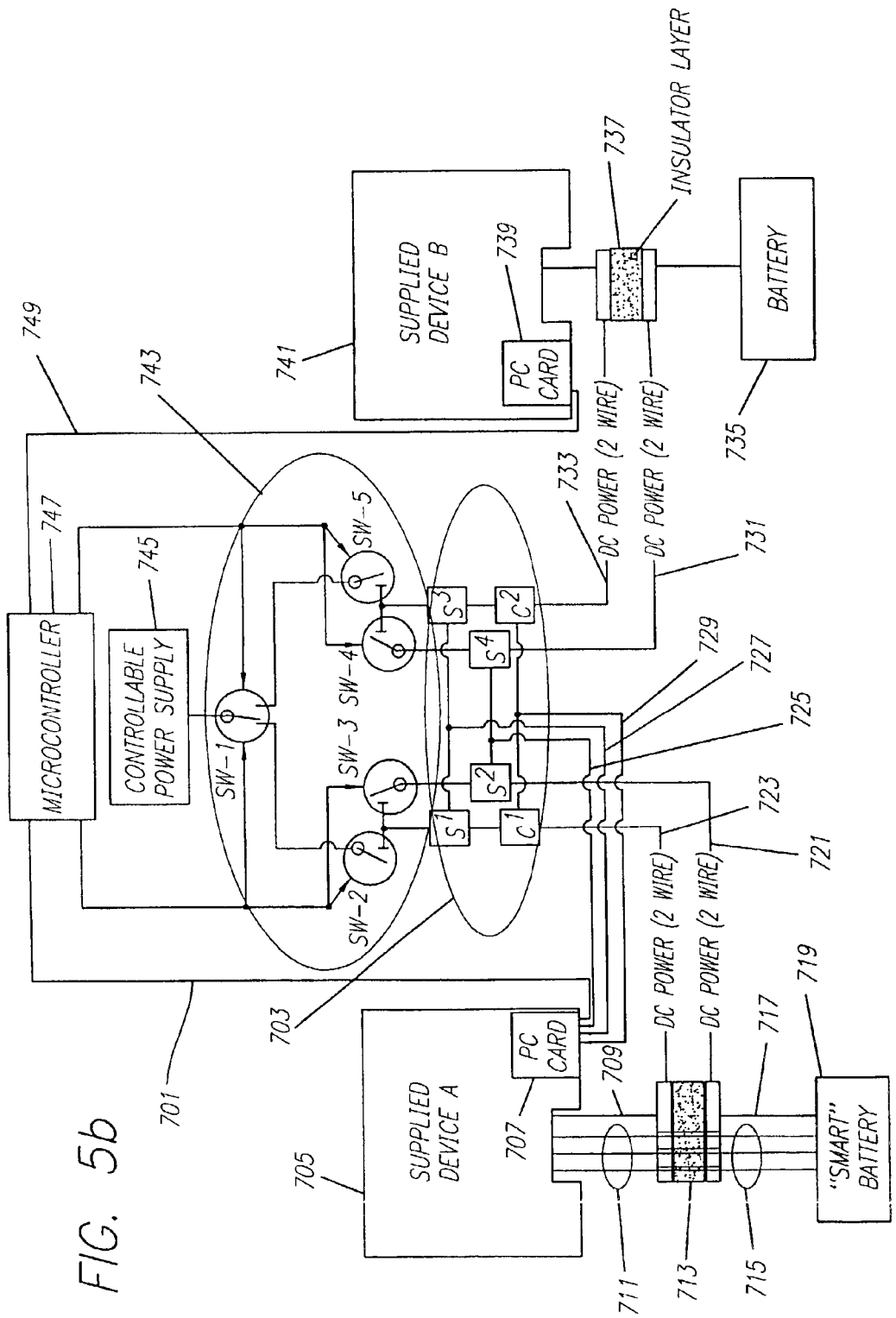
FIG. 5b is a block diagram of a system as depicted in FIG. 5 in which a power supply according to the present invention is shown in a configuration capable of managing the power requirements of two supplied devices, each having its own battery.

If that is not the case, the power supply can be configured as in FIG. 5b, so that it has a secondary power output. This secondary (and additional) output is also shown in FIGS. 6, 7, 8 and 9. One or more of these additional outputs is also controllable, and can vary its output voltage. The source of power may be the same shared magnetics in the power supply, or there can be two separate power circuits in parallel. The logic circuit always configures this second output of the power supply to be at the next anticipated voltage in the upward ladder being created. Thus, while power outlet #1 was testing the 10.7 volt level with the supplied device, outlet #2 was already configured at 11.4-volts and ready to be brought online if outlet #1 was untenable. This back and forth alternating of power outputs is necessary if there is no battery in the supplied device, or if that battery is indeed useless.

M). The role of the battery as an ad hoc "hold-up" capacitor which load-shares in conjunction with the controllable power supply is important to the process being described here. Of the three generic battery chemistries commonly available (NiCad, NiMH and L-Ion), all exhibit similar "non-use recovery" characteristics. They all return to a higher operating voltage after a brief period of rest than the last voltage exhibited under load during discharge. Thus, if a supplied device's drop-out voltage of 10 volts was unsustainable by the battery during its last discharge, that battery will momentarily deliver 10 volts (or slightly higher) after resting for a short while. This is not to say that there is adequate wattage available from the battery at 10 volts, for coulombs don't self-regenerate when a battery rests, but 10 volts will deliver more transient power than will 9 volts. Note that, if the supplied device's drop-out voltage is 10 volts, the battery pack's rated voltage is assuredly well above that, probably 12 or 15 volts. This higher voltage will make the remaining capacity of the pack available again.

The way rechargeable batteries are normally used is an important consideration. The type of product being powered may be a boom box, in which case allowing the battery to completely drain would not be a major problem, and few boom boxes have a battery monitoring system as sophisticated as that of a portable computer. The mobile, battery-powered computer is a productivity tool, although one can use it to play music CDs, but it would make for a very expensive boom box! The computer has to perform complex functions, such as screen displays, read/writes to hard drives or floppy drives, etc. These activities require significant power, e.g., as a floppy drive can draw 850 mA, and do so for several minutes when saving a file. If the battery were allowed to run, undetected, to a point of energy exhaustion, consumers would be disappointed.

That's why all laptop computers have not only audible alarms to warn the user of a "low" (not dead) battery situation before the battery would discharge to a state of uselessness. There are often screen display prompts suggesting the user save all work and exit. Even a fuel gauge which is visible at all times, and an LED to indicate charging activity, are considered important for assisting a user to intercept a battery before it drops below the minimum voltage level of the device.

Thus, except in rare situations, would an end user ever allow (or be allowed) to fully discharge a battery, as these constant warnings that he/she is about to run out of "electronic gas" occur. These warnings, plus an understanding (or just fear) that the work being done on the computer is important, usually have the effect of users turning off the machine at the first sign of impending trouble.

In knowing this, it is reasonably safe that the battery, the last time its use was discontinued, had a reasonable (but limited) amount of fully useable charge remaining. Indeed, to continue this evaluation of the real-world implications, that user is most likely connecting the computer to a power source to specifically recharge the battery.

Adding to this brief burst of renewed energy from a discharged battery, or to have that battery charge a capacitor, is the matter of that battery having received a small amount of recharge. This brief recharge occurred during brief periods when power is initially applied, causing the charging circuit to turn on, as well as during pre-programmed wait times directed by the power supply. Each of these events may be only 2–3 seconds in duration, but that ~10 seconds of charge (especially if the supplied device is equipped with a fast charger) will have renewed the battery sufficiently to deliver a reasonable hold-up time . . . less than a second per occurrence would be ample.

Not all power supplies will have a PFC of 1.0, so recovery from a high transient load may have to be compensated for. One way to recover from a transient loss of power signal (or a brown-out) is to put a capacity-type device or circuit between the power supply and the supplied device. FIG. 5 shows a simple circuit which, if the supplied device's battery is sufficiently charged to load a capacitor, that battery acts as a reserve or "hold-up" device, so that the supplied device's battery becomes its own UPS. FIG. 5a shows a block diagram of this concept, where battery source 208 is, in this example but may be otherwise a different battery, the supplied device's own rechargeable battery.

Note that this circuit, or an equivalent, is not advised when the supplied device's battery is significantly discharged. If the battery in the supplied device has sufficient power reserves to sustain the supplied device's normal operation, there may already be a switching circuit in the supplied device to bring the battery online immediately to replace the external (or internal) power supply. However, a marginal battery will only complicate this. Let's look at the following scenario.

1). The battery is already discharged to a point of not being able to sustain the load schedule of its own supplied device, were that device to be turned on while the battery is the only available source of power. However, that battery does exhibit sufficient capacity to operate the supplied device long enough to make the supplied device vulnerable, for example the supplied device is a laptop, and it is only capable of booting and opening an application prior to battery reserves becoming depleted.

This example is relevant and not far-fetched, because many laptops rely on an audible warning to alert the user that battery reserves are critically low. If that laptop is being used on a train, or on a plane, the user will probably not hear the alarm sound. The result can be a "crashed" computer, with loss of data, corrupted executable files, etc.

2). The charging circuit to that battery-almost-exhausted supplied device 206 exhibits a change in resistance (live load from the power supply's perspective) in excess of the power supply's voltage-limiting circuit. When the charger turns on, the power supply's protective circuits turn it OFF. There are charging circuits in laptop computers with so poor a design that they look like a short when turned on.

Given the consequences of these two variables occurring, and the fact that there's no way to prevent situations 1 and 2 from happening (it's two design inefficiencies coming together when the user can't be alerted as to the need for immediate action). This is only one example of the usefulness of this modality of the power supply according to one aspect of the invention.

Controllable regulator 264 can have a logic circuit, which may have some minimal processor/memory (not shown) which reads the charge state or battery 208. Such an intelligent system is illustrated in FIG. 5b, which represents a power management scheme between two controllable regulators 264 in FIG. 5, and where the intelligence to make decisions about which power source to access resides in the supplied devices themselves. Supplied device 705 in FIG. 5b has all of the logic required to determine when a controllable regulator 745 can switch its power to another supplied device 741, and thus allow supplied device 705's own battery 719 to deliver power instead. FIG. 5b, in this perspective, represents two FIG. 5s joined along mutual data lines and power lines, but only one controllable regulator is available to service both, albeit that controllable regulator has a load rating sufficient to power both devices simultaneously. This is fully explained in FIG. 5b.

In FIG. 5, supplied device 206 has a data link to the controlling devices external to it. It can configure controllable switch 184 to route power from either 208 or controllable regulator 264, or even auxiliary battery 290. The supplied device makes this determination on data available to it from both battery 208 and controllable regulator 264, via A/D converter 260 and along datalines 254, 196, 204 to supplied device 206, then back via lines 204 and 196 to configure switch 184, then further along to dataline 256 to configure (or temporarily deactivate) controllable regulator 264. Thus, supplied device 206 polls the two power sources, battery 208 and controllable regulator 264 and determines which source is most appropriate to deliver reliable power.

Voltage regulator 287 is required only if battery 208 is not the manufacturer-supplied battery. It may be a battery reserve which already is voltage matched to supplied device 206, in which case a voltage regulator is unnecessary. There can be more than one battery device 290 in the circuit, with switch 184 configured to accept two more power lines 200. Switch 184 in FIG. 5 is represented in FIG. 5b as SW-1 through SW-5. The function of switch 184 is detailed in FIG. 5a.

Sensors 190, 192, 280 and 282 in FIG. 5 do not have to be in-line voltage/current devices. Sensors 190 and 192 can exist as an I-out line in controllable regulator 264 (for example, as shown as the I-out line on FIG. 11). Sensors 280 and 282 can reside in battery device 208, thus making it a "smart" battery, or they can be the "smart circuit" referenced in FIGS. 13 and 13a as modules in a power line. The four sensors in FIG. 5b are shown as $S^1$, $S^2$, $S^3$, $S^4$ and $C^1$ and C, with "S"-style sensors specific to voltage detection, and "C"-type sensors specific to monitoring current flow and loads.

FIG. 5 details a system, whereby battery device 208 shares the powerlines to supplied device 206 with controllable power supply 264. Either the power supply or the battery device can power the supplied device, based on the configuration of the controllable high-speed switch 184. Both the controllable power supply and the controllable switch 184 are controlled by an external logic circuit and microcontroller (not shown). This model is similar to what is already an existing switching circuit in laptop computers, which serves to keep the laptop powered by either its rechargeable battery or the external power adapter. If the external power adapter is connected to its supplied device while the laptop is in use and under battery power, the switching circuit immediately goes to the external adapter as the primary source of power, and the battery is taken out of the power input circuit. If the external power adapter is disconnected from the supplied device, the battery immediately comes back online to power the laptop again. This switching is transparent to the laptop, and not even a current or voltage ripple is detected. The circuit shown in FIG. 5 is based on the same model, except that battery device 208 can be any battery source, external or otherwise. The voltage regulator 287 is only required if an external battery source of a different voltage than that required by supplied device 206 is used.

N). A third factor comes into play which also helps guarantee that the slightly recharged battery referenced in "M" above will be effective in the circuit shown in FIG. 5. The human factor comes to bear in further ensuring several seconds of battery charging. The following model of device usage is predictable and almost universally standard in using rechargeable battery-powered devices.

1). The battery is depleted and the user knows it.
2). The power supply is connected to correct problem #1.
3). The supplied device may be intended for immediate use, running from the external power supply.
4). If immediate reuse is desired, a small amount of time elapses before the device is turned on. This brief time delay is created by:
   A). As soon as the power supply is attached and the proper voltage is available, the charger turns on.
   B). If the user intends to use the supplied device, it then must be manually configured for use. If it is a laptop computer, the clamshell lid is opened, then the ON button is depressed Empirical testing indicates that this activity takes approximately 5–7 seconds. During these 5–7 seconds, the battery is being charged.
   The configuration process continues, while the BIOS POST runs, the OS loads, etc. This can take several minutes. During these minutes, each hardware device in the machine is individually turned on, but rarely two together (the screen is on, as well as a hard drive, but never a hard drive and a printer, or a copy command which requires both the HDD and floppy to run simultaneously).

Thus, there is a real window of 5–10 seconds during which the battery has been charging, prior to the device even powering up. There also may be several minutes before a device not anticipated when the lowest minimum operating voltage designed into the voltage regulator is turned on. It is important to understand that, once the controllable power supply delivers an output voltage capable of turning the charger on, that will be the same voltage at which the manufacturer of the supplied device intended the equipment to operate . . . it may not be the optimum voltage, so this effort is to optimize the supplied device's performance by reaching the manufacturer's published operating voltage.

O). As the events being enumerated from all of the above proceed toward the power supply delivering an optimized voltage to the supplied device, the power supply's internal logic circuit tapers off the voltage increases (i.e., diminishes the amount of allowable voltage "overshoot") after every PFC occurrence. This diminishing voltage-increase model is akin to making smaller and smaller corrections as the "perfect voltage" is approached. It is essential that smaller voltage steps occur around that optimal voltage, for the power supply is quite blind and dumb, depending only upon a cause/effect relationship between it and the supplied device. The algorithms will be making very minor voltage increases toward the end of this process, in the 1% (or less) range, based on the original baseline voltage, and not on the last voltage delivered.

P). The effectiveness of this entire process is determined by a sub-set of the algorithm, e.g., a look-up table, which can be implemented in various ways. This look up table is a "power signature" of the supplied device, created as the device is about to be used. There are at least three possible ways to create this table, and the table is used primarily to validate the last-applied voltage to that device. In other words, the table helps make assumptions about whether the target voltage has been reached. It also serves to give preliminary indicators of what that voltage may be, prior to and during the progression up a voltage ladder. The following three models are based on observation of load-schedule changes over time:

1. Pre-defined template. The look-up table is not a tabula rosa. It has generic values of known supplied devices, and the characteristics of any power-related hardware inside those devices. For example, a laptop computer is a class of devices which will always have a hard drive (or an equivalent data storage sub-system), a display screen, a processor, and a set of commonly used peripheral devices, such as PC cards, CD-ROM drives, etc. The logic circuit related to the power supply modifies this generic look-up table by observing whether each sub-system or hardware component fits this generic profile.

The first way to build a valid look-up table is to base it on an "expert" system, which uses hard rules to interpret the generic look-up table in light of real world observation (monitoring current at any given time when a sub-system might be turning on, for example). The power supply's logic and data acquisition systems "look for" device usage and then try to redefine the look-up table.

The essential decision tree this expert system is trying to execute is quite basic, but it can branch to many layers of sophistication, based on the anticipated use of the power supply.

1). Is the powered device active to:
   (a) Recharge batteries only?
   (b) Perform work?
2). If (a), are the parameters of observed changes (or non-changes) in load valid for only a battery charger being active? Reliance on generic look-up tables, based on known battery charging algorithms is required to do this effectively.
3) If (b), is the "work" being performed characteristic of a device type. For example, a portable printer has a definite "power signature" quite different from keyboard, as compared to a hard drive (or floppy) doing read/writes. Here, too, generic look-up tables based on pre-defined sequences of events are important.

While this process can get quite complex and processor/memory intensive, the use of generic models in a look-up table, as the basis of some hard rules, can yield a reasonably valid "yes" or "no" conclusion to 1(a) or 1(b).

It must be noted that this model of power (voltage and current) signatures, as it relates to not only detecting battery charging activity (which also establishes the even more elemental concept of a battery having to be present in the first place for the charger to even turn on at all), can be viewed by the power supply's logic as either additive or subtractive in nature. All three of the principles discussed here on which "intelligent" systems should be used to interpret the base data, i.e., expert system, fuzzy logic or adaptive neural networks, use two basic data calculating methods, additive or subtractive.

The additive methodology looks at all of the supplied device's sub-systems and resources which are individual, definable hardware units, such as the hard drive, floppy, CD-ROM drive, screen backlighting, etc. Each device draws a specific amount of current, so that a hard drive might be rated at 750 milliamps for the drive motor, and an intermittent 50–100 mils for the stepper motor (stepper motors are easily identified when operating, because of their characteristic template of staccato ON/OFF operation), and a floppy draws 1 amp during a read/write pass, while the screen back backlight is rated at 1.2 amps, and is very continuous (it rarely turns on and off, except during screen saver operation, or if APM-type (Advanced Power Management) software or hardware toggle it on and off for energy conservation.

FIG. 12 shows a simple block diagram with only these four mentioned hardware devices. We now look at a few of the variable combinations of these devices being in states of ON or off (intermediate "standby" or "sleep" states are being ignored for the purposes of this illustration, but they would be calculated as a subset of each device). As can be seen, there are definite mathematical models which result in a cumulative total energy load calculation. The totals expressed here, plus other comparable totals for every possible combination of multiple devices which can be turned on or off at any given time, are in a database, accessible by the power supply's logic (or sent to a processor-enabled device for computation and conversion into a look-up table).

From this simple illustration in FIG. 12, the viability of being able to distinguish one type of device from another with only a "current load signature" for each, will enable the power supply's logic, whether internal or remote, to monitor the charging circuit as a known activity.

As noted elsewhere, the "current signature" look-up table shown in FIG. 12 is validated several times during normal laptop operation. First, the devices illustrated are each turned on and off momentarily during the BIOS' POST at boot-up.

Next, software specific to turning such devices on and off may already exist on the supplied device, as some sort of power management application. The power supply's logic only has to watch for events which match the first observations during the boot-up. Furthermore, the devices which are being identified don't have to be labeled in the database as a hard drive, CD-ROM or backlighting for this additive process to work. These are only discrete identifiable changes in current, so they only need to be labeled as Device A, Device B, etc. Knowing that Device A is a hard drive, and not a floppy, has little relevance to the two mission statements, which are:

A). Optimize the power supply's input voltage to the supplied device.
B). Accurately identify the presence or absence of battery charging activity.

In this additive model, where a "power signature" is expressed as all of the potential combinations of devices listed in a look-up table, and available to the power supply's logic, the activity of a battery charging circuit turning on and off will be very apparent, especially since, as has been noted, this on/off activity is intense voltage and current event. While detecting a charger turning on and off is not difficult, "seeing" that charger over time becomes more complex. As the battery becomes more filly charged, the impedance throughout the charging circuit makes the charging activity look less and less obvious. A typical three-hour battery charging session is very different, as a function of load, during the first hour than during the last. The charging activity in stages 2 and 3 is so minor a blip on the total current-being of a laptop, for example, so as to appear as only "noise." Therefore, if the charging process is resumed with a battery which was already 50% charged, the amount of current being drawn from the power supply to sustain that charge will be small.

A calculation is done to see if the values in the totals column of the look-up table in FIG. 12 correspond with the observed changes in current-load, as they should with a known combination of identified devices. If there is no match, or if all of the totals during a time period are elevated, then it can be safely assumed the extra power is coming from a charger. The element of observing events over time is significant, because battery charging is a long-term activity, usually calculated in multiple hours, so the continuity of any aberrant electrical activity in the supplied device is another confirmation of the type of activity being detected, i.e., long-term battery charging, as compared to a screen backlight, which may only turn off a few times an hour.

This additive procedure is very good for detecting the initiation of battery charging during the supplied device's ongoing operations. An example of this would be an airline passenger who removed a battery pack after he/she was told to, but then re-inserted it at some later time.

The subtractive model of battery charge detection and monitoring follows the same development path of identifying hardware devices' current-drain statistics, then building that into a look-up table, etc. The only difference is that the power supply's logic, which can be for example, software installed on the supplied device, is deducting known power events, in order to determine if there is a baseline of current which can only be the charger.

Such models can be complex to build. The CPU, for example, is a major power drain, but it exhibits linear characteristics, with no definitive on/off characteristics. While modern Intel chips have internal power management which puts the chip into various stages of dormancy when not in use, legacy chips can run very near fill tilt, even though there is no processing activity. To resolve identifying legacy chips, the power-data gathered during the boot sequence provides a key. Once data is gathered as illustrated in FIG. 12, a secondary look-up table is consulted, which contains not only generic load-schedule values for various types of hardware, such as hard drives, but also confirmed current-raw values for processors. This is relatively easy to research since, until recently, Intel (and Apple) dominated the installed CPU market, and only several dozen chip designs have been used in laptop computers prior to 1996 (notebook computers, as a class of goods, did not exist prior to mid-1989).

The subtractive method constantly cancels out an identified power signature of each known device. If the total always shows a load-value remaining, or if the computations consistently don't calculate correctly, it can be assumed that there is an unknown variable, which probably is only accounted for by an active charging circuit Both the additive and subtractive methods should be employed, whenever possible, especially if the resultant activity precipitated by this exploration is to issue potentially threatening messages to the user of the supplied device.

The other mission of determining whether the supplied device is operating at a voltage which has been optimized by the power supply is somewhat more obvious, since any device which tries to turn ON, but fails to properly do so, will either result in warning messages from the operating system to the supplied device's user, or the internal regulator will compensate for it. The probability that a device won't operate correctly is immensely remote, for the voltage regulator will invariably compensate. However, this compensation will be detected by the power supply, and will distort the previously observed values in the look-up table. This will be an anomaly, and the power supply will once again increase its output voltage, to see if that is what the internal regulator requires. If the net result of the increase in power is that the internal regulator becomes more efficient (or if the entire look-up table moves more toward a projected average power load), then the power supply will hold this higher voltage value.

For battery charging detection, if all of the above data gathering is not feasible because of the logic circuit's processor limitations, or other variables, a sure way to quickly get a very accurate reading of a battery charging event is to simply prompt the user, on the supplied device's screen, to remove and reinsert the battery. This process will deliver the most valid data on the charging circuit's "power signature," in both the on and off states.

In its simplest implementation, continuous battery charging only tends to look like a relatively flat current load, although there is a sizable ramp up (spike) of voltage and current almost immediately upon the charger turning on. Over time, while a NiCad is charging, a characteristic change of impedance in the battery will show predictable (and slow) changes in current drawn from the power supply. Pulse chargers always behave as easily identifiable devices.

Printing, on the other hand, looks like a definite on/off sequence, and the "off" period lasts for only a prescribed time. A printer's repetitive nature may also be a big clue.

Lest this process be misunderstood, the power supply is not attempting to differentiate between printing vs. battery charging activities. The only decision the power supply's logic is making, when first connected to the supplied device, is whether there is an adequate power signal at a voltage that is well within the envelope prescribed by the laptop's design voltage. If 1(*b*) in the test procedure described above is detected (performing work) and that work continues for several minutes, the power supply assumes that the end user's continuing to perform work is, in and of itself, validation that the delivered power is adequate for the task.

Battery charging "events" are less critical to delivering an optimal voltage, but the state of discharge of the battery will produce a need for more power when a battery is almost fully discharged, as compared to one which just needs topping off. The internal regulator invariably will compensate for some reasonable input under-voltage. The algorithm in the power supply eliminates any dangerous under-voltage situations, because voltage increases are tapered off as the power signal increases.

If charging is the only activity engaged in by the supplied device, the power supply can drop out if the supplied device's load suddenly increases. The charging current during the first ramp up of the charger can exceed the power supply's ability to adequately power factor correct (for a power supply with a PFC of 1.0, compensating for a surge in current shouldn't be problematic). However, not all charging circuits are even reasonably well behaved. A major manufacturer's laptop caused a spike of over 2 amps every time the charger turned on, and that much demand will strain any power supply that is operating at a marginal voltage (as it relates to load).

Unless the battery pack in the supplied device is absolutely dead (i.e., below the minimum voltage that will power the supplied device), the battery will take over powering the laptop when the power supply's protection circuits shut it down because of the overload created by the charging circuit coming online. The battery will only have to keep the supplied device operational for a second, while the power supply resets. The controllable power supply will merely come back online at a slightly higher voltage. The battery has usefulness, because it can act as a temporary surrogate power supply or capacitor in such situations (reference FIGS. 5 and 5a, with its accompanying text). This is important if work is being performed by the end user, because the battery is in the circuit to prevent a system crash. Remember that the battery has been momentarily charged. This is an important safety feature.

The other two models of validating a "target" voltage are more sophisticated, but also more expensive and complex. In stating that, they will only be briefly noted for those power applications which require sophisticated feedback and precise power adjustments.

Artificial intelligence works well in the above-described logic. Fuzzy logic is effective because it is strongly biased to make decisions based on algorithms and look-up tables (databases). The only caveat is that successful implementation of mathematical models in fuzzy systems requires a high level of understanding, background and hands-on development in that discipline.

Adaptive neural nets are another school of artificial intelligence. While ANN is probably gross overkill for so simple a task as determining the optimum voltage of a powered device, there may be certain power applications, (e.g., medical, military, etc.), where there can be no compromises. In stating that, it is doubtful that such mission critical devices would not be replete with redundant back-up power technologies, so there is little validity in the real world for approaching this problem with advanced artificial intelligence. However, experimenters may wish to advance the state of power technology by integrating neural processing as an interesting scholarly pursuit, if nothing else.

In conclusion, the above processes allow for a power supply which can deliver an appropriate power signal to a powered device without reliance on anything more than internal data acquisition of current loads. Understanding Ohm's law and applying it with a good knowledge of the power supply's intended application yields a viable way to power passive and dumb devices without reliance on any communication from the powered device. "Smart" batteries and their intelligent host devices, as well as data links such as IR or cables between the power supply and powered device simplify this task, but a power supply according to the present invention is not dependent on these for its operation.

B. A Real-World Model of the Modality

In Paragraph I, above, the power supply's ability to detect battery charging has significant safety benefits. Charging L-Ion batteries poses some potential risk if done in inappropriate environments, in particular aboard passenger-carrying aircraft (and this may also extend to trains, buses and other public transportation vehicles, such as ships). The commercial aviation industry is focusing on the advisability of allowing its travelers to use airline-installed power ports at each passenger's seat. Even more significant is that DOT (Department of Transportation) is reviewing its policies relating to even allowing L-Ion batteries aboard aircraft because of the amount of heavy metals they contain. In either circumstance, whether the issue is that batteries are not allowed at all in the aircraft cabin, or that they are allowed onboard, but that they can't be recharged, a system which can readily and reliably detect battery charging can serve as a safety device. As previously indicated, the power supply according to one aspect of the invention can readily detect battery charging as a power-load event. The power supply's internal logic can be modified to react to detected battery charging in numerous ways, but the most notable ones would be to alert the passenger (via a screen message on the laptop, perhaps an audible alarm, etc.), of the official rules regarding charging computer batteries on that flight.

Second-level responses to continued battery charging, i.e., the passenger has ignored the screen prompts, is to issue a stern warning that the battery pack must be removed immediately. If those on-screen prompts are ignored, an internal alarm circuit in the embedded power supply's logic circuit trigger's a warning to a cabin attendant, who can elect to approach the passenger to request compliance with the rules.

If the passenger still insists on charging the supplied device's battery, the embedded power supply's logic circuit issues a final screen-based warning to the miscreant passenger, announcing that all power to the computer will be turned off after a predetermined time, perhaps 2 minutes. The passenger is urged to close all applications and prepare for the mandatory power shut down. Once the allotted time has transpired, the power supply's logic verifies one last time whether the charging circuit in the supplied device is still active. If battery charging is still detected, based on monitoring the recognizable model of an active charger and battery pack in the power circuit, the power supply is reset to 0 volts, and the internal logic bars any further access by holding the power supply's voltage at 0 volts until a member of the cabin crew, or the flight engineer/co-pilot, resets the power supply.

"Smart" batteries play a significant role in this battery charging detection model, but the logic-controllable power supply does not depend on battery intelligence to perform this charge-detection function. Rather, charging activity is a discernible and detectable event, no matter what type of battery is available in the power circuit. A smart battery does afford an opportunity for the power supply's logic to access the battery's internal data registers in order to verify battery chemistry. This verification may not be valid for decision-making, since a significant number of gray-market battery packs are in the marketplace, according to Sanyo (San Diego, Calif.). Sanyo estimates that some 20% of all batteries sold are "knock-offs" of UL-approved batteries which don't meet UL standards. This number is confirmed by Cadex Industries (Vancouver, BC, Canada), a manufacturer of battery analyzer equipment.

In light of this, the intelligent power supply incorporates, as an optional circuit, the Cadex (or equivalent) battery analyzer between the power supply and the supplied device. This analyzer is not intended to recycle batteries, although that modality is viable for non-transportation uses, but the Cadex programmable battery analyzer is capable of verifying the battery's chemistry to detect battery packs which misrepresent that they are original manufacturers' equipment, but are actually gray market cells, or sometimes not even the chemistry represented on the pack's label. The ability to differentiate non-standard batteries provides a level of added safety, if for no other reason than to alert the user of this potential problem. If the modality in which this integrated system is used is on an aircraft, the controllable power supply is shut down if a nonstandard battery is detected.

Figure 14:
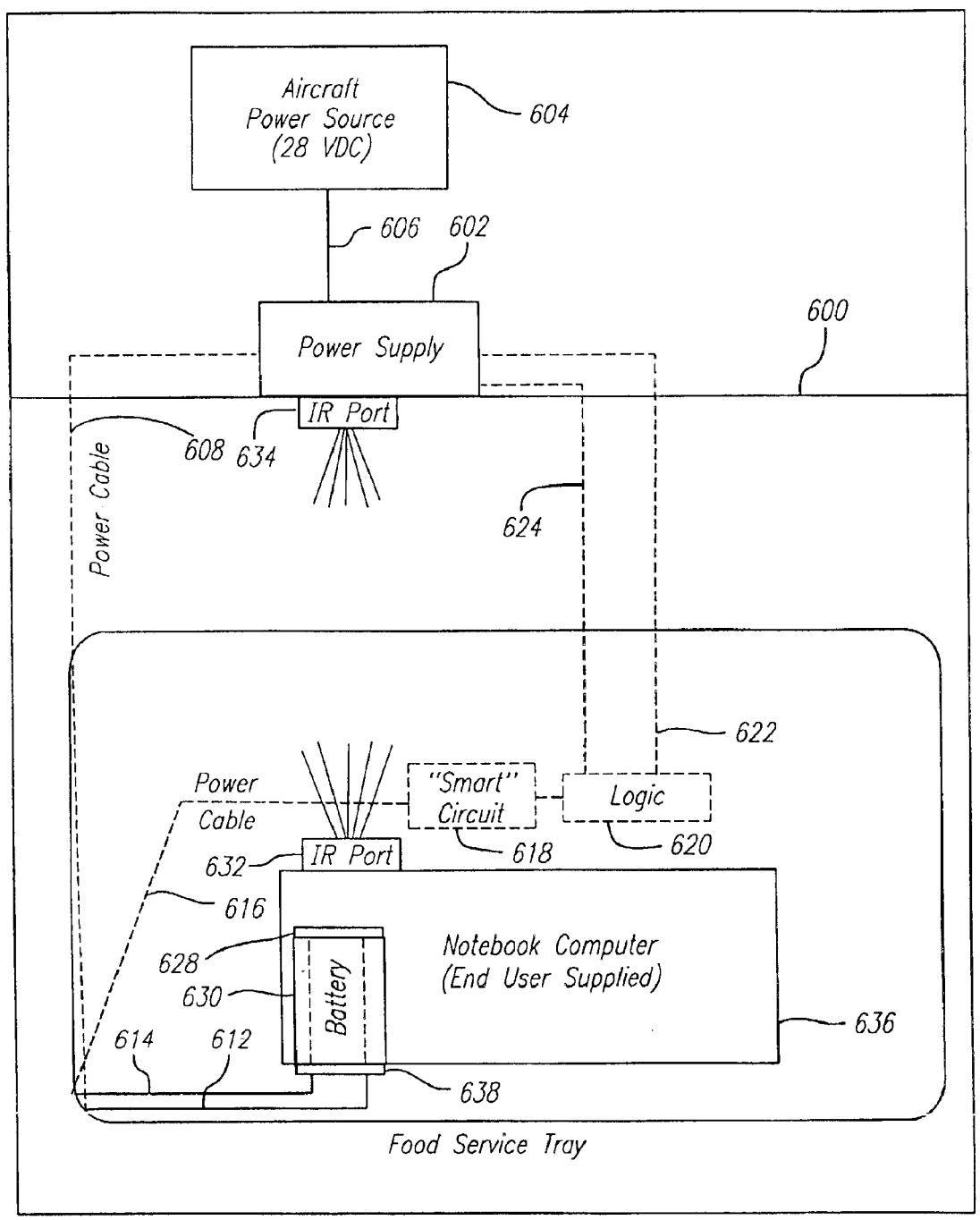
FIG. 14 is a block diagram illustrating a power supply according to the present invention suitable for use in an aircraft power system.

The battery analyzer modality described in the previous paragraphs, illustrated in FIG. 14, has a connector like that in FIGS. 1–4, which connects directly to the battery pack, thus enabling the battery analyzer to directly access and test the battery, independent of the supplied device's internal power circuitry. The connector 8 in FIGS. 1–4 is available in an ultra-thin (0.5–1.0 mils) and flexible form factor which makes it insertable between a battery pack and that battery's supplied device, so that the battery pack can remain installed in its cavity.

While not necessary to the functionality of the power supply described here for transportation modalities, a 9-pin connector (or a connector which has sufficient power and data conductors to pass through the necessary information) in the powerline between the controllable power supply and the supplied device would facilitate the passenger interface (if the power supply is a cord-tethered external adapter, instead of an embedded unit). The 9-pin connector uses four of its nine conductor pins for power signal transfer, and the remaining pins are for data lines. This particular connector is referenced here only because it is under consideration by ARINC (Aeronautical Radio, Inc., Annapolis, Md.) as an industry standard interface for the aviation market.

Figure 6:
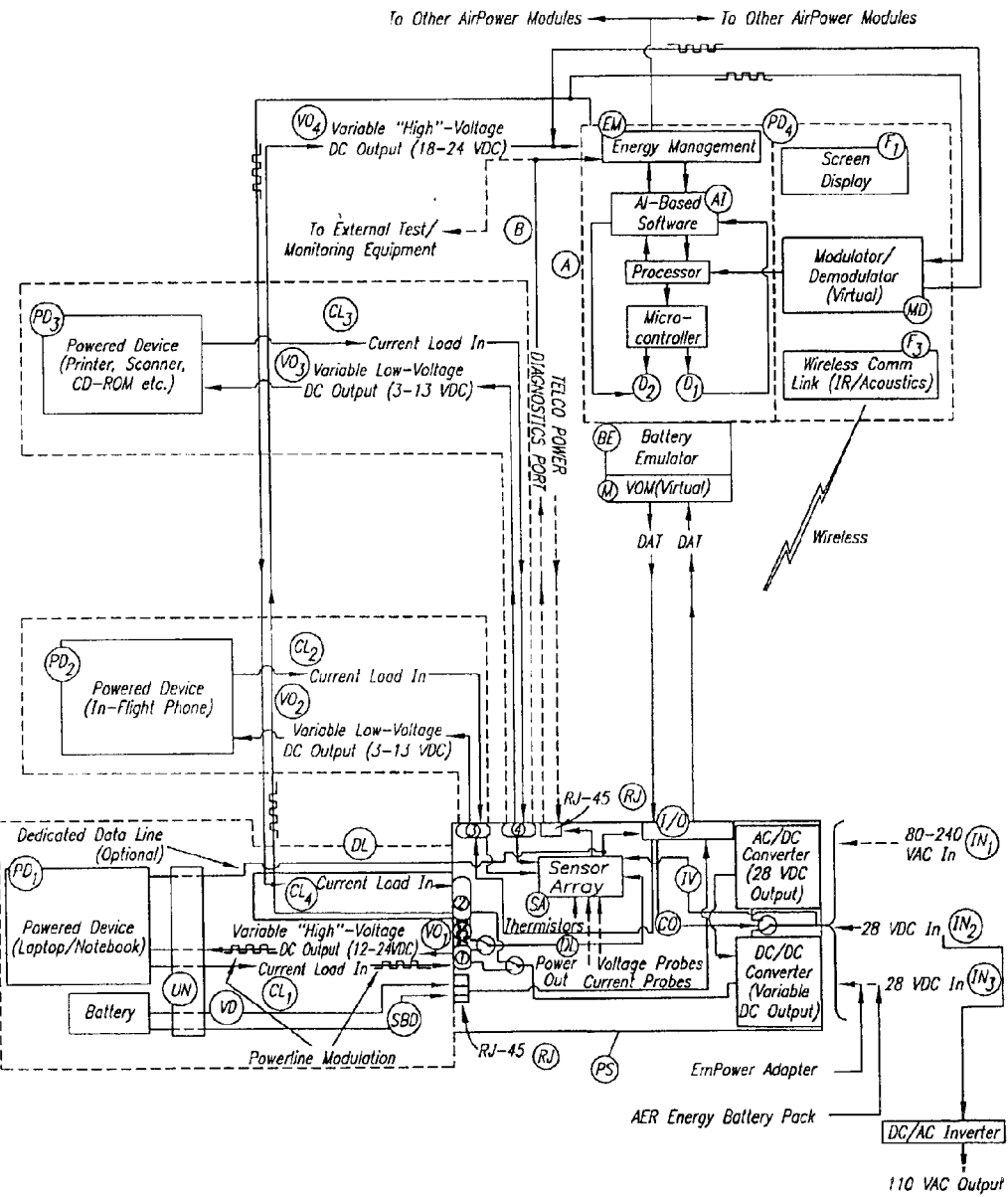
FIG. 6 is a block diagram of an embodiment of a power supply according to the present invention that represents either an external power adapter for a supplied device, as well as an embedded power supply suitable for use in flight on an aircraft. Both modalities are shown as they might be used in conjunction with numerous supplied devices.
Figure 6A:
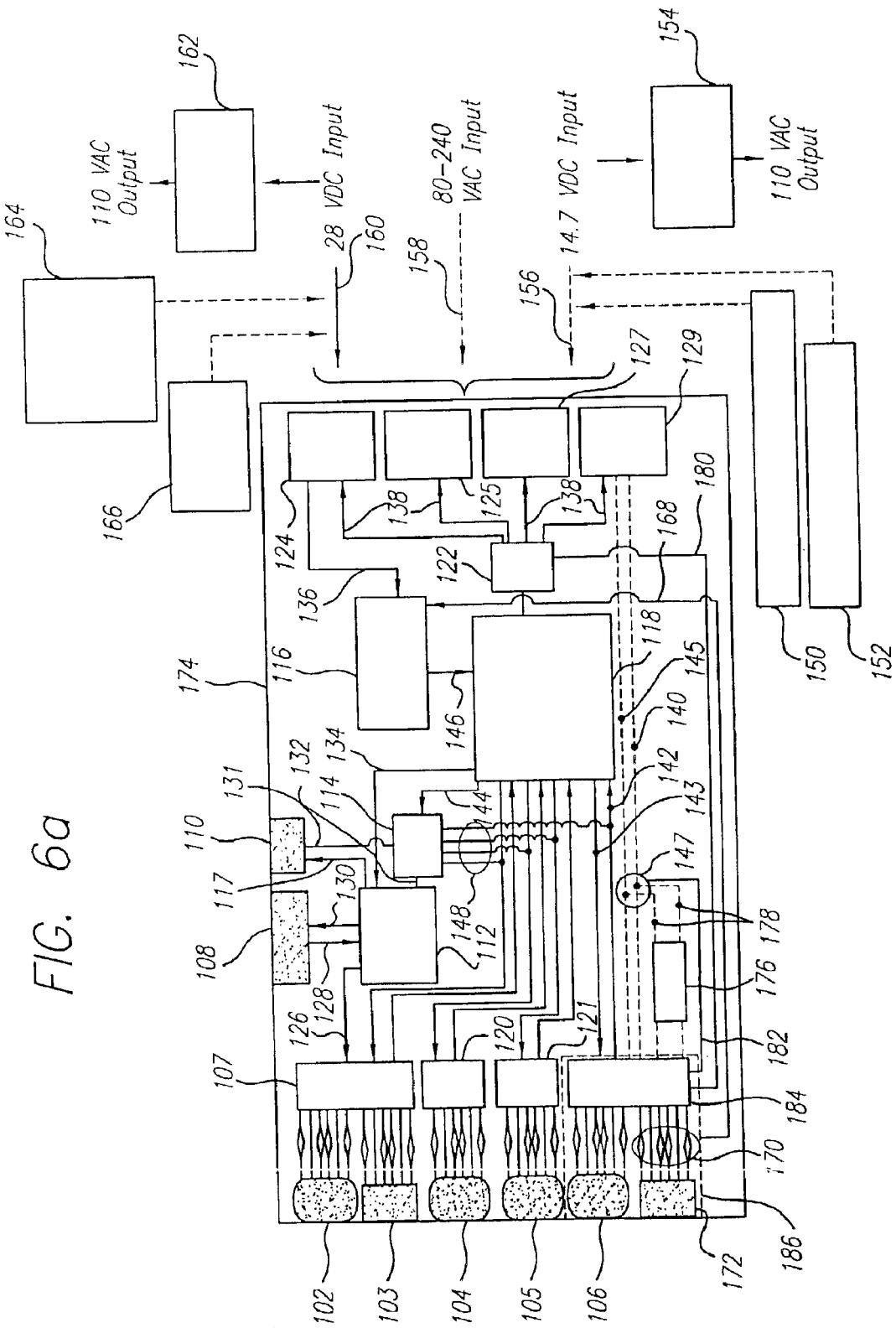
FIG. 6a is a more detailed diagram of an embodiment of the power supply labeled "PS" as shown in FIG. 6.
Figure 13:
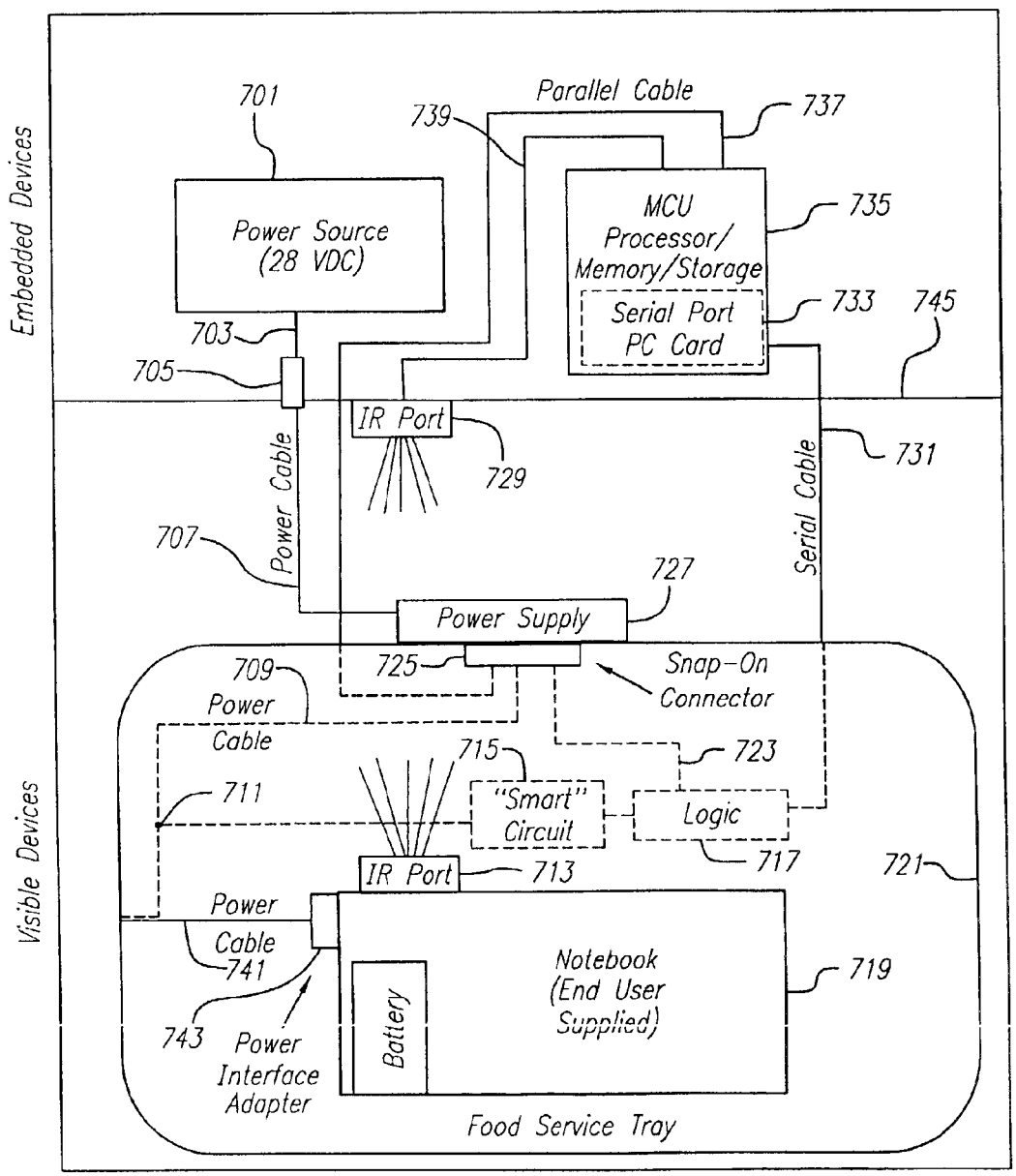
FIG. 13 is a block diagram illustrating a power supply according to the present invention suitable for use in an aircraft power system.

No matter what the physical configuration, some sort of data- and power-enabled connector allows all data lines to pass through to the controllable power supply (FIG. 6 shows a controllable power supply which has all data passing through it from a supplied device PD1 to an embedded MCU as PD4). If no such data-enabled power port is available, numerous variants of the basic communications links in FIGS. 13 and 14 provide the reasonable data paths, including phone wire, and wireless (IR and acoustics).

The power supply, when expressed as a passenger-provided adapter, is used when a pre-existing embedded power source is locally available to the passenger at the seat. EmPower has such a system, which provides a 15-volt power port in the physical configuration of a car cigarette lighter receptacle.

The power supply in this tethered adapter modality operates as an in-line adapter which is capable of being controlled by a logic circuit (and which may include a battery analyzer circuit). That circuitry can (but need not be) installed in the adapter housing, so that the unit is self-contained. In this modality, there may be a processor, memory, and a microcontroller on a discrete logic board inside the unit. In the obverse, the controllable power supply module may be devoid of any processing power, and be reliant on its functionality from remote processors and controllers. FIGS. 13 and 14 show two layouts of an in-line power supply connected to embedded computer-like units, but the power supply is essentially a dumb, controllable device (slave mode). In both FIGS. 13 and 14, the embedded processor has a direct data link to the supplied device, which is here a laptop computer on a food service tray, in which are embedded all the data and power cables (the power cables are on retractable cords). The data links are essential, since the power supply has no significant onboard intelligence, and is totally reliant on data exchanges between the embedded MCU and the supplied device.

The controllable power supply, as described as an embedded unit aboard various types of transportation vehicles, for example an airplane, need not have its logic circuit within the same enclosure as the power board. A remote MCU (Master Control Unit) can serve as the data server point for a network of such controllable power supplies, so that at least two power units can be controlled by a master unit. All data described in the section above relating to current sensing is sent directly to the MCU, where the information is processed. The MCU sends control commands to each controllable power supply, thus setting the required output voltage for each supplied device connected to this intelligent power grid.

Figure 7:
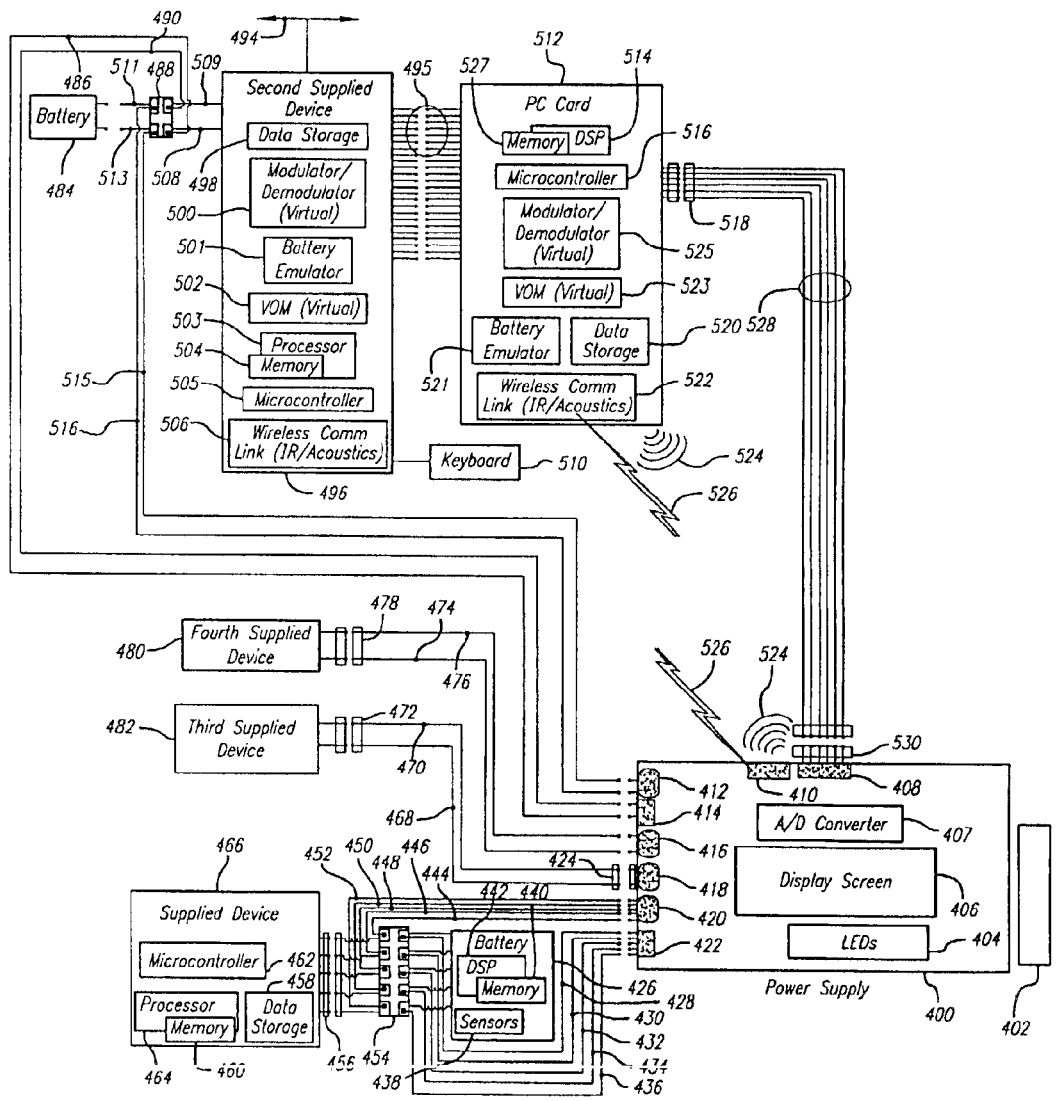
FIGS. 7–9 are block diagrams depicting variations of a system as shown in FIG. 6 further illustrating several possible data interfaces between the power supply and a typical supplied device, as well as interfaces with external equipment.
Figure 8:
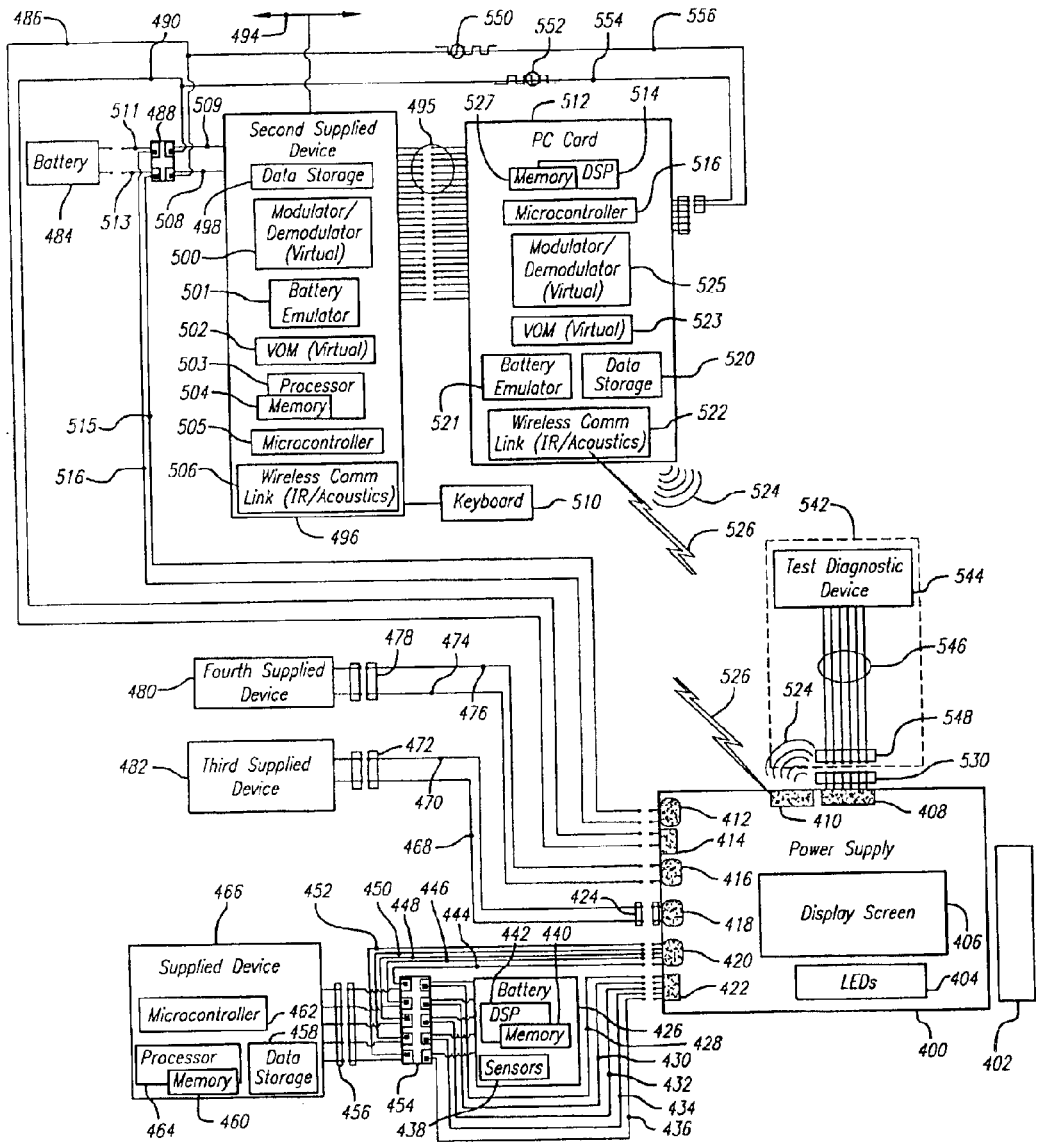

This network approach also makes power management and power-load sharing viable throughout a power grid which connects more than two controllable power supplies. FIG. 5 shows a modality of the power supply that uses the supplied device's battery (or a centralized large-storage-capacity battery) as an alternative power source to supplement the power supply's power signal. With an MCU in the network to control the availability and use of the battery device 208 in FIG. 5, power management between and among two or more controllable power supplies is greatly simplified. This load-sharing modality also allows for each power supply in the network to contribute some or all of its wattage to other power modules in the local area. The power supply, in this modality, has at least one additional power outlet, which is either programmable or controllable from some logic source. FIGS. 6, 7, 8 and 9 illustrate how four power outlets can be effectively used to power numerous types of connected supplied devices. In an aircraft cabin environment for example, FIGS. 7 and 8 show a third and fourth supplied device 482 and 480 in FIG. 7, which can be, as an example, an in-flight phone connected to the third supplied device 482, or an in-flight video display device as a fourth supplied device 480. These type of devices, which operate at known voltages, can be addressed as not controllable, but instead programmable (pre-set at time of installation, but reconfigurable if the attached supplied devices are upgraded or modified) outlets 416 and 418 of power supply 400 in FIG. 7, while outlets 412, 414, 420 and 422 can be controllable. Outlets 420 and 422 of power supply 400 are connected to supplied device 466 that has a processor 464, memory 460, data storage 458 and microcontroller 462. Thus configured, supplied device 466 is perfectly capable of controlling or programming power supply 400. Supplied device 496 also has these capabilities, and additionally offers them via PC card 512, as well as various communication modes between it and power supply 400, including hard-wired.

Figure 9:
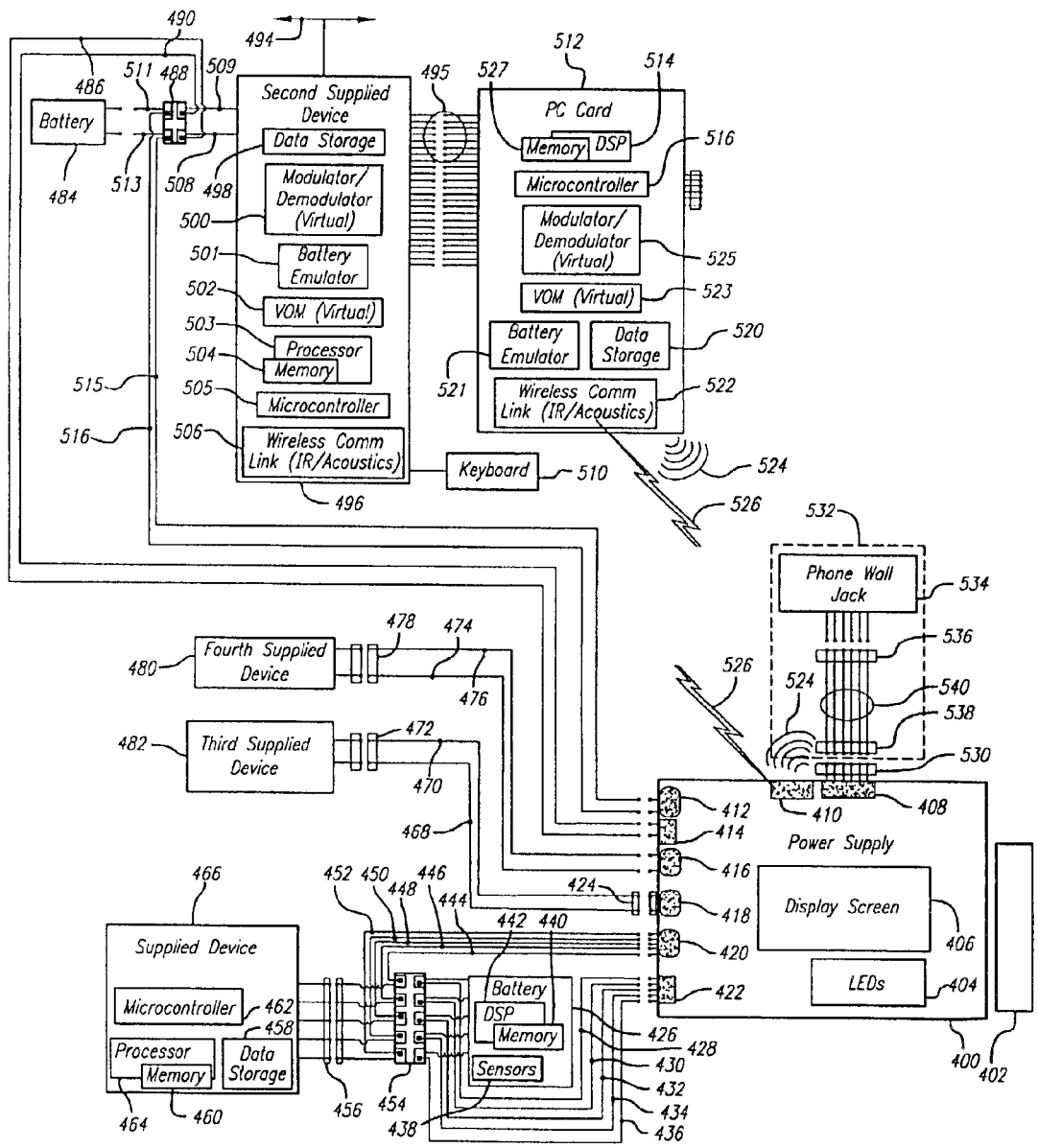

While FIGS. 7–9 show the power supply as a passive slave device in a network of supplied devices, FIG. 6 shows the power supply with significant circuits for internal diagnostics, as well as data lines which allow at least two connected supplied devices, here PD1 and PD4, to exchange information through the power supply over a variety of communication systems, both wired and wireless. Either or both PD1 and PD4 can control or program the various power outputs (here 1–4, but there may be fewer or more than that number) of the power supply.

FIG. 13 represents a system overview of at least one controllable or programmable power supply which is embedded, as it can be installed on a commercial aircraft. FIG. 5*b* also is referenced here, with its related text elsewhere in this document, as representational of two nodes (seats on an airplane, for example) of a multi-node power grid, along which numerous controllable power supplies reside, each power supply serving at least one supplied device node. Such a network of controllable power supplies, linked with logic capabilities to each other, can be effective in managing the total power load in the environment. This can be important on a commercial airliner, for example, where the power grid's head end is a generator driven by fossil fuels. Because the power supplies are controllable, they can be not only turned on and off, but they can conserve energy by doing load sharing, as described in the text accompanying FIGS. 5 and 5*b*.

II. FIG. 2

Figure 2:
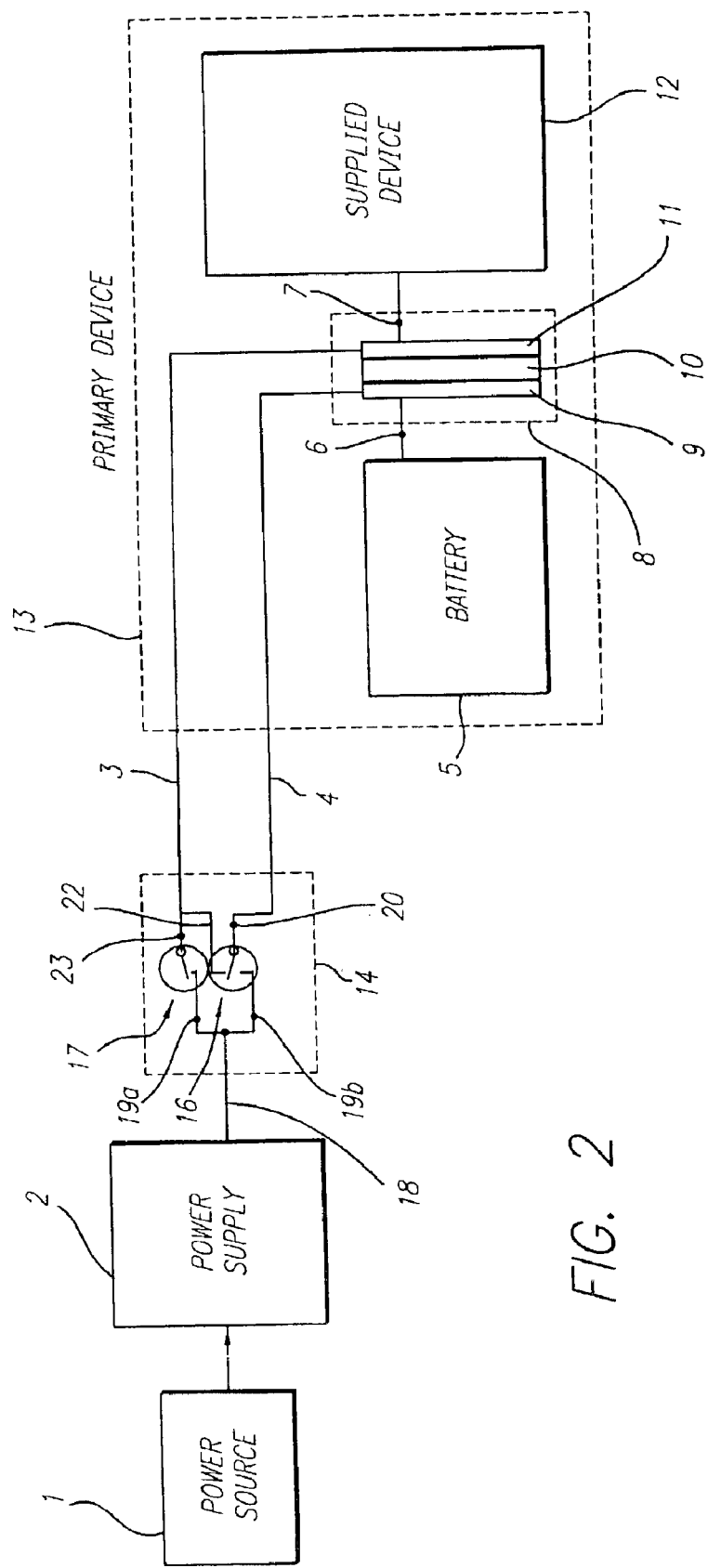
FIG. 2 is a generic block diagram depicting the arrangement shown in FIG. 1, but with a controllable switch interposed in the path between the power supply and the battery-operated supplied device.

As shown in FIG. 2, a three-pole controllable switch 14 may be interposed in powerlines 3 and 4 so that connector 8 may be used also to transfer power and/or data directly from battery 5 to supplied device 12 (thus restoring the connection between battery 5 and the supplied device to the state in which it would exist if connector 8 were not present). Connector 8 can also carry bi-directional data through powerline 4, either with or without power present, between a data-enabled power supply 2 and battery 5 which also has data capabilities. Likewise, power and data can travel bi-directionally through powerline 4 between power supply 2 and supplied device 12. As previously noted, data communications can be as power line modulation, or switch 14 can be among other switch types, a multi-contact unit, such as an N-signal switch (with power conductors) or a multiplexer.

FIG. 2 illustrates switch 14 located as an in-line device between power supply 2 and primary device 13. The use of MOSFETs, HEXFETs or gated circuits are acceptable in switch 14 of FIG. 2. The combination of power supply 2 and switch 14 shown in FIG. 2 may be configured in a number of ways to accomplish a variety of functions in connection with battery 5 and supplied device 12. For example, power may transfer directly from battery 5 to supplied device 12 (through connector 8). The first configuration of switch arm 20 in contact with line 22 (see circle 16), directs power from battery 5, along powerline 6 to conductor 9 on connector 8 and transfers it to powerline 4 to switch 14. Power passing from switch arm 20 through the contact travels along switch conductor 22 to powerline 3. At connector 8, conductor 11 transfers the power signal to line 7 and into supplied device 12. In this configuration, switch arm 23 (reference circle 17) is open. The switch in this modality allows power to flow from the battery to the supplied device as if power supply 2 and connector 8 were not present. This is the default configuration in which the switch is always set.

Switch 14 may also be configured to allow power supply 2 to receive data or power or both from battery 5 and supply an appropriate power signal to supplied device 12 or battery 5, or both simultaneously. In the second modality of switch 14, switch arm 20 closes to contact 19b, and switch arm 23 closes to 19a In this configuration, power (and/or data) from battery 5 reaches switch 14 along line 4, passes through switch arm 20, then along 19b, and into power supply 2 via line 18. In this modality, the circuit expressed by line 18, 19a, 23, 3, 11 and 7 deliver power from power supply 2 to supplied device 12 (or form a circuit for bi-directional data between power supply 2 and supplied device 12). Note that powerline 18 is shown simply as one line, but that it represents two sets of two-conductors, with the first pair of powerlines passing between power supply 2 and switch 14, via 19b. The second pair of powerlines represented by 18 are dedicated to switch-line 19a. These lines also can represent single or multi-conductor data lines.

The independent powerlines from battery 5 to power supply 2 enable the power supply to read the battery's voltage, and to use it as a reference voltage to which power supply 2 calibrates its output voltage to supplied device 12, delivering that correct voltage along the other switch circuit associated with line 3 independent of battery 5. With switch 14 configured as described in the previous paragraph above, it is representational of the switch-less mode of power supply 2 in FIG. 1, wherein power supply 2 has independent access to battery 5 and supplied device 12.

These two independent powerlines, one to battery 5 and the other to supplied device 12, allow power supply 2 to independently and simultaneously interact with either battery 5 and/or supplied device 7. With two voltage regulators within power supply 2, battery 5 can be charging at the same time that power supply 2 is delivering the correct power signal (voltage) to supplied device 12.

Switch 14 may be used for data or power or both. For example, it can be an N-signal power switch which reconfigures powerlines 3 and 4 in the several modes previously described, or it can behave as a multiplexer, switching data-lines represented here also as 3 and 4. When data-lines are present, so are powerlines, but the obverse is not necessarily true. In a modality where data and power co-exist in the system described in the various figures, the number of data lines is not critical to the operation of the power supply.

Switch 14 is shown with its elements 20 and 23, i.e., switch contacts being actuated by the primary device 13. Switch 14 may also be installed such that it is actuated by power supply 2, or by a third remote device (not shown here, but illustrated in FIG. 5a). In any of the configurations presented in FIGS. 2–4, a device other than primary device 13 or power supply 2 can actuate switch 14.

Figure 3:
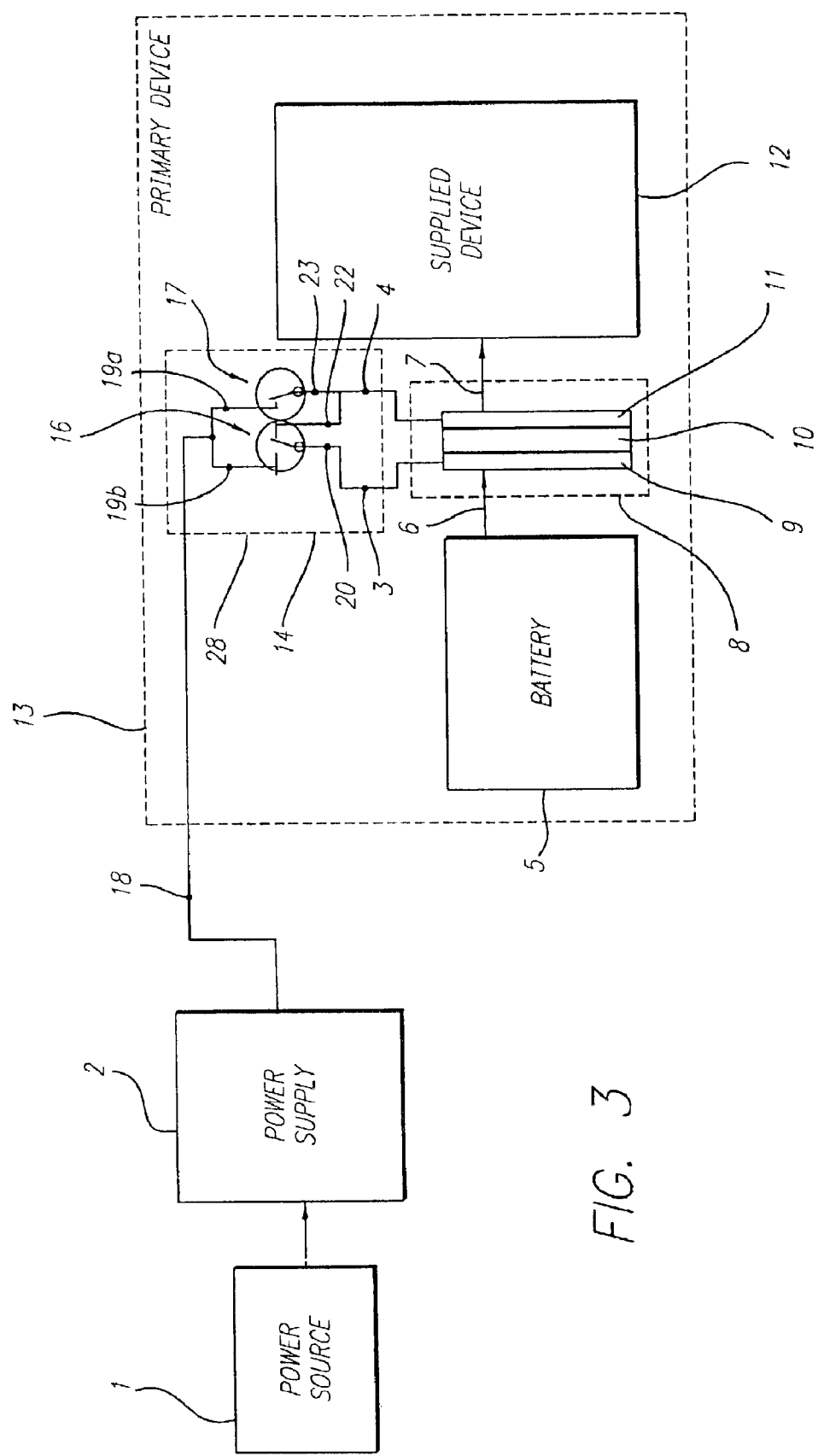
FIG. 3 is a generic block diagram depicting the arrangement shown in FIG. 2, but with the controllable switch interposed in the path between the power supply and the battery-operated supplied device and embedded within the connector between the battery and the battery-operated supplied device.
Figure 4:
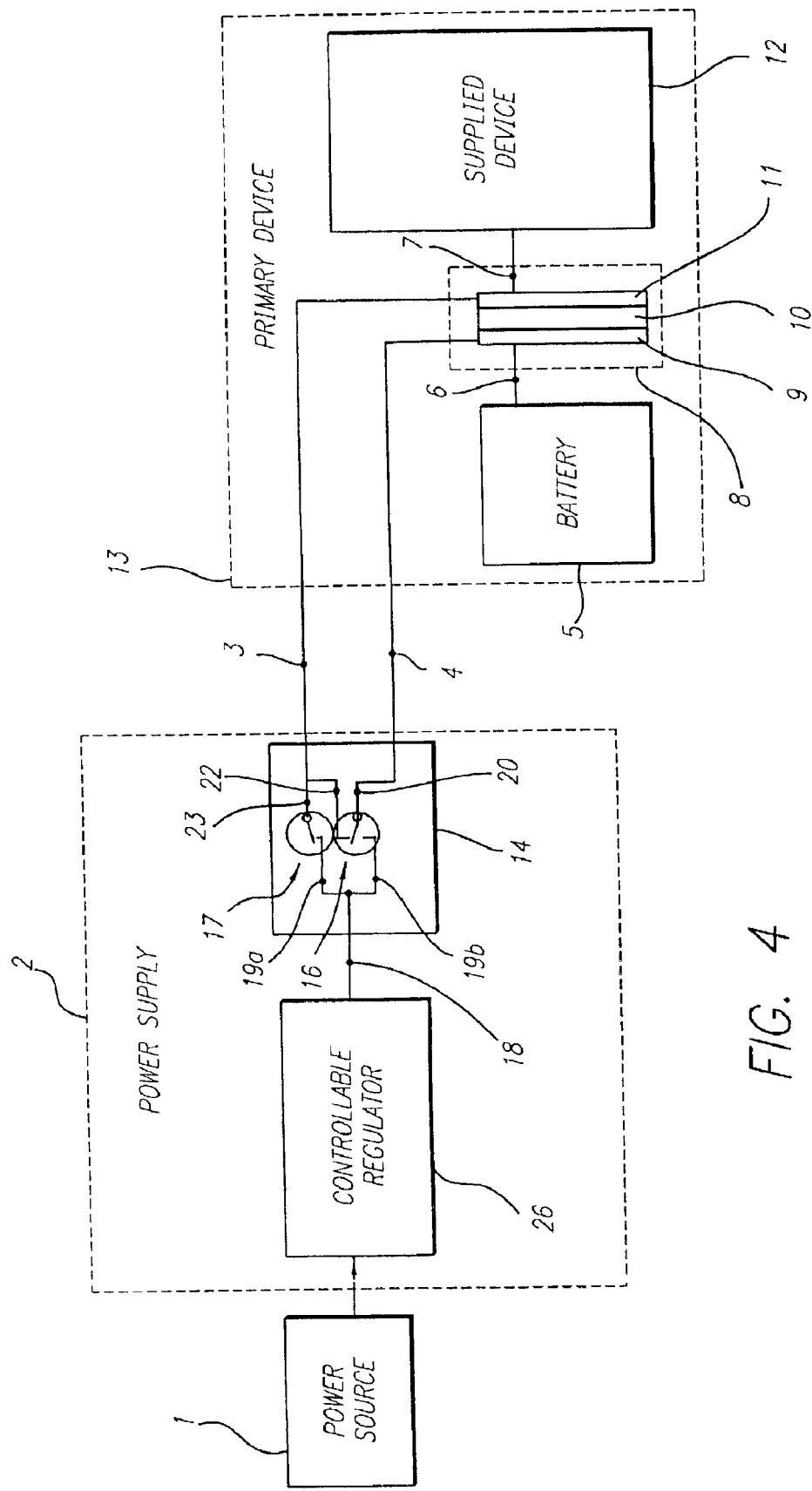
FIG. 4 is a generic block diagram depicting the arrangement shown in FIG. 2, but with the controllable switch embedded within another embodiment of a power supply according to the present invention.

III. FIGS. 3 and 4

FIG. 3 illustrates a configuration with switch 14 located within primary device 13. This location will be prescribed by physical space available, but generically it can be in any convenient location, for example the battery compartment, within a cord connector, or embedded within connector 8. Item 28 suggests the switch and connector as a unit.

FIG. 4 illustrates switch 14 integral with power supply 2. Controllable regulator 26 is referenced here to show its connectivity to switch 14, along power/data lines 18. As previously described, lines 18, 19a and 19b in FIGS. 1, 2, 3 and 4 can be multiple conductors, and that line 18a, for example, can be served by a dedicated controllable regulator 26, while 18b can have its own controllable regulator 26 as a battery charger, or a discrete charger circuit driven from a dedicated second controllable regulator 26, or the charger deriving its power from a secondary output of the controllable regulator 26 which is attached to lines 18a.

IV. FIG. 5

The device in FIG. 5 shown here relies on knowing the load being created by supplied device 206. The premise is that the supplied device 206 is in a mode where supplemental power is required. Perhaps this might have occurred because the supplied device 206 temporarily exceeds the wattage rating. Another possible scenario is that the controllable regulator 264 has, via a power management implementation, had to share some of its available power with another system, in an adjacent area to power a new supplied device similar to 206 which has come online, or that the single controllable regulator 264 has been configured (again, because of power management) to reallocate some of its power to an adjacent port on the system.

Whatever the scenario, the system utilizes locally available power reserves which, since the battery device 208 has some level of available charge, has good potential as a power reserve. The embodiment of the invention shown here uses the multi-selector switch 184 to configure a circuit which detects the excessive load in the controllable regulator 264. In the alternative, the in-line current sensor 192 might also be activated to detect this situation. The raw data travels along a path which originates at line 274 as data from sensor 192, or the controllable regulator is configured as described in FIG. 10, as sharing the load schedule to power a device with a "dead" battery, then across the multi-selector switch 184. The specific location of this load detector is not critical, but it should be in a circuit which is capable of experiencing the entire current draw of the supplied device 206 as available from one of powerlines 202.

The detected load at the controllable regulator 264 is sent, online 258, to the A/D converter 260. As digital information, it is sent to supplied device 206, first along line 254, through the multi-selector switch 184, and directly to the supplied device 206. While the communication method employed here is powerline modulation, there are multiple ways to effect the transfer of data to the supplied device. Refer to FIG. 10 for an explanation of the various other types of wired and wireless communication links available.

From the supplied device 206, a command string is sent back to the controllable regulator 264 on data lines 204, 196, then to 256, where it adjusts the output voltage to powerlines 250 and 248.

The control of the voltage from controllable regulator 264 is important, because battery device 208 is to be brought into the power circuit as a parallel power source to the controllable regulator 264. The voltage of battery device is determined by configuring multi-selector switch 184 so that voltage sensor 272 can establish the correct voltage of the battery. A load is induced onto the battery's powerlines 200, by configuring multi-selector switch 184 so that power from battery 208 conducts along lines 200 into the switch, then power lines 194 and 198, and the pair labeled 202. Thus configured, battery 208 is directly powering supplied device 206 so that voltage sensor 282 can read the line voltage. The voltage reading is sent to the A/D converter 260 via lines 270 and 278 (switch 184 is thus reconfigured), and it is then looped to the supplied device 206 either by the same path previously described, i.e., lines 254, 196 and 204, or it is sent to another port for wired or wireless transmission to the supplied device.

The known battery voltage is then processed by software used by supplied device 206 and sent to controllable regulator 264, which matches battery device's 208 voltage. By matching the two voltages, both battery device 208 and controllable regulator 264 will be voltage matched. Actually, the voltage at the controllable regulator is always kept slightly higher than that of battery device 208. This is necessary to avoid contention, and to eliminate the need for a diode in lines 250 and 248. Diodes in these lines may possibly negate any opportunity to do powerline modulation, which is one of the optional data communications modes available with this invention. If powerline modulation isn't anticipated, diodes in lines 248 and 250 are appropriate, so that current from battery 208 cannot flow into lines 248 and 250.

The switch configuration shown here is established in multi-selector switch 184, so that the powerlines from both the controllable regulator 264 and the battery device 208 are operating in parallel. Supplied device 206 sees the voltage of whichever power source has the higher voltage, and the total wattage of both devices is roughly cumulative. A pair of diodes 252 is used to prevent current flow from regulator 264 into the battery, as a consequence of battery 208 operating at a voltage lower than that of controllable regulator 264.

The battery's line voltage is checked periodically at voltage sensor 280, and the controllable regulator is readjusted, if necessary. If the charge state of battery device 208 is not known, i.e., if the battery is anything less than fully charged, it is prudent to use the supplied device's internal clock to monitor the amount of time that the battery is being used for supplemental power. Not all battery chemistries behave predictably toward the end of their discharge cycle. A NiCad or NiMH pack can drop quickly in voltage as it reaches the end of the discharge curve. If the charge state of the battery device is unknown, this method of supplementing primary power from the battery pack should be approached with caution. The battery will simply drop out of the circuit when its voltage falls below the nominal voltage required to power supplied device 206.

More practical is to use this circuit to tap a large-capacity primary battery. This conceptually is similar to having a standby power reserve, akin to a UPS (Uninterruptible Power Supply). The difference is that, while a UPS is only brought online in a brown-out or total primary power supply failure, this device makes the battery power available at any time, even when the power supply is delivering power. This larger reserve battery can be located to service more than one controllable regulator.

The embodiment of the invention can be modified to work just like a UPS, by having the appropriate multi-selector switch, which has this direct-to-battery circuit available, default to the battery when the power signal from controllable regulator 264 is not present. This is essentially the configuration shown in FIG. 5, since the battery device 208 is the default connection through the multi-selector switch. When controllable regulator 264 is not delivering power, the multi-selector switch resets to the battery-throughput configuration. Thus, the battery device is always available to power the supplied device, just as if the embodiment of the invention were not present in the circuit. Only when the controllable regulator is detected as active, which is determined by the data telemetry just described, is multi-selector switch 184 "unlocked" and rendered reconfigurable.

The issue of voltage matching the battery to the supplied device is of paramount importance. If the circuit is used in a manner that makes it captive to a device, so that such a supplemental battery source can be pre-configured to match the operating voltage of the supplied device, then the supplemental battery source serves as a dedicated, device-specific UPS. An example of this is the add-on battery packs sold by AER Energy, or their equivalent The AER Energy supplemental battery pack is device specific, having been factory pre-configured to the appropriate voltage of a particular brand or model of laptop. This extended battery pack contains enough cells to afford eight or more hours of continuous laptop operation.

When a supplemental battery source such as the AER Energy extended pack is used, the embodiment of the invention is configured so that it is wired parallel in the same circuit with powerlines 200. Just as with the supplied device's 206 internal battery (battery device 208), the supplemental battery source has its own voltage and current sensors. These can be either internal to the battery housing, or as in-line sensors. The supplemental battery source can be connected to the circuit through any port which has a shared "double-size" multi-selector switch A controllable regulator 287 is used with the AER Energy battery pack, if the pack is configured to deliver 28 VDC. An advantage of that voltage is that controllable regulator 206 has a modality, as discussed in FIG. 10, where it is used on a commercial aircraft, and 28 VDC is an aircraft-standard cabin voltage. With the AER Energy battery delivering 28 volts, it is necessary to inter-connect a second controllable regulator 287, which is an equivalent of controllable regulator 264, and which can convert the AER Energy voltage into any required voltage below that.

Therefore, the supplemental battery source is merely an extension and duplication of the functions of all of the hardware and software described above. Except for added complexity in the multi-selector switch, there is no reason why even more than the two battery sources shown couldn't be extended out to almost any number of interconnected, parallel batteries on one switchable "battery bus," whereon any battery source, or grouping can be active at any given time. As long as diodes 252 are used to keep each device from allowing the power signal of a nearby power source from entering that battery, the number of supplemental batteries can be extended.

The following is an element-by-element description of the elements shown in FIG. 5.

(200). Powerlines from battery device ("dumb" battery).

(202). Powerlines to supplied device.

(204). Data line of supplied device. Only one line, but drawing shows data to and from the device.

(206). Supplied device contains memory, processor and microcontroller. The supplied device handles all control of components. The power supply is a passive or "dumb" device.

(208). Battery device is only capable of providing power. There are no data lines.

(106). Connector block.

(198). Powerline for supplied device.

(196). Data line between supplied device and controllable regulator.

(194). Powerline for supplied device.

(190 and 280). Sensor to detect voltage. Sensor does not have to be located in-line, but can be anywhere (including in the connector 106). The sensor acquires data and is shown here as available, but not in use. Instead, the output voltage is read at the controllable regulator 264. The voltage can be read anywhere that a bona fide reading is available within the entire circuit, including within the supplied device 206, within the battery device 208, etc. One care to be taken in establishing the voltage reference points is that the reading reflects the appropriate circuit required.

(192 and 282). Current sensor. This location is shown so that total load can be read at an appropriate point to show the dynamic load of the supplied device 206. This is not the only location at which an appropriate current reading can be acquired. However, the reading will not be valid anywhere on the controllable regulator 264 side of the multi-selector switch 184.

(184). Multi-selector switch Either a "double-size," which links two output ports together, or a single-gang switch, which has sufficient reconfigurable variants of the 10 connector pins.

(252). Diodes prevent current from flowing from the controllable regulator 264 into the battery device 208.

(248 and 250). Powerlines from the controllable regulator 264 to the multi-selector switch 184. If a charger circuit is present, there would be a second pair of powerlines.

(264). Controllable regulator.

(262). Input line to the current regulator 264 for data from the various voltage or current sensors 192, 190, 280 and 282. Shown here is voltage data from sensor 280, which passes along data line 272 and 278 as analog information, to the A/D converter 260, where it is digitally configured and passed along data line 262 to the controllable regulator. In one modality of the invention, this digital data can serve as the "sense" information the controllable regulator 264 responds to in order to properly set the correct output voltage along powerlines 248 and 250.

(260). Analog-to-Digital Converter (A/D converter). The device can be passive, and only make the reconfigured digital data output available to all ports, in a poll mode. Thus, the supplied device goes to the A/D converter to poll its information. The other mode is that the A/D converter has intelligence, and can recognize the device from which it is receiving information, and can then process it and reroute it to the appropriate devices or circuits. The first method is a pull mode, and the latter is a push mode.

(258). Analog data input line from the controllable regulator over which is sent voltage or current data gathered internally in the controllable regulator. This data is then converted to digital format, and sent to the supplied device 206, along data lines 254, 196 and 204.

(254). Data output line from the A/D converter 260, to the multi-selector switch 184. There can be multiple data in and out lines to the A/D converter and to the switch.

(278). Representative data path from one of the sensors 190, 192, 280, and 282, to the A/D converter 260.

(270, 272, 274 and 276). Data outputs from the four sensors 190, 192, 280 and 282.

(284). A device for reconfiguring the multi-selector switch 184 as a function of data passing along the lines. In an 8-bit register for example, a header is present specific to the multi-selector switch. As various data packets travel through the multi-selector switch, it intercepts those which have the correct header and, perhaps using a look-up table, the switch reconfigures itself. This device is not necessary to the proper operation of the switch.

(287). Second controllable regulator dedicated to second battery 290.

(290). Alternate battery source, configured to supply 28 VDC.

V. FIG. 5a

This block diagram is a simplified version of FIG. 5. Normally, the switch is always contacted to the controllable power supply. In situations where current loads reach defined limits, the situation warrants load sharing. The high-speed switch must be controlled as to the amount of time the switch is at the battery, and how long it is back at its original position at the power supply. A duty cycle controller, having been alerted by a current sense circuit, determines how long the switch is in either of the two positions, which dictates how much power is taken from the battery. Based on the load, as available from the current sense module, the wattage requirements are allocated to each of the two available sources of power. For example, if the power supply is rated at 25 watts, but the present load is 50 watts, then the duty cycle is 50%. If only 37.5 watts is needed to account for the deficit, the switch is connected to the primary power switch 66% of the time, and to the battery 34% of the time. The passive filter smoothes out the current ripples which result from the switch motion. The switch is designed to operate at a high enough frequency to reduce the size of the passive filter.

VI. FIG. 5b

The controllable power supply 745 has sufficient wattage to power two discrete supplied devices 705 and 741. The power supply is in a circuit which allows it to power one of two supplied devices 705 and 741. One of the two supplied devices is a laptop computer, while the other is an in-flight entertainment display screen and internal computer hardware (essentially a second laptop computer). The premise is that the passenger on an airplane will be either watching a movie on the supplied device 741, or working on a laptop (supplied device 705). The power management system delivers power to the "active" device, and switches the unused supplied device to standby power, i.e., battery. The circuit is designed to provide the following functions from the power supply:

1). The power supply 745 works to load share, providing that each supplied device 705 and 741 has some basic power-management software.

2). The power supply monitors the power consumption of each device, then responds to that information.

3). Either supplied device is safely powered from only one power supply, without risk of either being disabled, or of losing data.

4). The passenger can have virtually an immediate response from the power supply when the full functionality of an "asleep" device is needed (keyboard/mouse response).

5). Local batteries in each device off-load the minimal amount of power required to keep a device in suspend mode. The local internal battery brings the supplied device up to full functionality, and then switches from battery-supply to power-supply operation.

6). Software on only one supplied device is required for the power management system to work.

A. The Hardware

Supplied device 705 is a laptop computer on an airplane, while supplied device 741 is an embedded computer which serves as the display platform for personal in-flight movies. In the modality shown here, supplied device 705 is the "master" control unit, which can command controllable power supply 745, via microcontroller 747. The microcontroller also actuates the switch configurations, making sure that each supplied device is getting power from either power supply 745, or its own internal battery 719 or 735. A "smart" battery 719 is shown as available to supplied device 705, while supplied device 741 has a standard battery with no intelligence.

Supplied device 705 sends commands to the power supply, based on information obtained from sensor array 703. The data is specific to voltage at sensors S-1 through S-4, while the current sensors C-1 and C-2 are located on the power lines going to each battery. The I/O has been identified as PC Cards 707 and 739.

Connectors 713 and 737 are here as they have been described in FIGS. 1–4, but connector 713 has data lines which pass through the connector 713 and then into supplied device 705, via data lines 711. This enables the supplied device to monitor its battery reserves. The battery 735 attached to supplied device 741 is not essential to the operation of that unit, but is a true back-up battery. Supplied device 705 relies on its power management software, which is part of one modality of the invention, to monitor the status of its battery 719, and to direct controllable power supply, via data line 701 and microcontroller 747, to alter its power signal to match the supplied device's specified voltage. The software obtains the correct voltage from the battery 719.

As the master device in the circuit, supplied device 705 has access to all of the sensors, to observe both voltage and current loads to itself and to supplied device 741. By being able to eavesdrop on sensors S-3 and S-4, the laptop computer 705 is able to determine the operating voltage of the other supplied device. This is not important when device 741 is an embedded video display, since that voltage is known, but if supplied device 741 is another laptop computer, knowing its voltage is important. The significance of knowing the other device's voltage is that, by changing switch SW-1 to a three-way switch, power from battery 735 can flow to supplied device 705. Of course, battery 719 can also power supplied device 741, which gives extra safety to the power management system, and reinforces the power management capabilities of controllable power supply 745.

The current sensors C-1 and C-2 are used by supplied device 705 to determine whether the other supplied device 741 is operating under battery power, or relying on power supply 745. If current is flowing, the other supplied device is accessing the power supply (switch SW-5 is closed), but if there is no load on powerline 733, the device is running on battery power (confirmed by both voltage sensors S-3 and S-4 being active). By adding a charging circuit to controllable power supply 745, the manipulation of switches SW-1 and SW-4 enables charging to battery 735. The same holds true for switching the charge function to battery 719. Of course, only one battery can be actively charging at any time, and the power supply is not available for any other function during that process. Sensors 743 do not have to be of the in-line type but, instead, voltage/current readings can be polled directly from the controllable power supply (see the I-out line in the schematic as FIG. 11).

In use, the airline passenger is working on the laptop 705, but wishes to view a video on supplied device 741. The software on master unit 705 detects a lack of keyboard activity, or a saved file, or other indicators that the laptop may be about to become dormant. After a reasonable time of no keyboard activity, the power management software puts the laptop 705 into the battery circuit by disconnecting itself (using the microcontroller to actuate switch SW-1) from the power supply 745. It then, while fully powered by its own battery 719, commands the microcontroller to set switches SW-1 and SW-5 to deliver power from the controllable power supply 745 to supplied device 741.

The PC cards 707 and 739 are data acquisition devices, with internal A/D converters, as well as signal processors for communicating with microcontroller 747. In another modality, the microcontroller 747 is embedded directly into each PC card.

If the voltage required by device 741 is not known, supplied device 705 opens switch SW-1 and closes SW-4, thus forming a power circuit from battery 735 to supplied device 741. Once supplied device 741 is under battery power, supplied device 705 accesses the voltage information at sensor S-3 or S-4. The voltage of supplied device 741 is known to laptop 705 at this point, and it conveys that information to the controllable power supply 745, via microcontroller 747, then resets switches SW-1, SW-4 and SW-5 to allow the power to flow from the power supply to supplied device 741. Supplied device 705, having performed its control functions as the intelligence in the system, now puts itself into standby mode with its power management software, so that its current drain reduces to +/−500 mA. When the passenger has finished viewing the movie, it takes only a keystroke on laptop 705 to awaken it (still under battery power), at which time it resets all of the switches to restore power from power supply 745. Thus, a very simple yet effective power management and load sharing mode is achieved with minimal hardware and straightforward cabling.

The switching concept used in this modality of the power supply is illustrated in FIG. 5a, and the connectors 713 and 737 are detailed in FIGS. 1–4.

VII. FIG. 6

FIG. 6 represents several application variants of a power supply according to an embodiment of the present invention. They are all combined in one master drawing to illustrate how the various configurations interconnect and interrelate. In FIG. 6, because of the interactions between various devices, some of the wiring circuits have been simplified or eliminated for clarity.

This figure shows one power supply with more than one controllable power outlet. Each outlet can operate independently of any other, or simultaneously with any or all others. The devices labeled PD-1, PD-2, PD-3 and PD-4 are representative examples of devices that may or may not be connected to the power supply at any given time. For example, PD-4, can represent an in-flight video-on-demand system (essentially a self-contained embedded computer) on an aircraft; and PD-1 can be a passenger-supplied laptop computer. Both can be simultaneously powered, or there may be only one or the other. Thus, for one embodiment of the power supply, air passengers may use PD-1 (their own laptop computer) during part of the flight and later view a movie (through PD-4). Alternatively, passengers may do both activities simultaneously, viewing a movie (through PD-4) while editing a spreadsheet (on PD-1). Power supply PS delivers the appropriate and correct voltage to each supplied device, and there is sufficient wattage to operate all four simultaneously. In this example, bi-directional data could pass from PD-1, through the airborne embodiment of the power supply, into PD-4, to be used by PD-4 for an energy management function, then the data could come back to the power supply as a power reconfiguration command.

Starting at the lower right of the drawing, there are three forms of input power to the device. The 80–240 VAC may be encountered by any embodiment of the power supply (IN-1). IN-2 is a 28 VDC semi-hardwired installation, as would be deployed for a typical airborne power supply system. Note that an off-line DC/AC converter is shown as part of this circuit, for use in applications requiring AC power output. IN-3 typifies two inputs which would be available for a transportable embodiment of the power supply, utilizing an EmPower adapter input (or cigarette lighter adapter plug), or a set of external battery packs. The housing of the airborne power supply embodiment will have a standard two-wire tape recorder receptacle, to which will mate the appropriate plug-adapters for each of these configurations.

The power input connection has a controllable switch, so that the input voltage can be sent to one of the two power converter modules. A determination of the input voltage is achieved via a tap off the incoming line, shown here as IV. This line runs to what is labeled as a Sensor Array (SA), where the input voltage is read, so that a controller command can be issued along line CO, which closes the controllable switch in the main input line, thus sending the primary input voltage to the correct converter. The command to configure the input power switch is issued by device PD-4, based on information received from data line IV, which is collected in the sensor array SA, then sent to the I/O port IO. That data gets transmitted to PD-4 by hardwired cables, or wirelessly. The virtual VOM M in PD-4 does an A/D conversion on the input line voltage, then sends back the command along CO to configure the main input switch. The AC/DC converter is wired directly to the DC/DC unit, so that the Variable DC Output module provides all power output of the unit. Operating the power as a 28 VDC voltage regulator is important. Were this circuit to be on a commercial airliner, the choice of 28 VDC input would have significant benefits. Such multi-output power supplies on aircraft are specifically for passengers to power their laptop computers. Since laptop computers require a power signal anywhere from 10–24 VDC, stepping down from a 28-volt source makes for good power efficiency.

A. Determining DC Voltage Outputs

The proper DC output voltage is determined by a processor-enabled source. This can be any or all of the Powered Devices (PD-1, PD-2, PD-3, or PD-4). In the airborne embodiment of the power supply PS, there is no onboard processing power, merely controllable switches and collectors in the power supply. Thus, PD-1's internal software/firmware drives the voltage settings of the controllable power supply PS, except that the power output 3 to PD-2, which has a selectable (not fully variable and controllable). The voltage level for PD-2, which is shown, for example, to be an in-flight phone, is set from a remote source, here indicated as the diagnostics port (B). In the example of an airborne application shown, the voltage setting for PD-2 is constant until a technician sets a new one.

PD-3 can be any of a wide range of peripheral equipment which may be used by the laptop owner, for example a printer or scanner, but this fully controllable port capable of delivering any voltage from 0–24 VDC can also power a handheld audio CD-player, cellular phone, personal video game player, etc. There are two ways in which the correct voltage can be established. The proper voltage setting can be manually input on the laptop/notebook by the passenger. Alternatively, the voltage may be slowly ramped up until the PD-3 turns on and the current (sensed through connector 3 as current load CL3) stops increasing (i.e., PD-3 stops drawing additional current in response to increasing voltage). The latter method is reliable, but not always convenient, since most portable printers, hand scanners, etc., are not "auto-on" when the correct voltage threshold is achieved. The end user has to hold down the ON button for a certain period of time, while the power supply PS finds and locks on to the correct voltage.

In the airborne embodiment of the power supply, PD-4 is shown as the TNCI A/V (Audio/Video) computer. However, PD-4 could be, in a desktop embodiment of the power supply, on a board within the power supply. For example, the screen could be an LCD and the processor a PIC. There may or may not be data storage, energy management, or other technologies, depending on the requirements of that device within the current expectations of the marketplace.

B. Power an Data Switches

The adjusted DC output voltage goes to a switch, shown as "Power Out" in the lower left corner of the power unit. The DC output is there switched to any combination of PD-1 (e.g., a laptop), PD-2 (e.g., an in-flight telephone), PD-3 (e.g., a peripheral device), and PD-4 (e.g., a video display computer console). While the switch is illustrated as a simple, two-pole switch to simplify the drawing, it is actually a multi-pole switch.

In a desktop embodiment of the power supply, the connectors 1–4 shown exist as receptacles on the power supply. In the airborne embodiment of the power supply, the connectors 1–4 are shown only to illustrate how the power circuits to each powered device and the power switches interrelate.

The four connectors 1–4 may, for example, represent 5 mm pin/barrel connectors. These connectors deliver power, but also have a probe to read current (not shown). The power for PD-1 passes through connector 1. The probe for reading current levels from connector 1 goes to the second switch, and the current load level information passes along the data line (DL) to the sensor army. The sensor array directs the current load level information to the 110 connector (upper right) and into PD-4 via the virtual VOM (M). The four connectors 1–4 can also be hard-wired and the power/data cable to PD-1 can be embedded in a food service tray at the passenger's seat, where a retractor reel stores it until needed.

Data may also pass through connector 1 to other powered devices. For example, a communications link between PD-1 and PD-4 may be established by modulating the power signals sent to each device. The squared sine wave indicates power lines which also carry data. Such data is not a simple voltage or current reading, but control data command strings, informational data to display on a screen, etc. Such information as command sequences, short text strings, etc., are well suited for powerline modulation.

For such desktop applications, there are other, more readily available methods of communication among powered devices and the power supply (such as IR, acoustics, and straight-through data lines) and, thus, modulated powerlines are not essential. However, data carried by power lines may be used, for example, to reduce the total number of wire runs throughout the system.

Connector 3 is not available in the desktop embodiment of the power supply. For the airborne embodiment of the power supply, connector 3 represents a hardwired connection to an in-flight phone system and runs to the under seat power box for the phone. It has a variable DC voltage output to allow for variants in the phones, and it is configurable via the diagnostics port's RJ-45 connector illustrated at the top of the power supply. When PD-4 is a logic board within the airborne embodiment of the power supply, there is also a set of data conductors from the phone to PD-4. The data link to the in-flight phone plays an important part in the eventual data network that will tie all of the discrete technologies, such as the phone system, video system, and power system. The phones afford the airlines an opportunity to capitalize on the in-seat mobile computing power availability. If the power system is linked with the phones, then a passenger can swipe a credit card and rent the power for his/her laptop. Also, the phones play a vital communications role at a different level for the passenger. A direct link to the phone network on the plane gives passengers easy access to faxing, e-mail, etc. It makes sound business sense to link the in-seat video display terminal to this small data network. Movie viewers can swipe their credit card on the phone to pay for a movie, or to get chits for video gambling, etc. Because airlines are dependent on the profits from transactional activities on the plane, providing a wired connection to all devices which are a revenue stream makes the process more streamlined.

Connector 4 is, for example, a remote embedded connector in a location convenient to the passenger. The connector might be mounted, for example in an accessible location on the video display cabinet. The passenger can plug in a peripheral, such as a printer, and have voltage configuration available, as previously discussed.

C. Power Management

Each of connectors 1–4 has "Current Load In" detection and monitoring capabilities. The data gathered from these four ports, as well as the RJ-45 which connects the PD-1's battery, is fed to the Energy Management (EM) software in PD-4 (the same energy management is available in the PD-1, if it is a laptop). The energy management software has three characteristic functions:

1) Internal power management within the power supply, in either the airborne or desktop embodiment. Because there are four power outputs, all of which can be varied in output voltage to some degree, and each of which can have significantly varied power loads depending on the various devices attached at any given time, the power management subsystem mediates the load schedule, monitors current load parameters, and controls the various ports and the output power of the converter(s). Power management is dealt with more extensively throughout this document, and especially the description of FIG. 5.

2) The data from the various internal sensors (discussed below), which report back temperature (via thermistors or board-mounted components which support temperature data access), internal voltages and current drain at predetermined spots around the circuit board, are used to configure the overall power module for optimum performance. Even though the power supply PS is rated at a very high efficiency, heat will still occur as a byproduct of the voltage conversion process. Detecting heat is a key safety issue, especially aboard an aircraft with a sealed cabin full of passengers. The thermistor also plays a role in power management, as the supplied device monitors the thermal behavior of the power supply, looking for signs that components are overheating, or that the entire unit is running inefficiently. Since the power supply can't be optimized in the "sweet spot" on a known voltage curve where power conversion efficiencies will peak, it is very possible that the power supply will have to operate many times at a voltage which compromises its efficiency. Having thermal detection and protection circuits seem essential to a variable output power supply.

3) This is a power supply which, because of its ability to communicate to other devices, and vice versa, can actually impact its MTBF (Mean Time Between Failures). Since there are already sufficient diagnostics tools in the power supply PS, as well as in devices around it, especially PD-4, the power system can be optimized for thermal efficiency, voltage efficiency, etc. Part of the solution to achieving some corrective actions in response to detected possible malfunctions lies in the load-sharing model discussed in FIGS. 5, 5a, and 5b. By using a local battery as a reserve power source, and sharing the load schedule with that battery and others, the power supply PS can work at moderate performance levels, and let the battery sources take up the slack.

Power management resides, for the most part, as software on attached devices (PD 1–4). These power controlling functions are, for example, the generic multi-state power reduction implementations commonly found in today's laptop computers. Various sleep states, "On Now," and hardware-level power controls are implemented to assure that the airborne embodiment of the power supply PS is not delivering wasted energy to devices that are not in use or can be temporarily put into low-power state.

In an airborne embodiment of the power supply, network-wide power management is intended to arbitrate power throughout the entire power grid. For example, if there are three power supplies in each three-across passenger seat configuration on an airplane, those units are linked together electrically and electronically. In a such a model of distributed power management, each device communicates with the two others. Each addressable power supply polls the others in what can be, on an aircraft, a three-seat network cluster, to ascertain each of their total power load schedules. If one unit is not in use, each of the other two airborne power supply modules PS in FIG. 6 can reallocate that power and share it, as needed. This may be necessary if the internal sensors in one unit indicate overheating, or a near capacity power load. See load sharing as it relates to FIGS. 5, 5a and 5b.

By extending this power grid model across the entire architecture of the installation, the entire network of modules can interact to bring energy savings to the overall installation. This may be very important if some or all of the individual power zones (clusters in the network) are drawing power from either central batteries, or local battery packs. If a generator is at the head end of the power grid, which it always is on an airplane, for example, it may be important to prevent other power-hungry sub-systems (Audio/Video, telephony, lights, etc.) from directly drawing their power from the airborne embodiment of the power supply, to create a system overload. Even if the total capacity of the head-end generator may not be reached (which is not the case, since Boeing is already, in November, 1997, discussing initiatives to reduce the load schedule to the aircraft's generators. A power management scheme may be useful to reduce fuel consumption, as a direct byproduct of energy conservation and efficiency.

D. RJ-45s

In the following discussions of connectors and interfaces, the power supply PS in FIG. 6 is referenced in two modalities, an embedded power system, for example on an airplane, as well as a desktop power module, which is tethered on a cord and transportable, as an example of the AC/DC wall adapter always supplied by the electronic equipment manufacturer. These conventions do not limit the expressions and manifestations the power supply can take. For example, the power module can be a car adapter, special aviation-based module for passenger use, etc. Given the overlapping features shared by both an aviation and desktop version of the power supply PS in FIG. 6, integrating the desktop features with those of the "transportation"-style module would be the best mode for this modality of the power supply.

Another type of connector used in power supply PS in FIG. 6, for example, is a standard RJ-45 phone jack. This 6-conductor receptacle may be used for both power and data, via the appropriate controlled switch (i.e., a multiplexer, not shown). In the example illustrated, the RJ-45 in the lower left corner of the power module has both power and data uses. The input labeled VD is the voltage from a battery within PD-1. A virtual Volt Ohm Meter (M), for example, within PD-4 reads VD as a straightforward voltage value. PD-4 translates this voltage value into a control command that is sent back to the power supply as a command to set its Variable DC output to match the battery's voltage (the voltage value could also have been translated by the laptop PD-1 if it were the master of computing power in a particular application).

The other line coming from the battery is for Smart Battery Data (SBD). The data across this line is comprised of the various battery monitoring readings, such as temperature, nominal voltage, remaining charge capacity, number charge/discharge cycles, manufacture date, etc. (the type of data available varies by battery). This information is available through the RJ-45 port, and almost all smart batteries use two (Dallas 1-wire) or three conductors at the connector for this data. As explained below, because the battery is essentially "off-line" in the airborne embodiment of the power supply, so that it cannot be charged, there is only a limited need for the data from the battery pack (except for the initial battery voltage reading).

A universal battery connector, designated as (UN), is an interface which not only allows data and power to pass between the laptop (PD-1) and the power supply, but it also insulates the battery contacts and redirects the battery data stream to the power supply, instead of to PD-1. Thus, there is a Y-connector created, with which the power supply can control, communicate or power each of these devices separately. Such a universal battery connector is fully described in FIGS. 1–4. Thus, the universal battery connector is described in this section merely to identify its utility as a tri-directional interface. Adjacent to connector 4 is another connector (e.g., a second RJ-45 connector). As previously described, a technician may perform system diagnostics via this access port. Alternatively, the 6-pin connector can be permanently connected to PD-4. FIGS. 7, 8, and 9 show various modalities of this connector's usefulness. This is particularly useful when PD-4 is a logic board within a desktop embodiment of the power supply. In such a desktop embodiment, the permanent diagnostics loop can serve not only for diagnostics, but as a conduit for performing firmware upgrades to the PIC and memory on PD-4. A shunt is shown as T-connection near the (B) label on the drawing, indicating that the diagnostics loop can be accessed to attach external test or monitoring equipment. This is also shown as assembly 542 in FIG. 8.

This RJ-45 port can also be used, in the desktop embodiment of the power supply, as a connector into which a standard phone cable can be inserted (A) and shown also in FIG. 9 as assembly 532. Using the desktop embodiment's internal voltage sensing capabilities, accurate information about the incoming phone line voltage is determined. This information is sent to the logic board, where it is compared to a software/firmware list of PC card fax modem voltage tolerances. If the detected voltage exceeds the nominal specs of the PCMCIA fax/modem card, a red LED illuminates, showing an unsafe phone line for modem use. If the voltage is within the correct range, the green LED lights up. This use of an RJ-45 connector is unique in a power supply, in that the connector is used to sense incoming voltages, transfer data, and can also conduct power out.

E. The Data I/O Port

The I/O port at the upper right of the power module can either be hardwired, as in an airborne embodiment of the power supply, or removable via a remote in-line connector, so that it can be serviced without disrupting the PD-4 device. In the desktop embodiment of the power supply, this is a fixed port, installed in the plastic housing. Such a data I/O port could be, for example, a DB-9 or DB-15 connector.

In the DB-9 or -15 size and configuration, the port would have shared capabilities. By using a combination connector like those manufactured by Positronic Industries, both power and signal lines are integrated into a compact form factor. By having power lines available at this port, connector 2, which is shown as the primary power port for powered device PD-4, can be eliminated so that power and data to PD-4 can be integrated into one cable run. The same is true for connector 1, and the adjacent RJ-45, since the Positronic connector can be configured with nine (or more) data lines, and three (or more) power contacts.

F. The PD-4 Data Lines

The data passed through the I/O connector is of several types:
   Information from the Sensor Array (SA), which is comprised of current-load-in readings from each powered device that is active.
   Information from the sensor array (SA) directly related to the operation of the power supply PS. This data comes from internal sensors and probes, which monitor temperature, voltages and current loads at strategic locations. This data is also available at the RJ-45 port located next to connector 4, which is an access point for remote diagnostics.
   Data which passes through the power supply from various devices, such as the voltage of PD-1's battery pack, or the voltage type and level at the power input connector, e.g., 110 VAC wall power, or 28 VDC from various sources.
   Statistical data is sent to PD-4 (it can also be sent to PD-1 or any other device capable of interpreting the data) as raw output. The Sensor Array is a schematic representation of a group of sensors or devices which may or may not be discrete devices. The drawing only illustrates conceptually the idea that all internal sensor-related data, as well as external current-load data, are centrally collected, but no processing or data manipulation is implied. Conceptually, the power supply, whether it be a corded desktop model or an embedded power source, should be as "dumb" as possible, without compromising functionality. This makes the unit cost effective, and also avoids the pitfalls of having to do hardware upgrades . . . something to be avoided with the embedded model. Since there is always a device, often the supplied device (for example PD-1 or PD-4) which has extensive processing power, there is no need to build parallel technology into the power supply. The power supply is very much a slave device, only making information about its internal circuitry and current activities available when polled, and accepting orders to reconfigure itself, as directed from the more dominant devices around it. Software on the supplied devices is an important part of this system architecture, and it is definitely easier to upgrade software than hardware.

G. The Virtual VOM & M/D

The sensor data is processed by a "virtual" volt-ohm meter. This is a software-based device, which uses some or all existing hardware on the laptop PD-1 or comparable device, to interpret the data. The virtual VOM may also reside on a separate circuit board, which may be enclosed in a PC card, as a data acquisition tool, or as a module embedded into the system's wiring (as indicated in FIG. 13).

The concept of the virtual device is also expressed in the virtual software modulator/demodulator (M/D), in use as a software modem. This device is available from PCTel, but not as a freestanding MID. Instead, it is part of a chip set which forms the hardware required for PCTel's software modem. To achieve a fully capable modem, the majority of the virtual modem's functions are implemented in software, which relies on the CPU to emulate hardware.

H. The PC Card

All processing and communications power preferably resides outside the power board in the power supply. These functions may exist in hardware- or software-implemented "virtual devices." Reliance on software-implemented "virtual devices" will minimize component counts, but some hardware devices are desirable. The desktop embodiment of the power supply must have all hardware contained within its housing, of course, but that does not preclude relying on software solutions whenever possible. For the airborne embodiment of the power supply and the desktop version, the processing power may be located in a number of devices, including PD-1 and PD-4.

Part of the solution is to use the PC Card (previously called a PCMCIA Card) as the platform into which is integrated the various remote hardware. An optimized PC Card, which contains all necessary hardware, would include:

1) The modulator/demodulator (M/D). By using a standard ½-card fax modem board, two benefits are achieved. The MID is available for powerline modulation, but also there is a full-blown fax/modem for the end user.

2) An embedded IR port (F3). The diode will be in a dongle, so that it can be oriented toward the transceiver, but the hardware will be within a Type III (15 mm thick) card.

3) An acoustical transceiver (F3). Related to the modem (actually, quite similar technology), the acoustical method of local wireless communications is not appropriate for complex activities, but has good potential for short-distance control and command functions, as well as sending and receiving nibbles of data (voltage, current loads, sensor data, etc.)

4) The battery emulator (BE). Developed by David Simm, this hardware/software creates a virtual surrogate battery, which looks to other hardware and software throughout the system as if a real battery pack were present. This is a helpful tool for defeating laptop battery charging while in flight. It also presents a graphical user interface so that the end user can easily obtain power-related information. The battery emulator serves several functions related to power management, as well.

The PC Card is an essential device, in that it opens up a convenient module into which multiple technologies can be integrated, especially multiple communications and data acquisition technologies, and affords a convenient package which can be easily upgraded (via flash chips), or replaced by low-level technicians. Including such a PC Card in the power supply avoids costly redesigns of internal boards. The desktop embodiment of the power supply preferably has a plastic housing designed to store this card, and the storage cavity can be wired so that it is active. Thus, the end user can merely swap out various PC Cards to get various feature sets, and/or upgrades.

I. Internal Safety Features

The airborne embodiment of the power supply includes numerous safety and reliability devices. Fusible links and various methods of preventing shorts (perhaps even GFI devices), will be integrated into the circuitry. Because of the limited power resources on commercial aircraft the ability to detect a failing power supply unit, or bypassing one or more malfunctioning power supply units in the power grid, is a key element in the overall power management scheme.

An auto-reset and other self-recovery methods are employed to ensure reliable performance. Because it is impossible to determine if the end user attaches a device which causes voltage or power demands in excess of the specs (e.g., a laptop voltage rated above 24 VDC, or a peripheral which draws more current than the available capacity), there are sufficient fault-tolerant technologies employed to prevent damage to circuits or components. The software which controls the battery emulator and energy management subsystems will notify the user of an unacceptable device or configuration.

The design parameters and performance specs also will include conformance to the various ARINC specifications for in-flight power, EMI and RF radiation, thermal stability, and shock/impact capabilities.

VIII. FIG. 10

FIG. 10 is a more detailed schematic illustration of the system shown in FIGS. 1–4 illustrating a power supply 64 module according to the present invention shown along with a universal connector 42, a battery device 43, and a supplied device 54. While supplied device 54 is shown to include a microprocessor 56, memory 57, and data storage 55, supplied device 54 need not include such components as discussed more fully below.

The power supply module 64 is compatible with any readily available AC or DC primary power input. Power converter 1 is an AC/DC converter, and power converter 2 is a variable-input-voltage DC/DC converter. For example, the power supply module supports, but is not limited to, the commonly available "universal" 80–240 VAC (European specification), as well as 28 VDC (commonly used on commercial aircraft) and 12 VDC (automotive). For this degree of universality, two converters 1 and 2 are required. Power converter 1 preferably accepts a standard 80–240 VAC input and converts it to a 28 VDC output across conductors 5. Power converter 2 preferably accepts a range of DC input voltages from 5–30 VDC, but as noted above, two of the common DC input voltages referenced here are 28

VDC and 12 VDC. Converters 1 and 2 are represented in FIG. 10 within converter module 7 which, along with power supply 26, can be built into one power supply module. An individually detachable module containing power converters 1 and 2 makes power supply 26 more versatile. Any DC output from power source 1 is acceptable for the functionality of power supply 26, and any DC input to power source 2 is also acceptable. As another example, power converters 1 and 2, when equipped with the appropriate input-side connectors 65 and 66 (e.g., for a standard car cigarette lighter receptacle, or one or more of the two proprietary connectors used by the EmPower (Primex Aerospace, Redmond, Wash.) in-flight power delivery system for commercial aircraft), render power supply module 64 compatible with common automotive and aircraft power systems. The EmPower system makes 15 VDC available to the passenger, via several power receptacles embedded in the passenger seat, but the aircraft's power bus is 28 VDC (or, alternately, 115 VAC @400 Hz).

Power supply module 64 may not require either converter 1 or 2 when the input power has known characteristics and, thus, only power supply 26 would be required. For example, when permanently embedded within a commercial aircraft, where a commonly available power is 28 VDC, power supply 26 could be designed to accept such input, without the power conversion performed by converter module 7. Such a design would be lightweight and compact and thus enable power supply 26 to fit unobtrusively under the passenger seat or in the seat's armrest console. With an appropriate connector interface, such as the 9-pin "quasi-DIN" connector being considered as an ARINC approved power and data interface to passenger-supplied electronic equipment, power supply 26 in FIG. 10 can utilize its data and power functions, to provide passengers with both power and data access to embedded devices throughout the aircraft, such as phones, video-on demand systems, live TV, etc. Such multi-mode functionality is not limited to having power supply 26 embedded in the passenger's seat area, and power supply 26 can still offer these same capabilities if it is a passenger-provided unit, which plugs into a non-regulated port at the seat.

Thus, in FIG. 1, power supply 2 detects and reads battery 5's voltage (either as data, if battery 5 is data enabled, or as direct voltage being conducted from battery 5 along conductor 6, to conductive surface 9 of connector 8, then along powerline 4 to power supply 2). If power supply 2 is taking direct voltage readings of battery 5, as just described, an A/D converter may be present in power supply 2 to translate this raw voltage into digital information. However, power supply 2 can use the battery voltage as direct analog input, should power supply 2 be of a design compatible with the schematic in FIG. 10. The sense line 80 in conjunction with sensor array 81 can accept analog voltage, which it uses as a voltage reference comparator to adjust the power supply's output voltage.

When an airline trip is required, where saving space and weight is most critical (and assuming that there is direct access to the aircraft's 28 VDC power), a user may leave the converter module behind to minimize the size and weight of power supply module 64. However, a user may elect also to carry a converter module 7 because power conversion may be otherwise needed. The rental car will also have a 12 VDC cigarette lighter adapter for which optional power source module 2 was designed. Being detachable, both converters which comprise converter module 7 can be checked as luggage, instead of carried aboard the aircraft, thus affording travel comfort and convenience.

When used in the office, at home, carried aboard a commercial airliner by a passenger, or plugged into a car's lighter receptacle, the two-converter module 7 provides superior flexibility. For example, either of the two power source converters 1 or 2 may be attached as separate modules that snap onto the housing of power supply 26. The user can decide which type of multi-use module to install (or carry, when using power supply 26 with portable equipment), thus saving weight and bulk. For use in a car, a small 15 VDC power converter 2 would provide a compact and easily transportable package which fits in a briefcase.

A. Battery 43

1) Smart Battery

Battery device 43 shown in FIG. 10 is a sensor-equipped battery pack which typically has a thermistor array, voltage and current monitoring capabilities 48, and some memory 50 comprised of EPROM, or the equivalent. There may also be a DSP 51, but that is not critical to the way the battery reports data. These "smart" batteries are what is generically described in this application, but not all these features need be available for a power supply module according to the present invention to operate.

2) Dumb Battery

Moreover, battery 43 need not have all these "smart" capabilities inside the battery housing. For example, a lead-acid car battery usually is a passive series of cells, with no built-in intelligence (although a few manufacturers have embedded basic battery testing technology, such as the familiar "green eye" fuel gauge indicator). However, motor vehicles do have external monitoring sensors and display meters which either directly or indirectly show data-specific information. Uninterruptible power supplies, such as the APC (American Power Conversion, West Kingston, R.I.) "smart" series units, also have externally-mounted data acquisition hardware which polls the cell packs in order to provide useful information.

In order to operate, a power supply module according to the present invention only requires appropriate software and firmware to make the module compliant with any "smart" battery device which gets its intelligence from external sources to the battery pack itself Examples such as cellular phone batteries, camcorders, and any generic battery power source are compatible with a power supply module according to the present invention.

Even the previously cited examples of "dumb" batteries, which have virtually no data-specific feedback, provide valuable information to a power supply module according to the present invention. When interfacing with a non-smart battery, a power supply module according to the present invention uses the voltage supplied by the battery as the proper input voltage to the battery's host device. As noted, with the Y-connector (with conductors 76 and 71, and 74 and 69 as T-connectors) configuration of connector 42 shown in FIG. 10, a power supply module according to the present invention can charge a battery pack while it delivers power to a supplied device. Except for L-Ion batteries which use voltage-driven charging, a battery charging circuit is required. Any of the large number of "universal" battery charging hardware can be used, such as that available from Nesco (Van Nuys, Calif.), or those sold by Radio Shack. Such a commercially available battery charger 92 could be interposed, for example, in circuit path 88 and 90 of power supply 26.

Most battery-powered supplied devices like 54 in FIG. 10, which require rechargeable cells provide an internal, or external battery charger. A power supply module according to the present invention, using connector 42, makes the internal charger of a supplied device more useful because a spare external battery pack can be charging at conductors 68 and 72 while supplied device 26 or 64 is recharging an internal battery pack, even while supplied device 54 is in use.

Also, those batteries which have no internal sensors or monitoring capabilities can use the inherent "intelligence" of a power supply module according to the present invention to perform some of those same tasks. While temperature sensing is not possible, except by mounting external thermistors to the battery housing, a power supply module according to the present invention can do many of the maintenance and data acquisition features of a "smart" battery. For example, the power supply module can monitor the number of charge/discharge cycles, assuming that there is only one battery pack available for the host device. It can also track the amount of time a battery is in use, and correlate that to the power load of the host device (by sampling the number of watts used during the supplied device's time of operation), and thus provide a reasonable battery "fuel gauge." If there is an appropriate communications link to the host device, as provided in FIG. 10 by the connector 42's conductors 69, 70, 71, 74, 75, and 76, the power supply module can warn the end user of a battery pack which has reached a dangerously low state of charge. Since the power supply module 26 or 64 can, by the use of its multi-selector switch 33, immediately disengage a defective battery pack, the power supply module can protect supplied device 54 from a shorted battery pack.

B. Supplied Device 54

The supplied device 54, reduced to its most minimal specification, need only be a "powerable" device, i.e., any electrical or electronic device which requires AC or DC power to operate. It can be a light bulb (AC or DC), an electric razor (rechargeable or not), a tape recorder with non-rechargeable primary batteries, a cellular phone, or a computer (desktop, laptop, hand-held, et al.), etc. All of these example devices can be successfully powered by a modality of the universal, intelligent power supply. If the purpose of the power supply is to deliver an appropriate power signal to a supplied device so that the supplied device can perform the work for which it was designed, then the modality of the power supply 26 shown in FIG. 10 is more complex than necessary. The most elemental expression of the supplied device is shown in FIGS. 1, 2 and 3.

Having said that, the supplied device 54 shown in FIG. 10 can be any device which has a minimal DSP. The microprocessor 56 shown in supplied device 54 can vary in performance along a range from a basic PROM (read/write preferred, but not mandatory) to a microcontroller, RISC and even multiple CISC processors. Microprocessor 32 in power supply 26 should be powerful enough to perform all functions internally. The only performance gains achieved by a more powerful processor in the supplied device involve performing more advanced inter-device communications, since the only function required of supplied device 54 in its most elemental modality is to receive, process and retransmit a voltage parameter. An early prototype of a power supply according to the present invention included an eight-bit PIC processor, but any Motorola 68xx or an 8088, for example, is more than powerful enough to achieve all the functions including operation of advanced communications links such as infrared. Were one to build a power supply module 26 or 64 to a specification which calls for a processor-intensive HSP "virtual" software modem, the equivalent of an Intel x86 would likely yield modem performance at only around 2400–9600 baud. However, such low transmission rates are certainly acceptable for the types of inter-device communications required. Thus, the selection of the appropriate processor is best driven by final performance and functionality.

1) Benistor-Based Power Supply

The Benistor, an example of which is disclosed in U.S. Pat. No. 5,598,093 to Benjamin Acatrinei (28 Jan. 1997) which is incorporated herein by reference, is a controllable electron valve which can separate voltage and current in a single power signal and, to a limited extent, render control of both voltage and current as independent outputs in a new power signal. By incorporating a Benistor in a controllable power supply according to the present invention along with software resident anywhere in the configuration typified by FIG. 10, the voltage and current of the power signal can be manipulated independently. This flexibility in handling voltage and current as separate controllable outputs on the same power line makes power supply 26 or 64 in FIG. 10 an elegant charger for any type of known battery chemistry. Such a power supply can be reconfigured "on-the-fly" to respond with voltage or current characteristics independently.

Prior to the Benistor, the power supply could, as previously noted, function as an effective voltage-based charger, but limited to battery chemistries such as L-Ion which require voltage control (rather than current demand) for efficient charging. L-Ion cell packs do respond to current when "cell balancing" is used to optimize the MTTF of an L-Ion battery pack. The Benistor, in conjunction with the control features of a power supply, defines an efficient method of implementing an uncomplicated, easily manipulated cell-balanced charger.

For other cell chemistries which respond to a current signal, such as NiCad, NiMH, alkaline, zinc chloride and zinc oxide, the power supply can exploit the potentials of the Benistor by switching and manipulating voltage and current during a charge cycle as independent outputs in one power signal.

In particular, the controllable power supply discussed here, when configured as a battery charger which incorporates a Benistor, charges current-based batteries more efficiently, as it lowers voltage, yet holds a high current output or, in the obverse, increases voltage while restricting the available current in the power signal.

The ability to modulate power to the battery during charge as two variables is best expressed by a combination of the Benistor and a controllable, universal power supply. Without the precise control afforded by the power supply, the Benistor's pragmatic applicability is impossible. Furthermore, the bi-directional data communication available between a data-enabled battery and a controllable power supply yields verification of the effects of manipulating voltage and/or current to a battery being charged. Without this data loop, which extends to processors available in the power supply and the supplied device, the observable effects of manipulating current and voltage would be undetectable. For the Benistor's behavior to be fully implemented, feedback from the battery to the power supply is essential and, then controlling the Benistor based on such data (including look-up tables), renders the Benistor functional. Only by integrating the Benistor into such a data-looped controllable power system can the device function in one of its modalities as a universal battery charger.

C. Combination of Data Storage and Memory

Data storage and memory can be combined, if the available microprocessor is a simple PIC or EPROM. If the DSP is a PROM, the memory/storage can be some variant of flash (either volatile or non-volatile) memory. If an embodiment of a power supply module according to the present invention which uses a PC card is built, as shown as PC Card 512 in FIGS. 7, 8, and 9, the card itself can have built in memory, an enhanced processor, and its own EPROM. By distributing the processing power and intelligence to the supplied device side, there is a considerable gain in flexibility and robustness of the entire power supply module. Furthermore, data links can be of the more advanced types, such as ATA, acoustics (including an HSP "virtual" software modem), and IR.

D. Converters 1 and 2

The interface connectors of converter module 7 and power supply 26 at the terminations of powerlines 3, 4, 8 and 9 may be standardized on the female receptacle connector used on a readily-available "tape recorder power cord." The pinned male counterpart is embedded at the terminations of powerlines 5 and 6 in converter module 7. Of course, other connectors are possible, but these connectors are sturdy and snug-fitting, and thus also serve as secure and durable mechanical attachments when converter module 7 is joined to power supply 26. This allows one "universal" cord to service all the device's configurations. For various applications in which power supply 26 is permanently installed in an existing power system (e.g., a passenger aircraft where it would likely be hard-wired to the aircraft's power system and installed below a cabin seat, or in an armrest), these connectors would not be installed.

Converters 1 and 2 can co-exist as shared power sources for device 26 and can be connected and powered concurrently. Both power converters 1 and 2 are current-limited devices, and their output voltages are regulated to voltage-output tolerances which exceed the load regulation of the next voltage regulator 17 in the circuit. For example, if the load regulation of regulator 17 is 5% tolerance, and converters 1 and 2 are specified at 7%, the looser tolerances in converters 1 and 2 allow either converter 1 or 2 to operate with a 2% tolerance for error. Thus, both converters 1 and 2 can move upward or downward in output voltage as the current demand increases. Thus, converters 1 and 2 are optimized to respond with good sensitivity to any voltage changes in the other converter.

In a hypothetical load sharing model, for example, converter 1 has a voltage output slightly higher than that of converter 2. Converter 1 drives power supply 26 as the dominant, or master converter, because of its higher voltage. As the load increases in power supply 26, converter 1 responds with a slight (i.e., 2%) drop in voltage. Converter 2, which is parallel wired with converter 1 into power supply 26, now has the higher voltage output, so it assumes the master role and is doing the majority of the work, until its voltage, as a consequences of a rise in current, also drops down below that of device 1, and device 1 becomes active again and dominates the power delivery. This concept is analogous to what happens in a battery pack which has mismatched cells. The stronger cell takes the brunt of the load, until it equals the weaker cell's voltage, then both cells try to share the load, one cell alternately delivering slightly more power than the other, as they each exhibit more or less voltage than the other.

Polystor (Dublin, Calif.) has developed a carbon-based battery cell which functions as a capacitor. The Aerogel capacitor (U.S. Pat. No. 5,260,855, 9 Nov. 1993) behaves as a static-electricity conductor, with no chemical reactions. These capacitors deliver a claimed 20× the energy of electrolytic capacitors, and have 10× the power of high-density batteries. Aerogel cells are manufactured in common battery sizes, so that they can be built into packs, and can be placed in a circuit in parallel with standard batteries to create hybrid packs. These capacitors have lower resistance than supercapacitors, which is a benefit in the application being described here. This shared-load application between a power supply and a battery-based power reserve is greatly enhanced by the Polystor technology, which provides the long run time of a battery pack, with the quick response and high current loads characteristic of a capacitor.

Another way of making both power sources 1 and 2 share the current load is to put them on a bus, which uses analog signals based on the level of current being drawn by power supply 26, to control each converter 1 or 2. This requires a microcontroller and a data bus linking the two converters, and is somewhat more complex than is necessary for a simple, easy-to-build and inexpensive device like power supply 26. The microcontroller is responsible for selecting and controlling the more dominant power source. The microcontroller implementation is best used if there are two converters with output voltage tolerances. Since the converter with the higher voltage will do all of the work, this intelligently controlled bus is most useful to prevent the dominant device from failing prematurely.

A third modality for power sharing is to simply connect power source module 2, the AC/DC unit, to module 1, thus making it the DC/DC power supply's front end. Since power source 1 may deliver DC output, and power source 2 may accept DC as its input, the two devices can be daisy-chained. Module 2 should be a synchronous boost converter with a 100% duty cycle, for example, as available from Linear Technology (Milpitas, Calif.), as this type of power supply will allow the DC output of module 1 to pass through module 2 without conversion. Such a synchronous converter should be duty-cycle limited. Typically, an N-channel power switch is used so that any incoming power signal above a particular voltage threshold is allowed to pass around the converter, unaltered. Thus, if the threshold voltage on module 2 is set at 27.5 volts, only a true 28-volt input will set the switch to let the power bypass the converter. Converter 2 is designed so that any voltage below 27.5 VDC input will be channeled into the converter, where it is boosted to 28 VDC.

E. Operation Of Regulator 17

The first voltage regulator 17 has two fixed outputs, 19 and 20, preset at the appropriate voltages for microprocessor 32 along powerline 20, and microcontroller 23, via powerline 19. This secondary voltage might be 0.5 volt for microcontroller 23, and typically 3.3 to 5 volts for a CPU such as 32 in FIG. 10. Powerline 18 supplies the 28 VDC input power to controllable regulator 25 directly from the active power source, i.e., converter 1 or 2, via powerlines 16. Both the two-output fixed voltage regulator 17 and the controllable regulator 25 can be one device with two fixed and one variable output.

In the iteration of a power supply device according to the present invention, the controllable regulator 25 responds to commands from microcontroller 23 which are sent along the data lines 24. Microcontroller 23 must have valid information regarding the specific voltage requirements of supplied device 54 (which could be, for example, a laptop computer, or any basic electrical or electronic device). There are numerous ways to arrive accurately at the correct final output voltage at the variable-output-voltage controllable regulator 25. This power supply 26 does not require a microprocessor 32, but one is shown in FIG. 10 for advanced functions, which are detailed throughout this document. The microcontroller 23 and multi-selector switch 32, and A/D converters 21, as well as sensors 18, are also not essential in every modality of a power supply device according to the present invention, as schematic FIG. 11 shows.

F. Controllable Voltage Regulator 25 Description

FIG. 11 is a schematic of a typical circuit design for a controllable variable-voltage-output regulator 25 in FIG. 10. As an example of a continuously reconfigurable regulator, the circuit uses at least one data input (see the look-up table in FIG. 12 as one example) that here is presented to the controllable regulator 25 as a set of resistive values. Each combination of resistor values moves the voltage output of the controllable regulator 25 upward (or downward) by about 0.375 volts. The exact voltage calibrations are determined by the application for which power supply 26 or 64 in FIG. 10 is intended. Finer voltage steps will require a larger look-up table than is shown above and, if the resistor-values method of voltage regulation is used, more resistors and combinations thereof are required.

The resistor ladder shown in FIG. 11 adjacent to connector J-1 is only one way to drive the power circuit A parallel cable attaches to J-1 connector, and the resistor combinations receive an appropriate 0.5 volt command from external software. The software references the look-up table in FIG. 12 to find the correct 8-bit register which equates to the desired output voltage. This look-up register is translated into a command to the parallel port (LPT1, LPT2, LPT DOS, etc.) and the correct pinouts on the port are set on.

This data input method can be improved by two methods. The first is to latch up the voltage value. This avoids having to hold the parallel port open continuously in order to keep a group of pin-outs set high (voltage ON).

In the alternative, the resistor ladder and related circuitry ahead of the Linear LT1339 can be replaced by a Linear Technology (Milpitas, Calif.) LT 1329A-50 chip or an equivalent. This eliminates numerous discrete components, and allows for a serial connection with an A/D converter. With this implementation, a logic board can be integrated into the existing circuit which has, for example, an infrared circuit. Thus IR-configured, the data link between a supplied device's software and the controllable power supply can be wireless.

One way of achieving this wireless link is shown in FIG. 9, where the power supply is controlled by a separate device, here an MCU (Master Control Unit) 512 which is communicating via infrared. Other wireless communication links have been discussed in FIG. 14 and elsewhere in this document For many of these, including some versions of IR, a parallel port implementation is available, but the serial port affords better communication opportunities, since it is a digital port not dependent on analog voltages on wired cables.

This data stream to the regulator 25 replaces what is typically a manually-configurable output voltage in the regulator. In such manually-adjustable voltage regulators some variant of a manual trim potentiometer is used in the factory to preset the desired non-variable output voltage within the power supply's pre-determined voltage range. The invention shown in FIG. 10 uses the circuit design in FIG. 11 or an equivalent to achieve its continuously-adjustable output voltages from –0-24/+0-24 VDC, in increments of about 0.375 of a volt. These variable outputs do not rely on manually adjustable potentiometers or sensing lines that require an initial set up.

G. Determining Voltage of Supplied Device

1) Battery Present (a) Sense Battery Voltage And Step Voltage Throughout A Range Of Available Voltages The most simple and direct method of determining the correct output voltage of controllable regulator 25 is to set the output voltage of the regulator to zero, as its reference voltage. This happens each time the power supply is disconnected from a power source (e.g., if power supply module 64 is plugged into a 110 VAC wall outlet, disconnecting the source of power causes the controllable regulator 25 to reset to 0 volts. The power supply also resets to zero when the data link is broken. For example, the parallel cable required to hold the resistor ladder configuration of the power supply in FIG. 11, when disconnected, resets the power output to 0 volts. The software, which delivers a voltage to the resistor ladder located in the schematic to the right of connector J-1, establishes the proper output voltage of the regulator.

The next time the device 26 or 64 is powered, the controllable regulator remains at 0 volts, until the battery device 43 is attached or until software commands the voltage to change value. The battery voltage is sent directly to the controllable regulator, as shown here on lines 28 and 24 (note that microcontroller 23 is not present in this application so lines 28 and 24 are assumed as connected). Controllable regulator 25 has two sensing lines. One line is used to set the primary output voltage. That voltage is read as a direct analog signal, i.e., true voltage, from the battery 43. This assumes that the circuit has a voltage-sense line which can accept analog information such as pure voltage. Such a circuit is not shown in FIG. 11, but if it were present, there can be an A/D converter part of that circuit, so that a chip like the Linear Technology LT 1339 can use the information.

Controllable regulator 25 uses this first-voltage-in to set the output voltage. Regulator 25 can use onboard memory to refresh its first sensing line, as needed (for example, the refresh rate can be a clock-controlled time function). In the alternative, the battery 43 can be used to continuously hold the voltage reference value. The second sense line is used to recalibrate the controllable voltage, using the baseline voltage from the first sensing line. This second sensing line is used to correct any voltage drift by polling the original voltage value in memory or from the battery, and recalibrating the output power (upward or downward). Thus, controllable regulator 25 becomes self-correcting and self-compensating, and it is independent of any external controllers or microprocessors. Based on the simplicity of this application of the present invention, it is favored over other more complex solutions which require a microprocessor and/or microcontroller.

(b) Sense Battery Voltage with Power Supply Microprocessor

In one application of a power supply according to the present invention, the voltage of battery device 43, which is the removable power source supplied by the manufacturer, is sampled at powerlines 37 and 39. Multi-selector switch 33, with its variable-pin-configuration, which is controlled by the microprocessor 32 and/or via the microcontroller 23, is configured so that the battery voltage 53 can be read by the microprocessor 32. The analog voltage available must loop through an A/D connector 21, so that either microprocessor 32 and/or microcontroller 23 can read the voltage input Because voltage 53 is the exact voltage required to optimally power the supplied device 54, the microprocessor 32 can, by issuing appropriate information to microcontroller 23 over line 22, properly configure controllable regulator 25. If the supplied device 54 is turned on, and is drawing power from the battery 43, voltage and current sensors 81 capture the voltage reading along lines 37, 39, 34 or 36, as the power passes through the multi-selector switch 33 from the battery 43 to the supplied device 54. This analog data is sent to the A/D converter 21, and the digital voltage information is then sent along data line 86 to the microprocessor 32.

Should supplied device 54 be turned OFF, the in-line sensors 81 can behave as a volt/ohm meter, and a direct voltage reading can be acquired across lines 37 and 39. The same data path is again used, along line 81 to the A/D converter 21, then to the microprocessor 32.

The microprocessor 32 converts the battery's voltage reading into a digital command string to the microcontroller 23. An example of one of the software code tables which could be used to actuate a controllable regulator can be seen in the table below.

| b7 | b6 | b5 | b4 | b3 | b2 | b1 | b0 | Output (volts) |
|---|---|---|---|---|---|---|---|---|
| 1 | X | X | X | X | X | X | X | 0.000 |
| 0 | 0 | 0 | 0 | 0 | 0 | 0 | 0 | 0.375 |
| 0 | 0 | 0 | 0 | 0 | 0 | 0 | 1 | 0.750 |
| 0 | 0 | 0 | 0 | 0 | 0 | 1 | 0 | 1.125 |
| 0 | 0 | 0 | 0 | 0 | 0 | 1 | 1 | 1.500 |
| 0 | 0 | 0 | 0 | 0 | 1 | 0 | 0 | 1.875 |
| 0 | 0 | 0 | 0 | 0 | 1 | 0 | 1 | 2.250 |
| 0 | 0 | 0 | 0 | 0 | 1 | 0 | 1 | 2.625 |
| 0 | 0 | 0 | 0 | 0 | 1 | 1 | 1 | 3.000 |
| 0 | 0 | 0 | 0 | 1 | 0 | 0 | 0 | 3.375 |
| 0 | 0 | 0 | 0 | 1 | 0 | 0 | 1 | 3.750 |
| 0 | 0 | 0 | 0 | 1 | 0 | 1 | 0 | 4.125 |
| 0 | 0 | 0 | 0 | 1 | 0 | 1 | 1 | 4.500 |
| 0 | 0 | 0 | 0 | 1 | 1 | 0 | 0 | 4.875 |
| 0 | 0 | 0 | 0 | 1 | 1 | 0 | 1 | 5.250 |
| 0 | 0 | 0 | 0 | 1 | 1 | 1 | 0 | 5.625 |
| 0 | 0 | 0 | 0 | 1 | 1 | 1 | 1 | 6.000 |
| 0 | 0 | 0 | 1 | 0 | 0 | 0 | 0 | 6.375 |
| 0 | 0 | 0 | 1 | 0 | 0 | 0 | 1 | 6.750 |
| 0 | 0 | 0 | 1 | 0 | 0 | 1 | 0 | 7.125 |
| 0 | 0 | 0 | 1 | 0 | 0 | 1 | 1 | 7.500 |
| 0 | 0 | 0 | 1 | 0 | 1 | 0 | 0 | 7.875 |
| 0 | 0 | 0 | 1 | 0 | 1 | 0 | 1 | 8.250 |
| 0 | 0 | 0 | 1 | 0 | 1 | 1 | 1 | 9.000 |
| 0 | 0 | 0 | 1 | 1 | 0 | 0 | 0 | 9.375 |
| 0 | 0 | 0 | 1 | 1 | 0 | 0 | 1 | 9.750 |
| 0 | 0 | 0 | 1 | 1 | 0 | 1 | 0 | 10.125 |
| 0 | 0 | 0 | 1 | 1 | 0 | 1 | 1 | 10.500 |
| 0 | 0 | 0 | 1 | 1 | 1 | 0 | 0 | 10.875 |
| 0 | 0 | 0 | 1 | 1 | 1 | 0 | 1 | 11.250 |
| 0 | 0 | 0 | 1 | 1 | 1 | 1 | 0 | 11.625 |
| 0 | 0 | 0 | 1 | 1 | 1 | 1 | 1 | 12.000 |
| 0 | 0 | 1 | 0 | 0 | 0 | 0 | 0 | 12.375 |
| 0 | 0 | 1 | 0 | 0 | 0 | 0 | 1 | 12.750 |
| 0 | 0 | 1 | 0 | 0 | 0 | 1 | 1 | 13.125 |
| 0 | 0 | 1 | 0 | 0 | 0 | 1 | 1 | 13.500 |
| 0 | 0 | 1 | 0 | 0 | 1 | 0 | 0 | 13.875 |
| 0 | 0 | 1 | 0 | 0 | 1 | 0 | 1 | 14.250 |
| 0 | 0 | 1 | 0 | 0 | 1 | 1 | 0 | 14.625 |
| 0 | 0 | 1 | 0 | 0 | 1 | 1 | 1 | 15.000 |
| 0 | 0 | 1 | 0 | 1 | 0 | 0 | 0 | 15.375 |
| 0 | 0 | 1 | 0 | 1 | 0 | 0 | 1 | 15.750 |
| 0 | 0 | 1 | 0 | 1 | 0 | 1 | 0 | 16.125 |
| 0 | 0 | 1 | 0 | 1 | 0 | 1 | 1 | 16.500 |
| 0 | 0 | 1 | 0 | 1 | 1 | 0 | 0 | 16.875 |
| 0 | 0 | 1 | 0 | 1 | 1 | 0 | 1 | 17.250 |
| 0 | 0 | 1 | 0 | 1 | 1 | 1 | 0 | 17.625 |
| 0 | 0 | 1 | 0 | 1 | 1 | 1 | 1 | 18.000 |
| 0 | 0 | 1 | 1 | 0 | 0 | 0 | 0 | 18.375 |
| 0 | 0 | 1 | 1 | 0 | 0 | 0 | 1 | 18.750 |
| 0 | 0 | 1 | 1 | 0 | 0 | 1 | 0 | 19.125 |
| 0 | 0 | 1 | 1 | 0 | 0 | 1 | 1 | 19.500 |
| 0 | 0 | 1 | 1 | 0 | 1 | 0 | 0 | 19.875 |
| 0 | 0 | 1 | 1 | 0 | 1 | 0 | 1 | 20.250 |
| 0 | 0 | 1 | 1 | 0 | 1 | 1 | 1 | 20.625 |
| 0 | 0 | 1 | 1 | 0 | 1 | 1 | 1 | 21.000 |
| 0 | 0 | 1 | 1 | 1 | 0 | 0 | 0 | 21.375 |
| 0 | 0 | 1 | 1 | 1 | 0 | 0 | 1 | 21.750 |
| 0 | 0 | 1 | 1 | 1 | 0 | 1 | 0 | 22.125 |
| 0 | 0 | 1 | 1 | 1 | 0 | 1 | 1 | 22.500 |
| 0 | 0 | 1 | 1 | 1 | 1 | 0 | 0 | 22.875 |
| 0 | 0 | 1 | 1 | 1 | 1 | 0 | 1 | 23.250 |
| 0 | 0 | 1 | 1 | 1 | 1 | 1 | 0 | 23.625 |
| 0 | 0 | 1 | 1 | 1 | 1 | 1 | 1 | 24.000 |

-continued

| b7 | b6 | b5 | b4 | b3 | b2 | b1 | b0 | Output (volts) |
|---|---|---|---|---|---|---|---|---|
| 0 | 1 | 0 | 0 | 0 | 0 | 0 | 0 | −0.375 |
| 0 | 1 | 0 | 0 | 0 | 0 | 0 | 1 | −0.750 |
| 0 | 1 | 0 | 0 | 0 | 0 | 1 | 0 | −1.125 |
| 0 | 1 | 0 | 0 | 0 | 0 | 1 | 1 | −1.500 |
| 0 | 1 | 0 | 0 | 0 | 1 | 0 | 0 | −1.875 |
| 0 | 1 | 0 | 0 | 0 | 1 | 0 | 1 | −2.250 |
| 0 | 1 | 0 | 0 | 0 | 1 | 1 | 0 | −2.625 |
| 0 | 1 | 0 | 0 | 0 | 1 | 1 | 1 | −3.000 |
| 0 | 1 | 0 | 0 | 1 | 0 | 0 | 0 | −3.375 |
| 0 | 1 | 0 | 0 | 1 | 0 | 0 | 1 | −3.750 |
| 0 | 1 | 0 | 0 | 1 | 0 | 1 | 0 | −4.125 |
| 0 | 1 | 0 | 0 | 1 | 0 | 1 | 1 | −4.500 |
| 0 | 1 | 0 | 0 | 1 | 1 | 0 | 0 | −4.875 |
| 0 | 1 | 0 | 0 | 1 | 1 | 0 | 1 | −5.250 |
| 0 | 1 | 0 | 0 | 1 | 1 | 1 | 0 | −5.625 |
| 0 | 1 | 0 | 0 | 1 | 1 | 1 | 1 | −6.000 |
| 0 | 1 | 0 | 1 | 0 | 0 | 0 | 0 | −6.375 |
| 0 | 1 | 0 | 1 | 0 | 0 | 0 | 1 | −6.750 |
| 0 | 1 | 0 | 1 | 0 | 0 | 1 | 0 | −7.125 |
| 0 | 1 | 0 | 1 | 0 | 0 | 1 | 1 | −7.500 |
| 0 | 1 | 0 | 1 | 0 | 1 | 0 | 0 | −7.875 |
| 0 | 1 | 0 | 1 | 0 | 1 | 0 | 1 | −8.250 |
| 0 | 1 | 0 | 1 | 0 | 1 | 1 | 0 | −8.625 |
| 0 | 1 | 0 | 1 | 0 | 1 | 1 | 1 | −9.000 |
| 0 | 1 | 0 | 1 | 1 | 0 | 0 | 0 | −9.375 |
| 0 | 1 | 0 | 1 | 1 | 0 | 0 | 1 | −9.750 |
| 0 | 1 | 0 | 1 | 1 | 0 | 1 | 0 | −10.125 |
| 0 | 1 | 0 | 1 | 1 | 0 | 1 | 1 | −10.500 |
| 0 | 1 | 0 | 1 | 1 | 1 | 0 | 0 | −10.875 |
| 0 | 1 | 0 | 1 | 1 | 1 | 0 | 1 | −11.250 |
| 0 | 1 | 0 | 1 | 1 | 1 | 1 | 0 | −11.625 |
| 0 | 1 | 0 | 1 | 1 | 1 | 1 | 1 | −12.000 |
| 0 | 1 | 1 | 0 | 0 | 0 | 0 | 0 | −12.375 |
| 0 | 1 | 1 | 0 | 0 | 0 | 0 | 1 | −12.750 |
| 0 | 1 | 1 | 0 | 0 | 0 | 1 | 0 | −13.125 |
| 0 | 1 | 1 | 0 | 0 | 0 | 1 | 1 | −13.500 |
| 0 | 1 | 1 | 0 | 0 | 1 | 0 | 0 | −13.875 |
| 0 | 1 | 1 | 0 | 0 | 1 | 0 | 1 | −14.250 |
| 0 | 1 | 1 | 0 | 0 | 1 | 1 | 0 | −14.625 |
| 0 | 1 | 1 | 0 | 0 | 1 | 1 | 1 | −15.000 |
| 0 | 1 | 1 | 0 | 1 | 0 | 0 | 0 | −15.375 |
| 0 | 1 | 1 | 0 | 1 | 0 | 0 | 1 | −15.750 |
| 0 | 1 | 1 | 0 | 1 | 0 | 1 | 0 | −16.125 |
| 0 | 1 | 1 | 0 | 1 | 0 | 1 | 1 | −16.500 |
| 0 | 1 | 1 | 0 | 1 | 1 | 0 | 0 | −16.875 |
| 0 | 1 | 1 | 0 | 1 | 1 | 0 | 1 | −17.250 |
| 0 | 1 | 1 | 0 | 1 | 1 | 1 | 0 | −17.625 |
| 0 | 1 | 1 | 0 | 1 | 1 | 1 | 1 | −18.000 |
| 0 | 1 | 1 | 1 | 0 | 0 | 0 | 0 | −18.375 |
| 0 | 1 | 1 | 1 | 0 | 0 | 0 | 1 | −18.750 |
| 0 | 1 | 1 | 1 | 0 | 0 | 1 | 0 | −19.125 |
| 0 | 1 | 1 | 1 | 0 | 0 | 1 | 1 | −19.500 |
| 0 | 1 | 1 | 1 | 0 | 1 | 0 | 0 | −19.875 |
| 0 | 1 | 1 | 1 | 0 | 1 | 0 | 1 | −20.250 |
| 0 | 1 | 1 | 1 | 0 | 1 | 1 | 0 | −21.000 |
| 0 | 1 | 1 | 1 | 1 | 0 | 0 | 0 | −21.375 |
| 0 | 1 | 1 | 1 | 1 | 0 | 0 | 1 | −21.750 |
| 0 | 1 | 1 | 1 | 1 | 0 | 1 | 0 | −22.125 |
| 0 | 1 | 1 | 1 | 1 | 0 | 1 | 1 | −22.500 |
| 0 | 1 | 1 | 1 | 1 | 1 | 0 | 0 | −22.875 |
| 0 | 1 | 1 | 1 | 1 | 1 | 0 | 1 | −23.250 |
| 0 | 1 | 1 | 1 | 1 | 1 | 1 | 0 | −23.625 |
| 0 | 1 | 1 | 1 | 1 | 1 | 1 | 1 | −24.000 |

(c) Read Digital Data from Smart Battery

Battery device 43 can also provide the required information about its voltage as data already resident in its memory. Such a "smart" battery as is shown in FIG. 10 contains factory-loaded data about the battery, such as the manufacturer's "design voltage," real-time actual output voltage, type of battery chemistry, date of manufacture, etc. The voltage required to power the supplied device 54 is thus available from the battery 43 as a digital signal. This information is accessible at one or more of the battery's three data lines 44, 45 or 47. The three data lines in many of today's "smart" batteries are typically identified as Clock, Data, and Temperature, but these designators may vary from manufacturer to manufacturer. For a Duracell® "smart" battery, for example, the Data and ground lines are usually all that's required to acquire data on voltage. The Temperature data line does not deliver information from the embedded thermistor, instead it only accesses a circuit to an independent developer's thermistor. If data line 47 (and ground line 49) has been set by the manufacturer to supply the voltage data, that information passes at the connector contact 71 through the connector block to pin 76, and then along line 59 in the supplied device 54 to the microprocessor 56. The voltage data is then looped back out of the microprocessor to the supplied device's data line 58. From connector pin 75, and along data line 35 in the connector 42, the information arrives at the multi-selector switch 33, is routed along line 30 to the microprocessor 32.

2) No Battery Present

Microcontroller 23 is required if there is no battery present (e.g., the battery has been removed from the supplied device 54 to recondition it in a separate recycling device). Controllable regulator 25 has no reference voltage for its reference sensing line. Microcontroller 23 can obtain the necessary set-point voltage in several ways. These are detailed below.

(a) Step Voltage from Zero Volts Until Current Remains Constant

The supplied device 54 requires a specific voltage to operate, although many devices, such as laptop computers, are designed to function properly across a wide range of input voltages. The input power regulators of such devices are designed to tolerate a reasonable amount of both under- and over-voltage. This is typically at least +/−2 volts, and there are numerous examples of such devices which can operate properly over a far wider range. Many of Texas Instruments' laptop designs perform well at any input voltage between 12 and 20 volts, even though the device's manufacturer-supplied AC/DC adapter specifies precisely 15 volts.

This "loose-tolerance" input voltage approach has existed for many years, and is employed by most manufacturers of consumer electronics. The front end of the device's internal power system is designed this way to allow for the substantially large variations in most inexpensive AC/DC and DC/DC power adapters. Driven by cost, these inefficient power supplies suffer from poor quality assurance controls, and exhibit considerable voltage drift due to low-priced components. The electronic equipment manufacturers have been able to reduce external power supply costs by designing the host devices to operate within a wide voltage range.

A power supply module according to the present invention takes advantage of this "loose tolerance" design feature in a significant way. This is most evident in one embodiment of a power supply 26 in FIG. 10 according to the present invention in which its intelligence is minimized. If there is no battery present in the supplied device to give a correct reference voltage, or if the battery is totally dead (rather unlikely, since even a battery which is below the minimum operating voltage required by the supplied device to power the supplied device will still have sufficient residual charge to deliver a reasonably correct voltage reading under no-load conditions, e.g., VOM readings), the power supply module becomes dependent on an alternate source of valid voltage information One fallback strategy to deal with a "dead" battery is to include software on the supplied device, which knows the correct operating voltage. However, a missing or dead battery may render such software inaccessible. This quandary is resolved by activating controllable regulator 25 in power supply 26 at an initial voltage of zero. The "minimally intelligent" embodiment of a power supply module according to the present invention then proceeds to increase judiciously its output voltage in about 0.375-volt increments (the granularity of such increments is not essential to this process). Since supplied device 54 might be a low-powered device, for example a cellular phone which operates at 7.2 volts, power supply module 26 or 64 does not have enough valid data from that cellular phone to determine the exact power signal the supplied device needs. As the power supply module's output voltage increases, the power supply looks for feedback from the supplied device. This will come, as various levels of activation-voltages are reached, in the form of detectable current flow. Only until the host device "wakes up," will current flow at an approximately correct voltage to create any detectable load in the output circuitry.

The power supply module embodiment discussed immediately above is configured during this operation with an internal direct data loop, via the multi-selector switch 33 so that microprocessor 32 has a data line 22 and 24 to controllable regulator 25. FIG. 10 shows a voltage and/or current sensor 81 at connector 79, to detect voltage and current on powerlines 37, 39, 34, and 36. If controllable regulator 25 is built along the lines of that shown in the schematic (FIG. 1), voltage (or current as an expression of voltage) can be read at "I-OUT." If "I-OUT" is not available on regulator 25, this data from sensor 81 is accessed by microprocessor 32 by issuing a call to the multi-selector switch 33 to pass data line 80 through and out its continuation to the A/D converter 21, then to microprocessor 32.

To assist in this process, the power supply (26 or 64) module's firmware may have an optional look-up table. This software is a chart of average load schedules for most of the common supplied devices. There are also voltage ranges within which certain classes of devices operate. The voltage ranges are not very important, but they do establish "sweet spots" along the voltage ladder where the power supply module might expect to encounter a cellular phone-type supplied device and not a portable computer. Resistive values (i.e., load) are far easier to ballpark than voltages, so this look-up table expresses anticipated load as a function of voltage, compared to device types.

A "typical" generic laptop draws an average current load of about 1.75 amps. The voltage range within which almost all laptops operate is virtually never less than 10 volts, and not above 24 volts DC. Thus, the higher amperage ratings are the first "signature" indicator looked for in determining whether the supplied device is a laptop or a camcorder, for example. The secondary confirmation that this current-load model is being sensed when the power supply module's output voltage is above 10 VDC is further validation of the type of equipment being powered, thus validating the look-up table. As the output voltage of the power supply module approaches 10 volts, having not had any response in the form of detectable current flow, the look-up table indicates that the supplied device is probably not a cellular phone, camcorder, or other device typically operating below 10 volts.

The software matrix also indicates that, if the supplied device is a laptop, the first detectable load will have a definable "signature" as viewed on an oscilloscope. This "signature" as expressed in resistance (load) will indicate, for example, that the CPU has turned on. This event is usually about a 500 milliamp activity for an Intel Pentium® chip, with substantial spikes as the microprocessor performs its initial maintenance and configuration protocols. If this anticipated current pattern is detected, the system uses this as confirmation of the presence of a laptop as referenced in the software's look-up table. Thus, the defining issues are the amount of current being drawn by the device, the voltage at which that happens, and the associated characteristics about what that current load looks like as a chartable activity (or series of power-load-related activities).

The power supply module continues to increase its output voltage, constantly looking for continued reinforcement of defined changes in current, as they compare to the internal look-up tables. If the supplied device is a laptop, these changes in current will follow a defined pattern, since all computers' BIOSes follow a very traditional POST sequence. During this boot process, internal hardware devices are tested, by turning them ON and OFF. This sequence tracks well with the look-up table accessed by the microprocessor in the power supply module. The power supply module knows that, at a certain time in the sequence of reportable current-modeled events, the hard drive or a floppy drive, bootable CD-ROM, bootable PC card, etc. will be turned ON, and any resident software relevant to the power supply module will execute.

The basic confirmation of its look-up tables is sufficient to tell power supply 26 or 64 in FIG. 10 when supplied device 54 is fully operational. This is relatively easy with a laptop, since the screen, and especially its backlighting, are extremely energy hungry, and appear as a major event in the current load monitoring. The hard drive also leaves a distinctive current-related signature when it turns ON and OFF its primary and stepper motors, as do most other "families" of installed hardware within the supplied device. The power supply module may proceed to increase its output voltage by one or more 0.375-volt increments, as a safety buffer to any power factor correction. The power supply assumes that the host device is filly operational. When further voltage increases are not considered necessary, the controllable regulator is halted at that voltage level. From this point, any power factor correction capabilities in the power supply design (shown, e.g., in FIG. 11) will maintain this nominal operative voltage as further changes in load require.

The look-up tables, as defined above, are considered an aid to the "add-voltage-read-current" model just described, but the power supply module also works without this support information. The "add-voltage-read-current" model of determining appropriate output voltage reduced to its most elemental denominator is the power supply module keeps adding voltage, in small gradual steps, until there are no further increases in current detected. At that point, the device is considered operational. Should the load increase substantially, for example a CD-ROM drive is accessed on a laptop which is being powered at the lower end of its voltage range, the power supply module sees a related load which might be significant enough to cause the voltage to drop. The power supply module responds by increasing the voltage enough to restore the power output to the original levels.

(b) Polarity Checking

Before power supply 26 or 64 in FIG. 10 can perform the "voltage ladder" power-up process described in (a), above, the power supply must perform a polarity check at connector 79. This is done by applying a momentary negative voltage at connector 79, and looking for current flow while multi-selector switch 33 configures itself in various ways to all possible combinations of the number of conductors available. All non-valid combinations are viewed as the "constant," and the correct combination of the power lines will be readily seen as deviation from the "constant."

This method has inherent safety to it, based on the knowledge that any electronic supplied device 54 will be voltage and current protected, as part of the supplied device's internal voltage regulator circuit. Such circuits are not typically damaged by transient negative voltages. Such an assumption is validated by the types of connectors this class of devices uses for power, both on the external power supply's cable, and on the battery pack's contacts.

Connector standardization within a manufacturer's product line has not been achieved, yet alone industry-wide connector standards. Thus, an individual manufacturer might use numerous variants of a typical 5 mm connector for a line of electronic products, e.g., laptop computers, video game devices, etc. Center pin and out barrel polarity can flip-flop from model to model. This gives the manufacturer some level of proprietary uniqueness and promotes the sale of device-specific power adapters which, in itself, can create a significant revenue stream. Therefore, the consumer can inadvertently purchase an external power adapter which looks as if it is the correct replacement for the properly wired original power supply. The fact that all UL-approved power supplies must have a standard polarity symbol on the label validates the premise.

Manufacturers, therefore, build circuit protection into the supplied device in anticipation of a potential reversed polarity event. The power supply uses this to an advantage, using a transient negative voltage to confirm the manufacturer's polarity at the connector. Sensors 81 in FIG. 10 are used to detect current flow during this negative-voltage-based polarity check.

(c) Read Data from Supplied Device

Another way to establish the correct output voltage of the controllable regulator 25 is to obtain that information from the supplied device 54. The supplied device can have the correct voltage value from various sources, some examples of which are as pre-defined data in hardware at the time of manufacture (perhaps in the BIOS, the CPU, in CMOS or an equivalent non-volatile memory), embedded in an insertable chip (as a PC Card's memory chip, a chip embedded in a cord, such as a parallel or serial cord or an RJ-11/45 connector), or the voltage value can be in pre-loaded software from the manufacturer and available on the hard drive, as an application or as a resource in the OEM version of the operating system.

In the alternative, if the power supply 26/64 has been used previously with the supplied device 54, the voltage value can be transferred from the power supply on the first use (the power supply having obtained it in any of the ways noted previously and hereafter), then that information is reconveyed from supplied device 54 back to the power supply at any future time, as needed Of the numerous ways of doing this, setting one or more bits as a header of an n-bit register would confirm both the address of the power supply and the supplied device, as well as the voltage value last associated with those addresses. This information can reside in either or both devices in software and/or hardware.

This previous use assumes an interaction between the microprocessor 32 and the supplied device's microprocessor 56, whereby information acquired by device 26 has been transferred to device 54. Microprocessor 32, having ascertained the battery voltage by an appropriate means, some examples of which have been indicated here, has the voltage data available to either send to memory 31, or directly to device 54's memory 57 or data storage 55. To send data from device 26 to device 54, data line 30 is used to move the information to the multi-selector switch 33, which is configured to make available data line 35 in the connector 42.

The data is then at pin 75, which accesses device 54 via line 58. Microprocessor 56 can then direct the data for storage in non-volatile memory (e.&, CMOS, ROM, PROM, EPROM, EEPROM non-volatile flash memory, removable or permanently installed). The data can alternatively, or concurrently, be put in data storage 55, an example of which is a hard drive.

(d) Read Data from Memory within Power Supply

In the alternative, the supplied device 54 can poll device 26, and pull the information from device 26's memory. The data path is defined as the reverse route of that described in the previous paragraph. Supplied device 54 has already been configured with the necessary software to control the multi-selector switch 33, which enables access to the path to memory 31. Controlling the multi-selector switch 33 requires a controller, which can be hardware and/or software resident on device 54. In one modality multi-selector switch is a passive switch, and not necessarily its own controller. Therefore, it can also be controlled by microcontroller 23 in power supply 26.

H. Microprocessor on Power Supply 26

The microprocessor 32 receives data inputs from either or both the battery device 43 (as discussed above) and the supplied device 54 through multi-selector switch 33 via data line 30. Thus, power supply 26 could be configured such that microprocessor 32 and its memory 31 have been eliminated. In such a configuration, microprocessor 56 and memory 57 in the supplied device 54 serve the same functions discussed above in connection with microprocessor 32 and memory 31 respectively. The remote microprocessor 56 actuates the microcontroller 23 and, subsequently, the controllable regulator 25 and the multi-selector switch 33, via the data lines 58, 75, 35, and 30. Powerlines 27 and 28 carry the correctly-adjusted voltage to the multi-selector switch 33. Multi-selector switch appropriately distributes that voltage to either the supplied device 54 or the battery device 43, depending on the command received from microprocessor 32 (or microprocessor 56).

Since battery 43 also has memory and DSP capabilities as a "smart" battery, it can perform many of the functions of power supply 26's microprocessor and memory. Lacking any controller in the battery, this functionality is limited to the battery's direct access to supplied device 54, where a microcontroller 85 is available. In this modality of the battery having access to a microcontroller in a supplied device, one of the effective uses of the battery's onboard logic is to store macro "triggers." The firmware in the battery can be used to store values, variables or Boolean statements which can be accessed by supplied device 54 and/or power supply 26. An example of such a battery-triggered event might be if a pre-designated address block (for example, register 23) in battery memory 50 is polled, a value in another register in battery 43's memory (22, as an example) is changed to a different value (1 instead of 0), so that an external device, such as power supply 26 or supplied device 54 in FIG. 10 for example, polls battery register 22, which triggers a change in a stored value in register 23. This process could tell both power supply 26 and supplied device 54 that they are both connected, without each of those devices having to directly communicate with each other, by noting the value at that register. For example, a start bit of 1 may mean that another device is connected, while finding a 0 means that the external device is the only one attached. Each device with access to any of the registers allocated for this purpose also has an assigned address, identifying its equipment type, as a power supply, power supply with internal charger, supplied device with no microcontroller, etc., as possible examples. In simple terms, the battery's memory serves as a virtual bulletin board where external devices leave messages, and flags are triggered at other locations on this bulletin board as to who is online, who has logged in, and who they are. Every time another device accesses the battery, new flags are set, so that the battery can broadcast (or be polled) as to what its environmental variables are at any given time.

I. Memory on Microprocessor 32

Memory 31 can be either volatile (e.g., RAM flash) or non-volatile (e.g., ROM PROM, EPROM, EEPROM flash). Power supply 26 could be updated by software resident on the supplied device 54, if memory 31 were configured to be rewrittable. If the memory is volatile (e.g., certain types of flash memory not truly rewrittable, i.e., semi-permanent), a new configuration and data tables would be loaded or built every time the power supply 26 were powered up.

Battery device 43 would only require power from power supply 26 for recharging purposes. Depending on the chemistry of battery device 43, the recharging process can be either current- or voltage-regulated. For example, L-Ion batteries rely on controllable voltage inputs for charging. Thus, with an appropriate template or look-up table stored in memory, the power supply module has the ability to deliver multiple reconfigurable voltages in increments of about 0.375 volts so that it functions as an L-Ion battery charger. That look-up table or template can reside in the memory 31 on the power supply 26, or in the supplied device's data storage 55 if software is used, or in non-volatile memory 57, if hardware/firmware are employee.

The charging template can also reside within the battery device 43. The battery's charging parameters can be polled by power supply 26, stored in memory 31 for residence. Then microcontroller 23 can execute the charging functions by controlling regulator 25. Microprocessor 32 monitors these activities, and repolls the battery's telemetry information (actual voltage, temperature, etc.) to confirm the progress of the charge cycle. Alternatively, power supply 26 can include a battery charging chip 92, such as those used on the Maxim Technology DC-134 charging demo board, which is programmed to charge the three most common battery chemistries. Thus, power supply 26 can act as a battery charging device in at least two ways.

When microprocessor 56 or microcontroller 85 in supplied device 54 is employed as the charger controller, data is passed from battery device 43 to microprocessor 56 directly. The two-sided interface connector 42 has two pass-through lines with ends labeled 69–74 and 71–76 in FIG. 10. These two connector pin sets are wired together so that their respective data from the battery device's lines 44 and 47 are directly connected to the supplied device's connector pins 62 and 59. Thus, battery device 43 may be recharged in at least three ways, two by power supply 26 alone, and one by the combination of power supply 26 and supplied device 56. Obviously, supplied device 54 would have its own charging circuit, since battery 43 is dedicated to it, but battery 43 can be a second, external battery or a third-party extended-life multi-pack assembly. Charger 92 in power supply 26 then can act as an auxiliary or spare charger.

J. Multi-Selector Switch 33

The multi-selector switch 33 can have its own memory and/or microcontroller. If there is resident memory, a look-up table is present so that the switch can capture a data packet with the properly designated header which makes the packet specific to switch 33. This memory in switch 33 can be volatile (e.&, flash, or other type of RAM) memory, or non-volatile (e.g., ROM, PROM, EPROM, EEPROM). Both device 54 and power supply 26 can address the memory registers within switch 33, and can both read-from and write-to the chip. This switch memory can be an extension of memory 31 in power supply 26, or supplement memory 57 in device 54. This switch memory in supplied device 54 can also replace the memory 31 related to microprocessor 32. Thus, the supplied device need only know the code sequences required to configure the switch.

With a microcontroller present in multi-selector switch 33, there is no need for microcontroller 23. However, microcontroller 23 can be left in place and be dedicated to specific functions for which the switch 33's microcontroller may not be best suited. For example, the multi-selector switch can be identified as functioning for data switching, while microcontroller 23 is functionally only utilized for power control and switching. Such dedicated microcontroller utilization may simplify the design of the power supply 26, especially when additional controllable regulators are included. Additional controllable regulators 25, are used to allow for charging battery 43 (and any other battery devices which may be present) independent of powering a supplied device 54.

Inter-device communication between supplied device 54 and power supply 26 is not restricted to the data line(s) shown here. If battery device 43 were a "dumb" battery, supplied device 54 would not have data access at a power port. Connector 42 resides, in one version of the invention, as device 26 in the battery compartment. If no data lines inside device 54 run to that location, alternative data access must be made available. This can be a cable which links devices 54 and power supply 26, using additional pin outs at switch 33. This cable can be attached to device 54 at an appropriate hard-wired port, examples of which would be a serial or parallel port, or a PC Card (previously PCMCIA Card). The varieties of data links, both wired and wireless, are described in relation to FIG. 10, but are referenced here in FIGS. 6, 7, and 8 to show the flexibility of the invention. These data links include infrared, RF (radio), acoustics, modem (wired and wireless) and powerline modulation, to reference a few examples illustrated in FIGS. 6, 7 and 8.

Device 54 can also poll the battery device 43, in the regular way that "smart" batteries make data available to their host device. Thus, even without the connector 42 being configured to allow data to pass from line 45 in the battery 43 to line 58 in the supplied device 54, the two other battery data lines 44 and 47 do have direct throughput between the two devices, using pins 69–74 and 71–76 in connector block 41.

The following information deals with identifying a proper voltage for a supplied device which has its battery removed, or a "dead" battery. This information should be read in conjunction with the discussion of operation of a power supply when no battery is present in the supplied device located in subpart VIII.G. of this document entitled "Determining Voltage of Supplied Device."

Software and hardware typically reside on device 54 which enables it to acquire and process battery data from device 43. Microsoft's APM "Advanced Power Management" is an example of such power software management or an equivalent There are also Microsoft's ACPI tools and various third-party or OEM software packages. Software for power management affords an opportunity for power supply 26 to validate the "voltage-signature" described below and elsewhere, since power management software can control supplied device's 10 hardware. Turning on and off the screen's backlight, hard drive, floppy drive, PC card, and peripherals with software is a helpful (but not essential) tool in the process being described for devices which have no such software, or for those that have power management software inaccessible by power supply 26.

Such software may prove the only way to verify an operational voltage. This is especially true if power supply 26 has software code incompatible with that of a supplied device. Perhaps the operating system makes file access impossible, for example. In such situations, the power supply's software will have to load prior to the operating system. A diskette with DOS COMMAND. COM and related boot files make this possible, or the use of a Java-based bootable disk or an equivalent.

In mission-critical applications, such as to prevent battery charging on commercial aircraft, it may be essential to have priority access to supplied device's hardware bus, ports and file structure. Some software that can provide these accesses is an operating system (or Java, since it can co-exist with an OS to some degree). This newly-loaded power management and control operating system runs for a limited time during each reboot, in order to configure all necessary hardware to comply with the mission-critical application or event, and to override any software which might prevent completion or compliance with the power task. This new OS stays resident in the background by "shelling out" to the original operating system. It is thus still able to monitor and control all hardware, yet it is transparent to the device's original operating system and the application layer.

In many ways, what is being described here as a software application, applet, or operating system has the behavior of a "benevolent super virus," which pervades the host device at all levels, but only activates when certain undesirable activities are detected (such as the example of a battery being charged on an aircraft) while the supplied device is attached to an "intelligent" power supply/charger as is the invention.

Once supplied device 54 in FIG. 10 is even minimally powered, so that software is available, a software application which can open a communication link to the power supply establishes itself. This application must be resident prior to the end user starting any file-related activities. For example, such a power-specific software application, executable (or TSR) might load as part of an AUOTEXEC.BAT file, with communications drivers also loading in the CONFIG.SYS part of the boot. In Windows '95, this resident applet might have high priority in all registers. It is important that this application open a communication link to the power supply and handshake with power supply 26's firmware immediately, so that the opportunity for the power supply to deliver a better, more optimal voltage be pursued before the end user inadvertently loads applications and opens files which might precipitate a system crash. If power supply 26 is delivering a marginal voltage that is only adequate to sustain CPU, hard drive and screen activities, and the user loads a processor and graphic-intensive application, then opens a file and tries to print, the power demand may exceed the power supply's ability to sustain the increased load through its power factor correction capabilities.

In reading the following processes on how to build a "voltage signature," a benevolent-virus-based super operating system might not be the best approach to achieving this critical information. Bear in mind that, since most supplied devices comply with industry-wide standards and protocols at all levels of hardware and software, the heavy-handed approach of loading a foreign operating kernel might be necessary because of the proprietary effect which always results in technology-based products built to any standards.

The issue of legacy compatibility is a major reason to have a power system of hardware and software which is hardware/software/OS agnostic. Powering users' equipment is a "must do" function, for without power, the intended functionality of the users' hardware/software is lost. The software related to the power supply must not be besieged by compatibility issues with existing software, and the only way to avoid the myriad complexities involved in being "industry compliant" is to simply cut through all of the incompatibility issues by gaining immediate and fill control of the hardware.

Over time, the necessary tools to control the supplied device will migrate from the brute force approach defined above, to an adaptation and assimilation of the software into various power management applications, as well as the operating systems themselves. Also, hardware will become more controllable at the software applications level, instead of the usual reliance on the operating system. Just as the intelligent power supply embeds intelligence previously unavailable to a lowly external device, so too will hard drives, floppy drives, screen backlight systems all turn to some sort of rudimentary intelligence in hardware to enhance the overall efficiency of the mobile computer.

Supplied device 54 may have other tools which provide information about supplied device 54's voltage requirements. A BIOS, or the equivalent, can be accessed during the boot or start-up sequence of device 54. Not all electronic devices require a hardware-specific device which performs BIOS functions to operate, but if one were available, power supply 26 could monitor that activity once the microprocessor was online. While the BIOS may not report the device's operating voltage, it does provide details about the hardware configuration inside the device. Power supply 26 can watch the BIOS' POST, as it turns hardware internal to supplied device 54 on and off, to map a "voltage signature" of the various hardware sub-assemblies (e.g., hard drive, floppy drive, screen, etc.).

This "voltage signature" is written into a dynamic look-up table in power supply 26 and/or 54. The table contains pre-identified generic descriptions of various classes of common hardware sub-systems suspected to be in device 54. Such a look-up table might look like the one in FIG. 12. By using these average voltages of each electronic sub-system in device 54, and then by comparing the current which is being drawn by each sub-system on a second look-up table (not shown), power supply 26 can use its microprocessor to make a rough estimate of both the voltage range of device 54, as well as the highest possible operating voltage of device 54. This is a very crude measure of device 54's actual operating voltage. This technique can help distinguish the "voltage signature" of a hand-held portable computer (PDA/HCE) from a laptop computer, which is enough information for power supply 26 to recognize that the PDA (Personal Digital Assistant) would require less than 10 volts, while a laptop computer would most likely need from 10–24 volts.

More importantly, power supply 26 also has assembled a road map of the sequence in which certain hardware within device 54 will turn ON. For example, the microprocessor and volatile memory will respond first, i.e., they turn on at the lowest voltage within the device's range. The hard drive will respond next as its voltage becomes available, then the floppy drive (if available). Since the only sub-systems which need to be active in device 54 to make it minimally operational are the processor, memory and hard drive (or floppy), power supply 26 knows that any increase in current it detects after the processor comes online will make device 54's program instructions available. Power supply 26 considers device 54 operational when the hard drive (or a bootable device, such as a floppy, CD-ROM or PC card) comes online.

Device 26 also relies on detectable changes in current to power a device 54 which has no internal battery power available. The controllable regulator 25 starts at a $V_{out}$ of zero. Voltage is increased in 0.375 volt increments, until current flow is detected. If the look-up tables discussed above are not available, power supply 26 continues to add power by increasing the voltage gradually, one 0.375-volt increment at a time. Voltage continues to increase, as long as there is a response from device 54 which indicates a demand for more power. This cause-and-effect model continues as long as each voltage increase is confirmed by a higher feedback current, which is continuously monitored at the sensor array 81, sent along line 80 to the A/D converter, then to the microprocessor 32 along line 86. The process is halted once there is no response from device 54 indicated by an increase in current.

This "demand-side" power paradigm works well for most devices. The success or failure for each device is based on monitoring detectable activities at device 54. If the device is a laptop computer, for example, there is an assumption in power supply 26's software that device 54 will be required to perform some function within a reasonable time after power-up. For example, device 54 may commence word processing functions, and this functionality which will be apparent to power supply 26/64 as sensor array 81 reconfirms the power increases as a function of current detected, the hard drive working to read and write data. The CPU will also impact the current flow as a result of demands placed upon it during this word processing session.

Electronic devices are rarely connected to a power supply, then not used. The most notable exception is to charge an internal battery, but that shows as a very current-intensive activity, with often substantial transient spikes in current as the battery charger activates. If no appreciable change in current activity being monitored at sensors 81 occurs in about five minutes, power supply 26 assumes that device 54 is adequately powered, and it does only periodic checks at the sensors.

Were device 54 under-powered, the expectation is that the user would most likely try several things, including a reboot.

These assumptions are expressed as a decision tree, which replaces the look-up tables in power supply 26's microprocessor 32, once voltage increases have ceased. The decision tree is very simple:

1). Is there discernible activity on device 54, expressed as continuing fluctuations in current?: YES_____ NO_____
   a). IF YES, switch to periodic monitoring of the current sensors 81.
   b). IF NO, wait a specified time, during which activity not yet detected might commence.
   c). BUT, IF no activity is detected within the prescribed time, assume power requirements have been met.
2). If reboot is detected during the prescribed waiting time, start at the last known output voltage and increase by gradual increments.
3) Were further current increases detected as voltage was increased by this additional increment?: YES_____ NO_____
   a). IF YES, go to #1a.
   b). IF NO, GO TO #1b.

Operation of power supply 26 according to these basic Boolean statements will help fine-tune power supply 26's $V_{out}$ to supplied device's 54 requirements. This logic tree can be further enhanced with the information on pages 25, line 18.

1) Multi-Selector Switch

The default configuration of the multi-selector switch 33 is to allow power and data to flow from the battery device 43 to the supplied device 54. When power supply 26 is inactive, the supplied device is always able to get power in its "normal" mode, i.e., directly from the battery 43, because the multi-selector switch is always reset, after each use of the power supply, to connect the input powerlines 37 and 39 from the battery 43 to the output powerlines 34 and 36 to the supplied device 54. When not in use, the multi-selector switch 33 defaults to the above-described "device-26/64-bypass" configuration, so that the power supply 26 or 64 becomes transparent to the other devices 43 and 54, even though it is still physically attached to connector 42. When power supply 26 or 64 is physically disconnected from connector 42, a simple jumpered terminator block 94 reestablishes the bypass just described as the default pinouts of the multi-selector switch 33, for power and data.

2) Multi-Selector Switch—Simultaneous "Charging/Powering" Configuration

The multi-selector switch 33 can configure itself to deliver power to either the supplied device or the battery device, individually, or together (if both battery and supplied devices are to be simultaneously powered, a second controllable regulator (25) is preferred). This is a discrete either/or model, but the addition of a second controllable regulator (25) and an expanded multi-selector switch with the extra pin-outs, can simultaneously charge the battery device 43 (if of L-Ion chemistry, or an equivalent voltage-specific charging chemistry), and also power the supplied device.

A working prototype of power supply module 64 has been built with two power ports, each having "auto-variable" output, so that two supplied devices can be powered simultaneously. The prototype device provided "plug 'n play" power simultaneously to a laptop computer and a controllable peripheral device (rather than recharging a battery as shown in FIG. 10). Power supply module 26 may also be built having more than two "smart" power ports, each with self-adjusting voltage capability. These multi-output configurations can (but do not) share the same voltage regulator and can partially share two (or more) controllable regulators if sufficient wattage is available from them.

K. Connector 42

The configuration of connector 42 shown in FIG. 10 is only an example of an appropriate connector. Connector 42 can also be wire-configured to have all data pins wired discretely, with each looping down to the Multi-Selector Switch (33), so that all data goes to the power supply 26, before being passed along the equivalent lines to supplied device 54. The exact configuration of connector 42 is driven by the communications protocol and architecture. Because the Dallas 1-Wire protocol is illustrated in FIG. 10, only one data line plus ground and positive (shown as 45) is required to power supply 26/64 and data lines 47 and 44 are shunted in connector 42 to pass directly to supplied device 54. If connector 42 were built to the SMBus specifications, all three data lines 44, 45, and 47 would pass data to the power supply 26 (or supplied device 54) from each of the devices 43 and 54. Should there be data communications topologies or protocols specifying more than three wires, connector 42, and multi-selector switch 33 would be modified to accept this expanded pin-out requirement.

Multi-selector switch 33 routes data lines 35 and 38 (and 29 and 30), based on inputs from a microcontroller 23. In this mode, multi-selector switch 33 functions as a straightforward N-signal data switch. Multi-selector switch also carries power from controllable regulator 25 to powerlines 37 and 39, if battery device 43 is the target, as it would be for recharging purposes. Switch 33 is also selectable to deliver power on lines 34 and 36, to supplied device 54. Switch 33 also performs with the characteristics of a hexfet, i.e., a power switch, or its equivalent. The power supply 26 could also be built with discrete data and power switches, but they are consolidated here only for clarity.

When the multi-selector switch 33 is set to access powerlines 34 and 36 to the supplied device 54 and powerlines 37 and 39 which access power conductors 46 and 49 of battery device 43, a polarity check is done before the possible circuits are created. This polarity check is to verify that the connector 42 is installed properly, and to detect any possible shorts throughout the power delivery system. This is done by putting the controllable regulator 25 into a negative out put voltage configuration for a very brief moment. Once the polarity is verified, controllable regulator 25 is reset and the microcontroller 23 appropriately sets the switched paths. If the polarity were reversed, microprocessor 32 is made aware of the condition, and it instructs microcontroller 23 to reconfigure the pin mapping in multi-selector switch 33 to reverse the power leads.

Multi-selector switch 33 and microcontroller 23 may alternatively be located in connector 42. This type of embodiment is most useful when building power supply module 26 with service access problems. By relocating the microcontroller 23 and switch 33 to the connector 42, these components are readily accessible for replacement. This also serves to reduce the overall size of the power supply 26, which is often an important consideration for embedded power sources (e.g., a commercial aircraft installation, where size is an important parameter).

Lines 34 and 36 transmit power to and from supplied device 54, and line 35 transmits bi-directional data between power supply 26 and supplied device 54 (line 35 also forms a leg of the wire run leading to battery device 43, along data line 38 in the connector). The equivalent powerlines leading to battery device 43 are lines 37 and 39. The data line 38 is traced to internal line 45 of battery device 43, via the connector block's pin 70. The pin-outs shown here for data are for example only. Any one of the three available data and/or power lines in battery device 43 (as well as the corresponding lines to supplied device 54) can be mapped as the data throughput line to the power supply 26.

Since multi-selector switch 33 is configurable in numerous ways, the exact matching pins need not correspond on the supplied-device-side of connector 42 as they are represented on the battery-device-side. For example, if the connector through-wires which tie 69 to 74, and 71 to 76 were no longer wired through, but instead each ran down to connector block 40, as do pins 70 and 75, then the pin assignments on either side of the connector become fully remappable inside multi-selector switch 33. This remapping is defined as an activity determined by microprocessor 32, executed via microcontroller 23. The same functionality can be achieved by allowing microprocessor 56 to drive microcontroller 23 in the power supply 26.

This functionality of remappable pin outs is important, because not all "smart" battery manufacturers have followed Duracell's data line configurations, so some supplied devices (and their manufacturer-supplied battery devices) may have different functions ascribed to the same connector pins, or totally different numbers of pins and assigned functions. The connector 42 shown in FIG. 10 can be configured with more (or less) than the five pins shown depending on the manner in which dominant standards change or special-purpose applications are developed. In its most generic form, controllable multi-selector switch 33 is simply a device able to remap any number of connector pins, on both sides of the connector, to other pins elsewhere on the connector.

The group of lines labeled 37, 38 and 39 on the battery-device-side and lines 34, 35 and 36 on the supplied-device-side of connector 42 are shown collectively as two groups of lines 63. Lines 63 are a three-wire system (two power lines and one data) known as the "Dallas 1-Wire" system for "smart" battery-device communications. This bus protocol, or an equivalent, solves the issue of a thick multi-conductor cord. Were all three data lines in FIG. 10 configured to run individually to connector block 41, the cord between the power supply and the connector block would have ten conductors, of which four would be powerlines. The Dallas 1-Wire protocol reduces that to six wires, and it also removes the extra two data lines shown in FIG. 10 at both the battery-device-side 69 and 71, and the supplied-device-side 74 and 76.

Power supply 26 will work with the Dallas I-Wire protocol as drawn in FIG. 10. What is shown is a hybrid system, with 3-data-line hardware (the supplied device 54 and battery device 43) running on a Dallas 1-Wire "adapter." The adapter is the configuration of connector block 41. By passing the data from lines 44 and 47 of battery device 43 into supplied device 54, via lines 69–74 and 71–76 to pins 62 and 59, the battery's information on those two data lines is sent directly to microprocessor 56 in supplied device 54.

Microprocessor 56 can then determine whether the data needs to be forwarded to power supply 26, or if the data is needed only by supplied device 54. If the data must be sent to power supply 26, the information is put back on the data bus and directed to pin 58. It then passes through the connector block at pin 75, and into data line 35, to multi-selector switch 33. Thus, data from any line at the battery device 43 or supplied device 54 can be rerouted to the appropriate pin-outs on multi-selector switch 33 so that there is always a loop or direct circuit to any device in the system. In this model, a "smart" bus (SMBus) device, which uses a two-line data bus but requires all five lines to be connected, can interface with a Dallas 1-Wire topology.

Interface 40 for the connector cord interface to connector 79 on power supply 26 is shown in FIG. 10, but it is strictly optional. If power supply 26 were embedded, such as behind the dashboard of a car, so that it could provide automatic variable power to a car adapter (cigarette lighter port, or the new female receptacle dedicated to portable electronics power delivery), the physical form of connector 42 would be appropriately compatible. However, if power supply 26 were embedded on an airplane, at the passenger seat, connector 42 might be hardwired, and perhaps even presented to the passenger as a power connector only tethered to a retractable cord. It can be represented as an aircraft-style 9-pin connector, of which four pins are for power and the remainder are for data.

The embodiment of connector interface 40 shown here, which is predicated on the use of the Dallas I-Wire bus, or an equivalent, has two data lines (connector pin 70 and conductor 38, as well as pin 75 and conductor 35). The power pins on the connector block 41 are 68 and 72 on the battery side, which route to conductors 37 and 39. On the supplied device side, power pins 73 and 77 run to conductors 34 and 36.

L. Communication Links Between Supplied Device and Power Supply

Connector 42 includes the entire connector/cord assembly and is a module in the system architecture which provides a data link. The illustrated embodiment of connector 42 in FIG. 10 is only one of the various ways in which a communications link can be established between supplied device 54 and power supply 26. Other methods of establishing such a communications link include infrared (IR), ATA (modem protocols over phone wire including HSP "virtual" software modems), acoustics (a sub-set of ATA), RF, and powerline modulation.

All these types of communications links are based on a power supply module having a PCMCIA-compliant PC card slot, for example, or some other standardized interface for communications or other peripheral devices. All five communications modes enumerated above either are already available in a PC card form (except powerline modulation of course), or the size of the hardware needed to develop such a card is such that off-the-shelf-components or sub-assemblies can be used. Many of the hardware devices needed to operate these various communications sub-systems are already built into existing supplied devices, such as the now-common IR circuitry routinely already available in laptops. Thus, to explain the various communications links, the PC card is used here merely to simplify the presentation, and it is assumed that the actual hardware and/or software to implement these technologies may be built in any convenient physical form.

The PC card can be implemented as a "bring-along" device, with the user supplying the appropriate PC card. The card can be inserted into a PCMCIA-complaint PC card slot in power supply 26 (not shown). For the embodiments of the power supply module that are embedded within an existing power system, the PC card slot may be remotely-located, for example, mounted in a passenger seat's arm rest console on an aircraft or an aircraft food service tray, so that it is accessible to power supply 26, which is mounted under the seat.

1) Infrared

Infrared wireless data communications were used in the first prototype of power supply 26. The IrDA standard protocols (V.1.0) were used, and power supply 26 had an IR port where FIG. 10 shows the optional connector block (79) but for only the three data lines, as power delivery was via wire. The IR communications link in the prototype was used for data acquisition (for example, polling the supplied device for information on its power configuration, the presence of a battery, etc.), and for command sequences (for example, uploading power consumption information from microprocessor 32, or reporting a potential internal malfunction in power supply 26 to be viewed on a display screen connected to supplied device 54, or stored in its memory 57).

CIR (control or command IR) is an emerging IR communications standard that may result in a significant improvement in range (upwards of 60 feet), and be less prone to data errors caused by ambient light in the environment than the current IrDA standard. While CIR has less bandwidth than the IrDA standard, power supply 26 requires only modest data streams, and operates well at slower speeds. Infrared-based communications between a power supply and a supplied device is a preferred data link on aircraft because it eliminates cumbersome data lines near the passenger seat.

Engineering a portable version of the controllable "smart" power supply involves several dynamics. FIG. 13 shows a power module in place at a passenger seat on an airplane.

The power supply is small and light, so that packing and carrying it on a trip is convenient. To miniaturize it as much as possible, the "intelligence" of the controllable power module 727 has been relocated to the aircraft's food service tray 721. Both the "smart" circuit 715 and the logic board 717 are now embedded in a location where they are very near the supplied device 719, a laptop computer. The power supply, itself, is only inches away from its supplied device, so any RF or EMI problems which might be caused by long wire runs are reduced to a minimum, for there is only 12–14" of cable between power supply 727 and the notebook computer 719 (a food service tray is typically 16–17" wide×11–12" deep, so the length of power conductor cord is never going to exceed about 18".

The "smart" circuit is a small data acquisition board, similar to those used in contemporary "smart" batteries. This circuit is not location dependent, so it can be positioned anywhere between the power source being monitored (here the power supply 727 itself, along power line 709, with analog input cable 711 T-connected on the positive and negative leads) and the processor device. The only two connections required of the smart" circuit 715 are the hot and ground leads, since all data is generated internally on the "smart" board (except for thermistor values, which obviously only are valid if the temperature sensing device is in close proximity to the heat source. More on this temperature sensing later).

Power cable 741 terminates at the power interface adapter 743, and both items are embedded in the food tray on a retractor mechanism, so that the cords are neatly out of the way. A simple piece of Bungee cord, and three pulleys from a screen door, (or some equivalents) comprise the retractor mechanism. This easy-to-maintain and inexpensive-to-replace retractor mechanism needs little adjustment, snaps in and out as easily as any retractor, and is very inexpensive. Being inexpensive is a prime directive for anything buried in the food tray. Airlines rarely keep this trays in service for more than a year, because they get dirty and soiled looking very quickly. The construction of these trays is so elemental, and materials costs are so low, that they would be throw-away items in any other industry (a new one costs $40–60). The airlines don't discard the trays, but send them back to the manufacturer, who cuts open the thin vacuum formed shell, removes all of the blue insulation foam (which is discarded), and salvages the two metal support frame bars which contain the pivot hinges.

In the modality of the smart circuit 715 and the logic circuit 717 being embedded in the tray, as well as the retractor mechanism, the entire sub-assemblies are mounted on a thin plastic sheet, so that the entire module lifts out when the tray is opened for re-fabrication. This framework also adds considerably to the rigidity of the tray, itself. Blue Styrofoam (insulation foam) is packed where practical, so as not to interfere with the retractor mechanism or the electronics. The electronics are potted to moisture-proof them and the foam provides good shock absorption for the electronics. The snap-on connector 725 needs to be ruggedized, and rendered moisture resistant. A spilled drink on the tray could render the connector inoperable. A modified Positronics connector is used in a snap-on connector assembly 725. This connector has the form-factor of a standard BD-25 connector (male), but there are four large brass pins for power (two for the primary power signal along cables 709 and 741, and a pair for the logic circuit 717, via powerlines 723). The logic board requires 9 volts, but the power outlet in power supply 727 has two outputs, both of which are fully controllable from −24 to +24 VDC, so any changes in the circuitry in the tray which might change the input voltage to logic board 717 is automatically accounted for, as power supply 727 auto-configures to the correct voltage of that circuit, and it does the same for the primary power outlet to the supplied device 719.

The Positronics connector has 13 data pins, but only nine are needed for the parallel cable connection 737. The spare pins are jumpered, so that there is some redundancy and allowance for wear-and-tear. The Positronics male connector is recessed in the front edge of the tray (item 745 in FIG. 13 represents the back surface of the seat forward of the one at which the food tray is located. The Positronics connector is placed along the front edge of the food tray for two reasons. First, it is the most protected face of the tray, where prying children can access easily, and that is also the location where power supply 727, once attached is out of the way. The power supply is designed to have a very low height profile (the direction in this drawing in which the ascenders and descenders in the words "Power Supply" run). The bulk of the power supply's volume is below the top surface of the tray, and the top face of power supply 727 is flush with the tray top when the power supply is connected. There is a rubber gasket inside the recess of the male Positronics plug, so that an effective moisture seal is formed between the power supply and the front tray edge. Thus configured, the passenger can leave the power supply in place during the entire flight, and only a power interface adapter 743 has to be disconnected to close the tray out of the way. This is a good safety feature, since there are no dangling cords to entangle people who are trying to exit the seat row in an emergency.

Another major benefit of this system is that the passenger only has to bring a small corded adapter (only a cord on one end), so the entire passenger-supplied goods are quite small and light. Also, since the power supply 727 is essentially a dumb power circuit, the cost of the module is quite low.

The preferred mode for this in-seat power arrangement, whether it be on a plane, train, ship, etc., is to embed the controllable power supply 727, and thus free the passenger from having to bring anything but a supplied device to the seat. As has been seen throughout this document, this controllable power supply has features which favor its use as a pre-installed embedded power adapter.

Data lines 737 from MCU 735 carry the information as to how to configure the output voltage of the power supply 727. The proper voltage is determined in the modality shown here by several methods. If the notebook computer 719 has used the power supply 727 before, the power management software which is supplied with the power supply has stored the correct voltage value at the last session. The notebook now broadcasts that voltage information from its infrared port 713, and the data is received wirelessly by embedded IR port 729. The voltage information is sent to the MCU along data line 739, to a serial port The MCU 735 uses the voltage look-up table stored in memory (a sample look-up table appears elsewhere in this text, in the discussion of FIG. 10) to determine the correct 8-bits of code to send to power supply 727, from the MCU's LPT port, along parallel cable 737, to data/power connector 725 at power supply 727. An example of the circuit in power supply 727 is in FIG. 11, and it uses 0.5-volt data lines to hold resistor values high or low, as seen in the bottom left corner of the schematic in FIG. 11. This resistor ladder in power supply's 727 circuit configures the power supply to any positive or negative voltage between 0-volts and 24-volts, in 0.375 increments.

To confirm that the output voltage of power supply 727 is correct, the power cable 709 is tapped by the two-conductor cable 711. The power signal travels along this line to smart circuit 715, where the analog power signal is converted to a digital representation of the power supply's actual output voltage (current averaging is also available). The information to build a smart circuit is available on the web, at SMBUS.COM and SBS.COM. Benchmarq (Dallas, Tex.) sells the components and full board assemblies for several versions of these smart circuits.

The logic circuit 717 is a data translator and I/O board. It takes the SMBus-compliant data from the smart circuit 715, and converts it into an $I_2C$ format so that any computer can read it as serial data Since the MCU 735 is a dedicated, embedded processor, the need to do a translation into an $I_2C$ protocol is probably not necessary, but there are modalities of this embedded "intelligent" circuit which interface with devices like notebook 719, so a standard language platform aids that communications process. The voltage data captured from powerline 709 is now sent from the logic circuit to the MCU 735 along serial data line 731. Since there is not an extra serial port on MCU 735, in this example, a PC card configured to provide an emulated serial port is used as the data I/O. The MCU captures the voltage data from its data bus, then turns it around and sends it along serial port 739, which is configured as a dedicated IR port. The IR transceiver 729 broadcasts the voltage information back to notebook computer 719, where the voltage value received is compared in software to that transmitted at the beginning of this process. If they match, a confirmation is sent back to the MCU, using the IR link, in this example. Thus, power supply 727, without any native intelligence in its circuits, is able to properly power a supplied device, here a notebook computer.

If the supplied device 719 does not have the necessary software, the "blind" process of powering up a device defined in the section "No Battery Present" is used. No matter which method is employed to deliver an adequate voltage to the supplied device, the output voltage is logged by the MCU, and held in non-volatile memory, along with a header which has been assigned to the particular supplied device being powered. Thus, over time, the MCU builds a database of its users, and this eliminates, over time, the need for software.

To return to the mechanical layout of the power supply and related hardware, the smart circuit 715 and logic circuit 717 do not have to be embedded in the food tray. In the alternative, all of the electronics and wiring can be hidden beneath the aircraft seat ahead of the one with the tray 721 shown here. That is the more traditional way that aircraft circuits are placed, but the advantage here is that an additional 3+ feet of power and data cable are removed as a potential antenna, as all of the electronics are near at hand to the supplied device 719. Also of note is that all food trays are fabricated with a thin aluminum or stainless steel plate that is bonded to the top, flat inside surface of the tray prior to assembly. This modality of the invention replaces that aluminum or stainless with copper cladding, so that an effective radiation and noise shield is already in place in the way the tray is fabricated.

The parallel cable 737 and the serial cable 731 are routed along the leg supports which hold the tray. The tray/support-leg interface is always a solid metal pivot bearing pin (not shown), which is modified in this application to serve as a multi-conductor pivoting data connector. With the tray in the up position, the data link is mechanically broken and, only when the tray is lowered are the contacts aligned so that a pivoting data hinge contact is made. The parallel cable need have only 10 conductors, and not the traditional 25, and only five conductors in cable 731 are needed, thus minimizing the number of contacts in the conductive hinge assemblies, as well as the thickness of the cable to be channeled in the hollows of the tray's support legs.

Power source 701 is shown as 28 VDC. This is one of two available voltages available off the aircraft's main power buss. The other is 115 VAC @ 400 Hz. The AC power is never available and exposed to the passengers at a connector like 705, so the power at the connector port will always be 28 VDC, or below, and some aircraft support a 15 VDC output at power port 705. See FIG. 10 for the methods power supply 727 in FIG. 13 uses to adapt to a variety of input voltages.

The power system described here offers passenger convenience, and a low-cost and reliable solution to making power available to passengers traveling on any type of conveyance which uses food trays. The trays do not have to be the fold-down style, but they can also pivot up and out from the seat's armrest, as they often do in first class and business class.

Figure 13A:
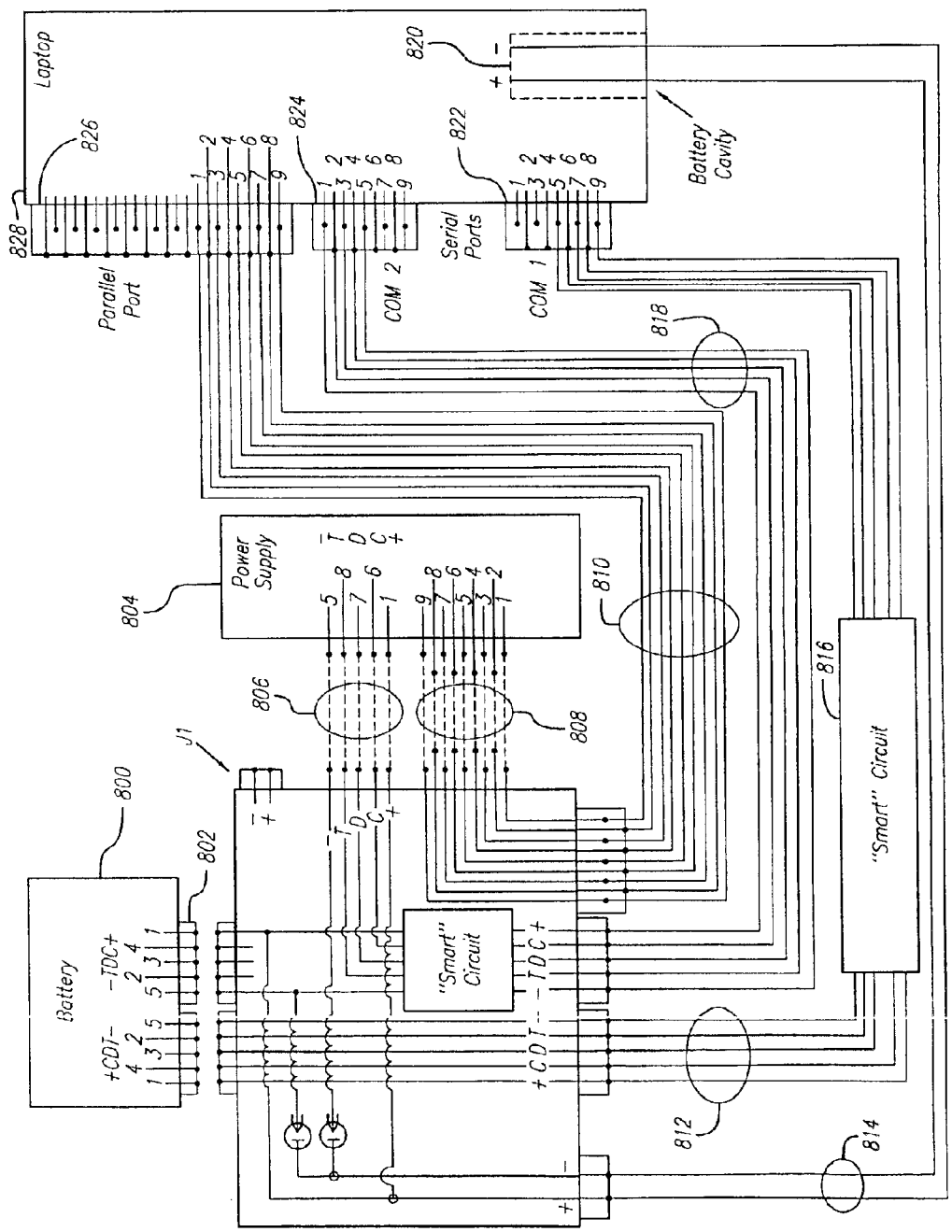
FIG. 13a is a wiring diagram of an embodiment of a power supply according to the present invention capable of simultaneously sensing and adjusting to the power requirements of a supplied device and its corresponding battery.

FIG. 13a is a wire and cabling diagram for the type of power supply configuration in FIG. 13, which uses two smart circuits and logic circuits, one to a battery interface comparable to the connector 8 in FIG. 1, which is capable of transferring data and power simultaneously. FIG. 13a diagrammatically shows how the various elements in FIG. 13 are properly connected to a laptop, that laptop being both an MCU-type device from FIG. 13 and a supplied device, as is notebook computer 719 in FIG. 13.

FIG. 14 illustrates a power supply 602 which is embedded under a seat or in the back of an aircraft seat, with an infrared port exposed to the food tray of the seat behind. A battery 630 has a connector like that of connector 8 in FIGS. 1–4, which conducts data and power simultaneously, and which separates the battery electromechanically from a supplied device 636. The logic circuit is used the way it was in FIG. 13, confirming the output voltage from power supply 602 by data going to the power supply 602, then transferred to an IR port 634, to be transmitted to IR port 632 on notebook 636. An IR-based confirmation is then made by the notebook and sent wirelessly to the power supply 602.

2) ATA

ATA protocols, commonly built as modem devices, afford a straightforward communications link from a supplied device to a power supply module according to the present invention. Based on current technologies, the interface between power supply 26 to supplied device 54 is a PC card (previously PCMCIA card) and all data is sent via twisted pair. An alternative way in which to use the ATA protocol is to use, for example, an HSP "software" modem, which is a variant of the hardware/software sold by PC-TEL, and recently. Motorola This "virtual" modem resides in software, and uses the host device's CPU (e.g., microprocessor 56 or microprocessor 32) to perform modulation/demodulation, carrier line bus calls, etc.

The HSP technology reduces the hardware required to support ATA communications to two chips. Since the CODEC is unnecessary in the power supply module's intra-device communications topology, the CODEC chip and its related software are eliminated. The DSP chip is also unnecessary, since keeping a carrier line open continuously in this ad hoc peer-to-peer communications scenario is not essential. At least one version of a virtual" software modem is available without any special chips. This chip-less software modem is the preferred modality of this technology because it affords the convenience of having only to load software on the supplied device.

The two devices, represented in FIG. 10 as supplied device 54 and power supply 26, are configured so that the master/slave model always makes supplied device 54 the master. Because almost all information from supplied device 54 is required during the initialization and configuration process, which happens typically, but not necessarily, as late as the software execution stage of the boot (the equivalent of the AUTOEXEC.BAT on DOS/Windows based devices), power supply 26 stays in slave mode until the entire pre-negotiated data stream is complete. Thus, the traditional ATA communications hardware and software is reduced to a proprietary protocol-based hardwired data link, with the master/host device pushing information to the open bus on the slave.

The preference for a software-only modem, as opposed to a PC Card or other hardware types, is specific to implementations like power use onboard a commercial airliner. If power supply 26 is embedded as a source of universal power to all passenger seats, then dealing with the variety of supplied devices and related peripherals which passengers might bring aboard can complicate inter-device communications. The virtual modem can be configured to load as software on most any processor-enabled supplied device, so it provides an easy "upgrade" or retrofit to passengers who wish to access the embedded power supply.

Furthermore, by installing a modem on all supplied devices that don't come modem equipped, the software modem affords a dual-purpose tool. In the airline example cited, the modem also interfaces with the in-flight phone system for e-mail access, faxing, TTY, etc., thus affording the passenger dual benefits from the newly-installed communications tool.

3) Acoustics

Acoustics, in the communications modalities defined here, is a sub-set of modem technology, as expressed in devices like the acoustic couplers still used to create a non-modem equipped phone interface (for example, a pay phone) with a modem-enabled host device. While such cumbersome acoustic couplers are not required here, the concept is still valid. Ultrasonic sound levels are used, typically with piezo-dielectric speakers in a set of transceivers, to communicate low-bandwidth data between a supplied device like supplied device 54 and a power supply module like power supply 26.

Acoustics on aircraft hold promise as an inexpensive, safe (no RF or EMI radiation) communications technology. Acoustic transceivers are small, reliable and reasonably easy to embed in the overhead area above passenger seats, on seat backs, arm rests, food trays, etc. Passenger-provided supplied devices 54 do not typically have installed acoustic hardware, so a universal hardware interface is necessary. This interface, i.e., transceiver, can be a small module expressed as a dongle or connector block for a parallel or serial port, or a PC Card with an acoustic transceiver. Acoustic transceivers can be highly miniaturized. Optum Corporation (Cupertino, Calif.), for example, developed a working prototype of a child's doll which was wirelessly controlled via acoustics.

Such a small, lightweight, inexpensive communications system is well suited to an aviation installation Furthermore, the ability to align transceivers to each other in a passenger cabin is made easier by an overhead area which already has audio speaker grills, air vent areas, and numerous easily modified plastic panels. Of course, the seat back in the row ahead is an obvious prime target for an acoustic array, especially since the entire surface is cloth-covered (speaker grill cloth materials).

The bandwidth required by power-related software is extremely low, and much of the information being communicated are command, control and confirm functions which can be re-broadcast multiple times without disrupting the passengers' use of their equipment.

4) Radio Frequency

Radio frequency (RF) is already an established communications technology for many devices, especially mobile computers. RF-based wireless LAN devices, for example NetWave's (originally Xircom's in Thousand Oaks, Calif.) PC-Card solution, have the restricted range and multiple frequencies to make them viable data links. The PC card is once again the physical form for the wireless interface, and power supply 26 (in its non-embedded embodiment) can be designed to accept a standard PC card supporting RF communications technology.

5) Powerline Modulation

Powerline modulation, until recently, has not been easily achievable over the low-impedance wiring used in most DC-based products like power supply 26. The field of home automation, where modulated/demodulated communications over house wiring has been available for several decades from such companies as X-10, has extended this method of data conveyance to the phone lines. LonWorks, a proprietary hardware, software and communications protocol co-developed by Toshiba, Motorola and Echelon, uses subminiature transceivers specifically designed for phone lines. Their CP-21 transceivers can easily fit in the connector housing shown in FIG. 10 as 40 and 79. Model Rectifier Corp. (MRC, Edison, N.J.) uses powerline modulation in its HO-gauge train controllers. The model trains can be controlled simultaneously with as many as eight locomotives responding to commands sent along a two-rail model train track.

The modulator/demodulator required also is small enough to be mounted on a standard Type II or Type III PC card. Microprocessor 56 of supplied device 54 can perform the modulation/demodulation function using, for example, the PC-TEL/Motorola HSP software modem previously discussed. Were a substantial-enough microprocessor available in power supply 26, the same modulation/demodulation functions could be executed there.

SUMMARY AND SCOPE OF THE INVENTION

The benefits of look-up tables, especially those of various tables roles in detecting and disabling battery charging activity as well as the profiling of a previously unknown device by its "power signature," are, in the following non-limiting examples:

1) Diminish the need to be charging a battery pack when an external power source is available. By not charging a battery every time a host device is connected to an external source of power, the life expectancy of the battery is increased. Since most rechargeable battery-powered electronic devices automatically charge their batteries when external power is connected, the use of a look-up table that disables the battery charge function increases the useful life of the battery, thus reducing total operating cost.

2) Some situations may not find battery charging practical. Battery charging can consume 20–40% of the entire load schedule of a host device's power requirements. If a car's battery is low, powering a device such as a laptop from the dashboard outlet could so further drain the car's battery so as to result in a stranded motorist 3) Some transportation locations may not be suitable for battery charging. There is some risk in charging batteries, especially high-density Lithium-Ion batteries. An airline, or cruise ship operator, for example, may wish to limit the risk of an onboard battery-related fire or explosion. A simple and cost effective method would be to implement power supply peripherals incorporate look-up tables which disable the charge function, while still allowing an external power supply to power the host device.

4) Extended-run-time external battery packs can be used to supplement a host-device's associated battery. Because devices with rechargeable batteries are usually designed to automatically charge their battery whenever external power is available, these extra-high-capacity external battery packs is continuously dedicating some of its stored energy to needlessly charging the device's battery.

Since the look-up tables presented herein temporarily disable the battery charging function while these external battery sources are attached, the run-time of the external battery packs is significantly extended by eliminating inefficient energy transfers between the two batteries.

5) Battery-powered devices do not need to be modified. Any potential modifications presented herein are simple software-related upgrades, such as program instructions at the device that access the BIOS POST firmware. Another such easy modification is to install copies of various look-up tables and the related program instructions on the device as a utility or application, with such installations best achieved as a subset of an existing power management utility.

These non-limiting examples of applications for a connector assemblies such as those described in this document show beneficial real-world applicability.

SCOPE OF THE INVENTION

Thus, the reader will see that the look-up tables of the invention provide a convenient, low-cost, and easily upgradeable element that not only provides safe power delivery by disabling battery charging, but enhances the overall functionality of any existing (or future) electronic and electrical goods by providing a vital enhancement to power-delivery apparatuses and systems.

Although the description above contains many specificities, these should not be construed as limiting the scope of the invention, but as merely providing illustrations of some of the presently preferred embodiments of this invention. Many other variations are possible. For example, basing the look-up tables on artificial intelligence principles and practices expands their usefulness. Adaptive neural logic can enable program instructions of a look-up table to adapt by "learning" from previous power-delivery sessions. As device input-power requirements change, look-up tables and templates that can "think" can modify and upgrade themselves almost "on the fly" as the power supply encounters new devices. Generic templates in an adaptive neural environment can become more specific as the power supply's experiences increase over time. By then relying on historical template information not as static, but as a dynamic predictive tool, the ability of the program instructions and look-up tables to more quickly resolve issues related to new devices become more achievable. Thus, while expert-rules-based look-up tables are fully capable of optimizing an output power signal to any present or future unknown battery-powered device, and can detect and disable any battery-charging activities, artificial intelligence can forge new paths for the look-up tables of the present invention.

Thus, the scope of the invention should be determined by the appended claims and their legal equivalents, rather than by the embodiments illustrated herein.

Thus, look-up tables that assist a source of logic at an apparatus in determining the power requirements of an unknown battery-powered device, and also detect and disable battery-charging, are described in conjunction with one or more specific embodiments. The invention is defined by the claims and their full scope of equivalents.

I claim:

1. A method of creating a look-up table for use with a processor-controllable-output-voltage power supply based on observable power characteristics of hardware devices within an electrical device, said look-up table being used to assist in determining the optimal output voltage of a connected power supply, and to determine battery charging activity in an electrical device in order to prevent said battery charging, comprising:

configuring a power supply to vary its output voltage by using a source of logic;

turning on an electrical device by supplying voltage from the processor-controlled power supply;

monitoring changes in current-load along a set of conductors from the output of the power supply to an input power port of the electrical device;

capturing detected changes in current-load during a predicted sequence of hardware events occurring within the electrical device;

logging the acquired current values to a first look-up table in the order each of the associated hardware events occur;

comparing the values in the first look-up table to known equivalent historical values;

determining if there is battery charging activity, based on values captured and compared;

issuing a first warning whenever battery charging activity is detected, causing the removing of the battery associated with the electrical device by a user, thus preventing further battery charging;

issuing a second warning whenever battery charging activity is detected, said warning advising a user of the electrical device that the output of the power supply will be discontinued if the battery pack is not removed, so that the user responds to this warning by removing the battery, thus preventing further battery charging;

issuing an alert to the battery or its charging system whenever battery charging activity is detected, said alert causing the charging circuit to shut down, thus preventing further battery charging, optional supplementing of the first look-up table with a software utility in the electrical device that is capable of operating associated hardware devices in the electrical device;

running the software utility in the electrical device to turn ON and OFF in a pre-determined series known to equivalent software in the processor-equipped power supply;

communicating the turning ON and OFF of associated hardware devices within the electrical device so that the processor associated with the power supply monitors the sequence of turnings ON and OFF;

capturing at the processor detected changes in current-load during the turning ON and OFF of associated hardware devices within the electrical device;

logging the captured current-load values to a second look-up table in the order each of the associated hardware events occur;

comparing the second look-up table to the first look-up table;

comparing the second and first look-up tables to known equivalent historical values;

updating known historical values, if necessary;

applying the results of the comparing of all look-up tables to the power supply, thus optimizing the output voltage of the power supply;

applying the results of the comparing of all look-up tables, thus determining whether the battery charging circuit in the electrical device is active;

issuing a first warning whenever battery charging activity is detected, causing the removing of the battery associated with the electrical device by a user, thus preventing further battery charging;

issuing a second warning whenever battery charging activity is detected, said warning advising a user of the electrical device that the output of the power supply will be discontinued if the battery pack is not removed, so that the user responds to this warning by removing the battery, thus preventing further battery charging;

issuing an alert to the battery or its charging system whenever battery charging activity is detected, said alert causing the charging circuit to shut down, thus preventing further battery charging, monitoring the ongoing activities of hardware devices in the electrical device;

comparing of the current-loads generated by the ongoing hardware activities to values in all look-up tables, thus determining whether the battery charging circuit later becomes active;

reactivating software on the electrical device, if necessary, to re-capture baseline data to be logged into additional updated look-up tables, as an optional means;

issuing a first warning whenever battery charging activity is detected, causing the removing of the battery associated with the electrical device by a user, thus preventing further battery charging;

issuing a second warning whenever battery charging activity is detected, said warning advising a user of the electrical device that the output of the power supply will be discontinued if the battery pack is not removed, so that the user responds to this warning by removing the battery, thus preventing further battery charging;

issuing an alert to the battery or its charging system whenever battery charging activity is detected, said alert causing the charging circuit to shut down, thus preventing further battery charging.

2. The method set forth in claim 1, further including said processor issuing a warning to a user of the electrical device whenever battery charging activity is detected, said processor displaying the warning on a screen located either at the electrical device, or at the power supply, said warning indicating to said user that said power supply will shut down.

3. The method set forth in claim 1, wherein said comparing and determining further includes said processor executing program instructions based on an intelligent logic platform selected from the group consisting of fuzzy logic, and adaptive neural processing, and a rules-based expert system.

4. The method set foth in claim, wherein said monitoring and capturing changes in current includes an analog-to-digital converter which delivers computer-readable power-related values to said processor.

5. A method of applying a look-up table for determining the output of a configurable power supply for delivering an initial voltage signal to a previously unknown battery-powered device, comprising:

providing a source of logic for varying the configurable output of said power supply, said logic source also for transferring data;

monitoring current changes along a set of conductors that electrically couple the output of the said power supply to an input power port at the electrical device, said port further providing power and data access to at least one of one or more internal circuits and sub-systems of said device;

acquiring detected changes in current during an anticipated sequence of electrically distinguishable operations of said circuits and sub-systems at the device, and one of the anticipated operations being an activation of the devices's battery-charging sub-system;

storing in a memory-based template an acquired value for each detected change in current, and comparing the template values to a substantial matrix of load values expressed as input-voltage values of known device classes and their anticipated sequential operations in said look-up table;

thereby determining the initial voltage signal for the power supply to deliver to the now known device, and further, if the anticipated battery-charging sub-system is detected as being active, the logic source transfers an alert signal to the device, thereby disabling the charging sub-system.

6. The method set forth in claim 1, further including said logic source issuing a warning to a user of the device that, because battery charging activity has been detected, said power supply will shut down.

7. The method set forth in claim 5, wherein said acquiring detected changes in current further including a utility program at the device for providing a predictable sequence of turning said circuits and sub-systems ON and OFF.

8. The method set forth in claim 5, further including said look-up table's matrix being updated by program instructions based on an intelligent logic system selected from the group consisting of fuzzy logic, and adaptive neural processing, and a rules-based expert system.

9. The method set forth in claim 5, wherein said logic source is at device, instead of at said apparatus, for performing said monitoring, acquiring, storing, comparing, and determining;

said device being capable of disabling its battery-charging sub-system, and said logic source further including a communications sub-system for transferring signals to said apparatus, said sub-system selected from the group consisting of infrared, and acoustics, and radio frequency, and powerline modulaion;

whereby said device remotely configures the output of said power supply.

10. An apparatus for modifying a memorized template into a device-specific look-up table for delivering an optimized power signal to a previously unknown battery-powered device, comprising:

a processor-controlled power supply capable of being configured to output a wide range of power signals;

said process also provisioned for acquiring power signals along conductors terminating at an interface for electrically coupling said power supply to an input power port at the device;

program instructions at the device for controlling its associated circuits and sub-systems, turning each ON and OFF in a pre-determined sequence;

said template primarily comprised of a memorized matrix of generic pre-determined sequences of current-based values, each sequence representing a distinguishable class of devices from which said processor is anticipated acquiring power signals so that, as said devices's, program instructions cause each circuit and sub-system to sequentially turn ON and OFF, the processor acquires each change in current and stores the value therefrom in said template;

said processor executing further program instructions for applying the stored current values to said look-up table, based on pre-defined rules for comparing acquired values and their sequential order to both the pre-determined values and sequences, as well as any known equivalent historical values from stored templates of specific previously-powered devices, in order to identify a characteristic profile of input voltages unique to said device;

said processor performing a computation for modifying said template into a look-up table based on most-recently-acquired current values and said pre-defined rules for determining a voltage value to which to configure the optimized outpu signal of said power supply;

said look-up table also providing at least one anticipated change in current as an alert state based on detecting an active charging circuit at the device, and as said power supply delivers its power signal to the now-known device, the processor continues to acquire current values and compares them to anticipated changes thereto.

11. The apparatus set forth in claim 10, wherein said processor detects a change in current attributable to said active charging circuit and said program instructions thereupon determine that battery charging is allowed, thereby providing said device with a reliable alternative power source to supplement said power supply.

12. The apparatus set forth in claim 10, further including a processor at said device for executing program instructions that perform bi-directional communication with said apparatus, said program instructions supporting a communications protocol selected from the group consisting of infrared, and acoustics, and radio frequency, and powerline modulation.

13. The apparatus set forth in claim 10, wherein said known equivalent historical values further include a memorized second look-up table of generic voltage values.

14. The apparatus set forth in claim 10, further including said battery providing power to said device while said processor incrementally increases the output of said power supply until a voltage is achieved that turns on the device.

15. The apparatus set forth in claim 10, wherein said performing a computation further includes said processor executing program instructions based on additive or subtractive mathematical constructs.

16. A method of applying a look-up table for detecting battery charging activity at a previously unknown battery-powered device, comprising:

providing a source of logic for controlling the configurable output power signals of an external power supply, providing program instructions at said logic source for controlling said output;

providing further program instructions for inter-device data communications;

providing an A/D converter accessible to the logic circuit;

providing further program instructions for acquiring analog signals;

monitoring current flow along a set of conductors that electrically couples the output of the said power supply to an input power port at the electrical device, said port further providing power and data access to internal circuits and sub-systems of said device;

acquiring detected changes in current at the A/D converter as said power supply delivers its power signal to said device, said changes being anticipated by a look-up table comprised of a substantial matrix of memorized current values representing known sequences of electrically distinguishable operations of said circuits and sub-sytems, and a generic battery-charging template;

anticipating a specific device operation characterized by a distinct voltage and current spike that the look-up table identifies as an alert state resulting from activation of the device's battery-charging sub-system;

comparing the acquired current values to those of the look-up table; and continuing said monitoring, acquiring, and comparing;

whereby, if said battery-charging sub-system activates, said distinct spike is thereupon detected and, by being identified in the look-up table as said alert state, is distinguished as actual battery charging activity at the now-known device.

17. The method set forth in claim 16, wherein, upon said anticipated battery charging operation being detected, said program instructions for controlling said power supply shut down the output therefrom, causing said device's battery to operate as a backup power source of the device.

18. The method set forth in claim 16, wherein said alert results in said charging activity being disabled by said logic source transferring said alert to said device via a communication sub-system selected from the group consisting of infrared, and radio frequency, and powerline modulation, and acoustics.

19. The method set forth in claim 16, wherein said anticipated battery charging activity based on values acquired and compared further including said logic source comparing known generic current values to those in a second look-up table, then performing additive or subtractive computations for determining a result which indicates that the additional power being drawn in attributed to the activated battery charging sub-system.

* * * * *